(12) United States Patent
Sugiura et al.

(10) Patent No.: US 12,426,492 B2
(45) Date of Patent: Sep. 23, 2025

(54) ORGANIC THIN FILM TRANSISTOR, POLYMER, COMPOSITION, ORGANIC SEMICONDUCTOR FILM, AND COMPOUND

(71) Applicant: FUJIFILM Corporation, Tokyo (JP)

(72) Inventors: Hiroki Sugiura, Kanagawa (JP); Toshihiro Ise, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 626 days.

(21) Appl. No.: 17/715,080

(22) Filed: Apr. 7, 2022

(65) Prior Publication Data
US 2022/0238809 A1 Jul. 28, 2022

Related U.S. Application Data

(63) Continuation of application No. PCT/JP2020/036505, filed on Sep. 28, 2020.

(30) Foreign Application Priority Data

Oct. 10, 2019 (JP) ................... 2019-186606

(51) Int. Cl.
*H10K 85/10* (2023.01)
*H10K 10/46* (2023.01)

(52) U.S. Cl.
CPC ......... *H10K 85/113* (2023.02); *H10K 10/462* (2023.02)

(58) Field of Classification Search
CPC ................ H10K 85/113; H10K 10/462
See application file for complete search history.

(56) References Cited

U.S. PATENT DOCUMENTS

| 2012/0302712 A1* | 11/2012 | Park | H10K 85/151 |
| | | | 528/8 |
| 2016/0155946 A1* | 6/2016 | Blouin | H10K 85/40 |
| | | | 252/511 |
| 2019/0036029 A1 | 1/2019 | Tamakuni | |

FOREIGN PATENT DOCUMENTS

| JP | 2013-124231 A | 6/2013 |
| JP | 2015-196659 A | 11/2015 |

(Continued)

OTHER PUBLICATIONS

International Search Report issued in PCT/JP2020/036505; mailed Dec. 22, 2020.

(Continued)

*Primary Examiner* — Shane Fang
(74) *Attorney, Agent, or Firm* — Studebaker Brackett PLLC

(57) ABSTRACT

An organic thin film transistor having excellent atmospheric stability is provided. A polymer, a composition, an organic semiconductor film, and a compound is also provided. The organic thin film transistor has an organic semiconductor film which includes a polymer having a partial structure represented by Formula (1).

(1)

(Continued)

In Formula (1), $X^1$ represents a sulfur atom or a selenium atom, $X^2$ to $X^4$ each independently represent a sulfur atom, an oxygen atom, or a selenium atom, $Y^1$ to $Y^4$ each independently represent a group represented by $—CR^1=$ or a nitrogen atom, where at least one of $Y^1$ to $Y^4$ represents a nitrogen atom, $R^1$ represents a hydrogen atom or a substituent, and * represents a bonding position.

22 Claims, 1 Drawing Sheet

(56) References Cited

FOREIGN PATENT DOCUMENTS

| JP | 2020-186316 A | 11/2020 |
|----|---------------|---------|
| KR | 10-2019-0029441 A | 3/2019 |
| WO | 2017/175665 A1 | 10/2017 |

OTHER PUBLICATIONS

International Preliminary Report On Patentability (Chapter I) and Written Opinion of the International Searching Authority issued in PCT/JP2020/036505; issued Apr. 12, 2022.
An Office Action; "Notice of Reasons for Refusal," mailed by the Japanese Patent Office on Jan. 31, 2023, which corresponds to Japanese Patent Application No. 2021-551213 and is related to U.S. Appl. No. 17/715,080; with English language translation.
Mamada Masashi et al., "Synthesis of Narrow Bandgap Polymers based on Benzobis(thiadiazole) and their Application to Organic Transistor Devices", Journal of Photopolymer Science and Technology, vol. 27, Issue 3, pp. 321-326, Jul. 8, 2014, The Society of Photopolymer Science and Technology, doi.org/10.2494/photopolymer. 27.321.
An Office Action; "Notice of Reasons for Refusal," mailed by the Japanese Patent Office on Nov. 22, 2022, which corresponds to Japanese Patent Application No. 2021-551213 and is related to U.S. Appl. No. 17/715,080; with English language translation.

* cited by examiner

ORGANIC THIN FILM TRANSISTOR, POLYMER, COMPOSITION, ORGANIC SEMICONDUCTOR FILM, AND COMPOUND

CROSS-REFERENCE TO RELATED APPLICATIONS

This application is a Continuation of PCT International Application No. PCT/JP2020/036505 filed on Sep. 28, 2020, which claims priority under 35 U.S.C. § 119(a) to Japanese Patent Application No. 2019-186606 filed on Oct. 10, 2019. The above application is hereby expressly incorporated by reference, in its entirety, into the present application.

BACKGROUND OF THE INVENTION

1. Field of the Invention

The present invention relates to an organic thin film transistor, a polymer, a composition, an organic semiconductor film, and a compound.

2. Description of the Related Art

Since it is possible to be made lighter, cheaper, and more flexible, as a device which uses a logic circuit including a field effect transistor (FET), radio frequency identifier (RFID; RF tag), and memory, which are used in liquid crystal displays and organic electric luminescence (EL) displays, an organic thin film transistor (organic TFT) having an organic semiconductor film (organic semiconductor layer) has been used.

As a compound for forming such an organic semiconductor film, JP2015-196659A discloses an organic thin film transistor using a polymer including a bisbenzothiadiazole group in which thiophene is linked at both ends.

SUMMARY OF THE INVENTION

As a result of producing the organic thin film transistor using the polymer disclosed in JP2015-196659A and conducting an investigation thereon, the present inventors have found that there is room for further improvement in atmospheric stability.

An object of the present invention is to provide an organic thin film transistor having excellent atmospheric stability.

Another object of the present invention is to provide a polymer, a composition, an organic semiconductor film, and a compound.

In order to achieve the above-described objects, the present inventors have conducted intensive studies. As a result, the present inventors have found that the objects can be achieved by a predetermined polymer, and have accomplished the present invention.

That is, the above-described objects can be achieved by the following configurations.

[1] An organic thin film transistor comprising:
an organic semiconductor film which includes a polymer having a partial structure represented by Formula (1) described later.

[2] The organic thin film transistor according to [1], in which the polymer having a partial structure represented by Formula (1) is a polymer including a repeating unit represented by Formula (2) described later.

[3] The organic thin film transistor according to [2], in which the divalent conjugated linking group represented by A in Formula (2) represents a group represented by any of Formulae (A) to (L) described later.

[4] The organic thin film transistor according to [3], in which, in Formulae (A), (B), (D), and (F), Lc is a divalent conjugated linking group represented by Formula (A1) described later.

[5] The organic thin film transistor according to [3], in which the conjugated fused ring group represented by Lc in Formulae (A) and (D) includes at least one of $>C=W^1$, $-N=$, or $-CR^{Lc}=$, the conjugated fused ring group represented by Le and the monocyclic aromatic ring group represented by Ar in Formulae (B) and (F) satisfy any of the following requirements 1 to 3, the monocyclic aromatic ring group represented by Ar in Formulae (C), (E), (G), and (H) satisfies the following requirement 2, and $W^1$ represents an oxygen atom or a sulfur atom and $R^{Lc}$ represents an electron withdrawing group, requirement 1: the conjugated fused ring group represented by Lc includes at least one of $>C=W^1$, $-N=$, or $-CR^{Lc}=$, requirement 2: the monocyclic aromatic ring group represented by Ar includes at least one of $-N=$ or $-CR^{Lc}=$, requirement 3: one or more selected from the group consisting of the conjugated fused ring groups represented by Lc includes at least one of $>C=W^1$, $-N=$, or $-CR^{Lc}=$, and one or more selected from the group consisting of the monocyclic aromatic ring groups represented by Ar includes at least one of $-N=$ or $-CR^{Lc}=$, where, in the requirements 1 to 3, $W^1$ represents an oxygen atom or a sulfur atom and $R^{Lc}$ represents an electron withdrawing group.

[6] The organic thin film transistor according to any one of [3] to [5], in which, in Formula (2), A represents a single bond or any of divalent conjugated linking groups selected from the group consisting of Formulae (A), (B), (C), (I), and (J).

[7] The organic thin film transistor according to [1], in which the polymer having a partial structure represented by Formula (1) is a polymer including a repeating unit represented by Formula (3) described later.

[8] The organic thin film transistor according to any one of [1] to [7], in which at least one of $Y^1$ or $Y^2$ represents a nitrogen atom and at least one of $Y^3$ or $Y^4$ represents a nitrogen atom.

[9] The organic thin film transistor according to any one of [1] to [8], in which $Y^1$ and $Y^4$ represent a nitrogen atom and $Y^2$ and $Y^3$ represent $-CH=$.

[10] The organic thin film transistor according to any one of [1] to [8], in which $Y^1$ and $Y^4$ represent $-CH=$ and $Y^2$ and $Y^3$ represent a nitrogen atom.

[11] The organic thin film transistor according to any one of [1] to [10], in which $X^3$ and $X^4$ represent a sulfur atom.

[12] The organic thin film transistor according to any one of [1] to [11], in which $X^1$ to $X^4$ represent a sulfur atom.

[13] A polymer having a partial structure represented by Formula (1) described later.

[14] The polymer according to [13], in which the polymer having a partial structure represented by Formula (1) is a polymer including a repeating unit represented by Formula (2) described later.

[15] The polymer according to [14],
in which the divalent conjugated linking group represented by A in Formula (2) represents a group represented by any of Formulae (A) to (L) described later.

[16] The polymer according to [15],
in which, in Formulae (A), (B), (D), and (F), Lc is a divalent conjugated linking group represented by Formula (A1) described later.

[17] The polymer according to [15],
in which the conjugated fused ring group represented by Lc in Formulae (A) and (D) includes at least one of $>C=W^1$, $-N=$, or $-CR^{Lc}=$,
the conjugated fused ring group represented by Lc and the monocyclic aromatic ring group represented by Ar in Formulae (B) and (F) satisfy any of the following requirements 1 to 3,
the monocyclic aromatic ring group represented by Ar in Formulae (C), (E), (G), and (H) satisfies the following requirement 2, and
$W^1$ represents an oxygen atom or a sulfur atom and $R^{Lc}$ represents an electron withdrawing group,
requirement 1: the conjugated fused ring group represented by Lc includes at least one of $>C=W^1$, $-N=$, or $-CR^{Lc}=$,
requirement 2: the monocyclic aromatic ring group represented by Ar includes at least one of $-N=$ or $-CR^{Lc}=$,
requirement 3: one or more selected from the group consisting of the conjugated fused ring groups represented by Lc includes at least one of $>C=W^1$, $-N=$, or $-CR^{Lc}=$, and one or more selected from the group consisting of the monocyclic aromatic ring groups represented by Ar includes at least one of $-N=$ or $-CR^{Lc}=$,
where, in the requirements 1 to 3, $W^1$ represents an oxygen atom or a sulfur atom and $R^{Lc}$ represents an electron withdrawing group.

[18] The polymer according to any one of [15] to [17],
in which, in Formula (2), A represents a single bond or any of divalent conjugated linking groups selected from the group consisting of Formulae (A), (B), (C), (I), and (J).

[19] The polymer according to [13],
in which the polymer having a partial structure represented by Formula (1) is a polymer including a repeating unit represented by Formula (3) described later.

[20] The polymer according to any one of [13] to [19],
in which at least one of $Y^1$ or $Y^2$ represents a nitrogen atom and at least one of $Y^3$ or $Y^4$ represents a nitrogen atom.

[21] The polymer according to any one of [13] to [20],
in which $Y^1$ and $Y^4$ represent a nitrogen atom and $Y^2$ and $Y^3$ represent $-CH=$.

[22] The polymer according to any one of [13] to [20],
in which $Y^1$ and $Y^4$ represent $-CH=$ and $Y^2$ and $Y^3$ represent a nitrogen atom.

[23] The polymer according to any one of [13] to [22],
in which $X^3$ and $X^4$ represent a sulfur atom.

[24] The polymer according to any one of [13] to [23],
in which $X^1$ to $X^4$ represent a sulfur atom.

[25] A composition comprising:
the polymer according to any one of [13] to [24]; and
a solvent.

[26] An organic semiconductor film comprising:
the polymer according to any one of [13] to [24].

[27] A compound represented by Formula (1) described later.

According to the present invention, it is possible to provide an organic thin film transistor having excellent atmospheric stability.

In addition, according to the present invention, it is possible to provide a polymer, a composition, an organic semiconductor film, and a compound.

DESCRIPTION OF THE PREFERRED EMBODIMENTS

Figure 1:
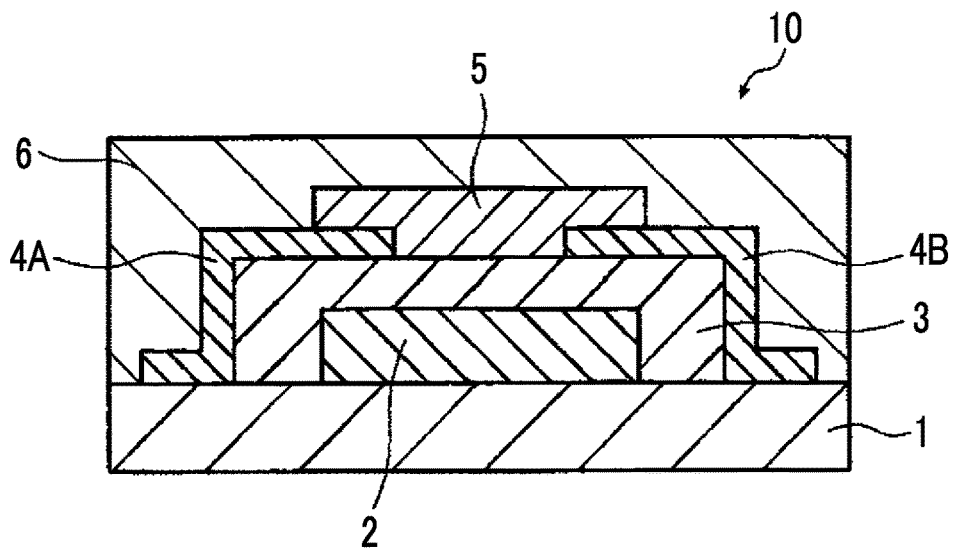
FIG. 1 is a cross-sectional schematic view showing a structure of a bottom gate-bottom contact type organic thin film transistor which is an example of an organic thin film transistor.

Hereinafter, the details of the present invention will be described.

Descriptions on the configuration requirements which will be described later are made based on representative embodiments of the present invention in some cases, but it should not be construed that the present invention is limited to such embodiments.

In the present specification, the numerical range expressed by using "to" means a range including numerical values described before and after "to" as a lower limit value and an upper limit value.

In the present specification, (meth)acryloyl is intended to be acryloyl or methacryloyl.

In the present specification, (hetero)aryl is intended to be aryl or heteroaryl.

In the present specification, the expression of a compound includes the compound itself, a salt thereof, and an ion thereof. In addition, it also includes an aspect in which a part of a structure is changed without deteriorating the desired effect.

In addition, a compound which is not specifically described as substituted or unsubstituted may have a substituent without deteriorating the desired effect. The same is also applied to a substituent, a linking group, and the like (hereinafter, referred to as a substituent and the like).

In the present specification, in a case where there are a plurality of substituents and the like represented by a specific symbol, or in a case where a plurality of substituents and the like are simultaneously defined, unless otherwise specified, respective substituents and the like may be identical to or different from each other. The same is also applied to the definition of the number of substituents and the like. In a case where a plurality of substituents and the like are near (particularly, adjacent to each other), unless otherwise specified, the substituents and the like may be linked to each other to form a ring.

In the present specification, examples of a halogen atom include a fluorine atom, a chlorine atom, a bromine atom, and an iodine atom.

In the present invention, in a case where a group can form an acyclic skeleton and a cyclic skeleton, unless otherwise specified, the group includes an acyclic skeleton group and a cyclic skeleton group.

For example, an aliphatic hydrocarbon group, an alkyl group, an alkenyl group, and an alkynyl group include a group having any linear, branched, or cyclic structure, unless otherwise specified.

More specifically, the alkyl group includes a linear alkyl group, a branched alkyl group, and a cyclic (cyclo) alkyl group.

In a case where a group can form a cyclic skeleton, the lower limit of the number of atoms of the group forming the cyclic skeleton is 3 or more and preferably 5 or more, regardless of the lower limit of the number of atoms specifically described for this group. The above-described cycloalkyl group includes a bicycloalkyl group, a tricycloalkyl group, and the like.

Organic Thin Film Transistor

As a feature point of an organic thin film transistor according to an embodiment of the present invention, an organic semiconductor film includes a polymer (hereinafter, also referred to as a "specific polymer") having a partial structure represented by Formula (1) described later.

The organic thin film transistor according to the embodiment of the present invention, which has the above-described configuration, has excellent atmospheric stability.

Although the details thereof are not clear, the present inventors have presumed as follows. That is, compared with the polymer including a bisbenzothiadiazole group in which thiophene is linked at both ends, which is disclosed in JP2015-196659A, the specific polymer is characterized by having a strong electron withdrawing property, so that the specific polymer is less susceptible to influence of oxidizing components such as oxygen and ozone, which are included in the atmosphere. As a result, even in a case of being produced and/or used in the atmosphere, the organic thin film transistor according to the embodiment of the present invention exhibits carrier mobility which is not much different from that in a case where the organic thin film transistor is produced and/or used in an atmosphere in which the oxidizing components such as oxygen and ozone are eliminated (for example, in a nitrogen atmosphere).

In a case where the specific polymer is a polymer represented by Formula (2) described later, depending on the type of A in Formula (2), the organic semiconductor film including the specific polymer can be used as either p-type or n-type. In addition, in a case where the specific polymer is a polymer represented by Formula (3) described later, the organic semiconductor film including the specific polymer can be used as n-type. That is, the organic thin film transistor according to the embodiment of the present invention can be either p-type or n-type.

Hereinafter, first, the specific polymer will be described, and then the organic thin film transistor will be described.

Polymer (Specific Polymer) Having Partial Structure Represented by Formula (1)

The specific polymer has a partial structure represented by Formula (1).

Partial Structure Represented by Formula (1)

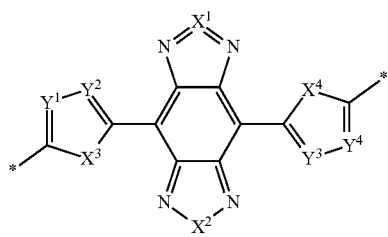

(1)

In Formula (1), $X^1$ represents a sulfur atom or a selenium atom. $X^2$ to $X^4$ each independently represent a sulfur atom, an oxygen atom, or a selenium atom. From the viewpoint that characteristics of the organic thin film transistor to be formed are more excellent, it is preferable that $X^3$ and $X^4$ represent a sulfur atom, and it is more preferable that all of $X^1$ to $X^4$ represent a sulfur atom.

$Y^1$ to $Y^4$ each independently represent —$CR^1$= or a nitrogen atom. However, at least one of $Y^1$ to $Y^4$ represents a nitrogen atom.

From the viewpoint that the atmospheric stability of the organic thin film transistor to be formed is more excellent, it is preferable that at least one of $Y^1$ or $Y^2$ represents a nitrogen atom and at least one of $Y^3$ or $Y^4$ represents a nitrogen atom. Among these, the following aspect A or the following aspect B is more preferable as a combination of $Y^1$ to $Y^4$.

Aspect A: $Y^1$ and $Y^4$ represent a nitrogen atom and $Y^2$ and $Y^3$ represent —CH=.

Aspect B: $Y^1$ and $Y^4$ represent —$CR^1$= and $Y^2$ and $Y^3$ represent a nitrogen atom.

From the viewpoint that the atmospheric stability of the organic thin film transistor to be formed is more excellent and/or the carrier mobility of the organic thin film transistor to be formed in the atmosphere is more excellent, it is preferable that both of a 5-membered ring composed of $Y^1$, $Y^2$, $X^3$, and two carbon atoms and a 5-membered ring composed of $Y^3$, $Y^4$, $X^4$, and two carbon atoms, which are specified in Formula (1), are a thiazole ring, and it is preferable that $Y^1$ to $Y^4$ satisfy Aspect A or Aspect B described above.

$R^1$ represents a hydrogen atom or a substituent.

The substituent represented by $R^1$ is not particularly limited, and examples thereof include a group selected from the following substituent group Z.

Substituent Group Z

Examples of the substituent group Z include a halogen atom, an alkyl group, an alkenyl group, an alkynyl group, an aryl group, a heterocyclic group, a silyl group, an alkoxy group, an amino group, an aryloxy group, an acyl group, an alkoxycarbonyl group, an aryloxycarbonyl group, an acyloxy group, an acylamino group, an aminocarbonylamino group, an alkoxycarbonylamino group, an aryloxycarbonylamino group, an alkylsulfonylamino group, an arylsulfonylamino group, an alkylthio group, an arylthio group, an alkylsulfinyl group, an arylsulfinyl group, an alkylsulfonyl group, an arylsulfonyl group, a silyloxy group, a heterocyclic oxy group, a carbamoyl group, a carbamoyloxy group, a heterocyclic thio group, a sulfamoyl group, an arylazo group, a heterocyclic azo group, an imide group, a phosphino group, a phosphinyl group, a phosphinyloxy group, a phosphinylamino group, a hydrazino group, an imino group, a cyano group, a hydroxy group, a nitro group, a mercapto group, a sulfo group, a carboxy group, a hydroxamic acid group, a sulfino group, a boronate group (—$B(OH)_2$), a phosphato group (—$OPO(OH)_2$), a phosphono group (—$PO(OH)_2$), and a sulfato group (—$OSO_3H$).

The group selected from the above-described substituent group Z may further have a substituent.

Examples of the halogen atom included in the substituent group Z include a fluorine atom, a chlorine atom, a bromine atom, and an iodine atom, and a fluorine atom or a chlorine atom is preferable.

The alkyl group included in the substituent group Z is not particularly limited, but an alkyl group having 1 (3) to 30 carbon atoms is preferable and an alkyl group having 1 (3) to 20 carbon atoms is more preferable. The number in parentheses represents the number of carbon atoms in a case of a cycloalkyl group. In addition, the above-described alkyl group may be linear, branched, or cyclic.

Examples of the alkyl group included in the substituent group Z, which may have a substituent, include a methyl group, an ethyl group, a propyl group, a 2-methylpropyl group, a butyl group, an amyl group, a pentyl group, a 1-methylpentyl group, a 2,2-dimethylpropyl group, a hexyl group, a heptyl group, an octyl group, a 2-ethylhexyl group, a nonyl group, a decyl group, a 3,7-dimethyloctyl group, an undecyl group, a dodecyl group, a tridecyl group, a tetradecyl group, a pentadecyl group, a hexadecyl group, an octadecyl group, a 2,6-dimethyloctyl group, an icosyl group, a 2-decyltetradecyl group, a 2-hexyldodecyl group, a 2-ethyloctyl group, a 2-butyloctyl group, a 2-butyldecyl group, a 1-octylnonyl group, a 2-ethyloctyl group, a 2-octyldecyl group, a 2-octyldodecyl group, a 7-hexylpentadecyl group, a 2-octyltetradecyl group, a cyclopropyl group, a cyclobutyl group, a cyclopentyl group, a cyclohexyl group, an adamantyl group, a benzyl group, a 2-cyclohexylethyl group, a p-chlorobenzyl group, a 2-phenylethyl group, a trifluoromethyl group, a perfluoroethyl group, 2,2,3,3,4,4,4-heptafluorobutyl group, $C_5F_{11}C_2H_4$—, $C_6F_{13}C_2H_4$—, a 3-aminopropyl group, a 4-aminobutyl group, a 5-ethoxypentyl group, a (meth)acryloxypropyl group, a (meth)acryloxypentyl group, a 4-hydroxybutyl group, a 4-sulfobutyl group, a 10-phosphonodecyl group, a 2-hydroxyethoxymethyl group, a 2-imidazolylethoxymethyl group, a 4-(N,N-dimethylamino)butyl group, and a 5-norbornenemethyl group.

The alkenyl group included in the substituent group Z is not particularly limited, but an alkenyl group having 2 to 30 carbon atoms is preferable and an alkenyl group having 2 to 20 carbon atoms is more preferable. The above-described alkenyl group may be linear, branched, or cyclic.

Examples of the alkenyl group included in the substituent group Z, which may have a substituent, include a vinyl group, an allyl group, a 1-propenyl group, a 2-butenyl group, a 1-pentenyl group, a 2-pentenyl group, a 4-pentenyl group, a 2-hexenyl group, a 3-hexenyl group, a 4-hexenyl group, a 2-heptenyl group, a 4-heptenyl group, a 2-nonenyl group, a 3-nonenyl group, a 2,6-nonadienyl group, a 2-octenyl group, a 3-octenyl group, a 4-decenyl group, a 2-dodecenyl group, a 2-tridecenyl group, a 2,7-octadienyl group, a 2-(2-thiazolyl)vinyl group, a 2-(5-thiazolyl)vinyl group, a styryl group, a 2-(2-thienyl)vinyl group, and a 9-octadecenyl group.

The alkynyl group included in the substituent group Z is not particularly limited, but an alkynyl group having 2 to 30 carbon atoms is preferable and an alkynyl group having 2 to 20 carbon atoms is more preferable.

Examples of the alkynyl group included in the substituent group Z, which may have a substituent, include an ethynyl group, a propargyl group, a 1-pentynyl group, a 2-pentynyl group, a 1-hexynyl group, a 2-hexynyl group, a 3-hexynyl group, a 1-heptynyl group, a 2-heptynyl group, a 3-heptynyl group, a 1-octynyl group, a 2-octynyl group, a 3-octynyl group, a 1-nonynyl group, a 2-nonynyl group, a 3-nonynyl group, a 1-decynyl group, a 2-decynyl group, a 3-decynyl group, a 1-undecynyl group, a 1-dodecynyl group, a 1-tetradecynyl group, a 1-pentadecynyl group, a 1-hexadecynyl group, a 1-heptadecynyl group, a 1-octadecynyl group, a trimethylsilylethynyl group, a triethylsilylethynyl group, a tri-i-propylsilylethynyl group, a p-propylphenylethynyl group, a 2-thienylethynyl group, a 2-thiazolylethynyl group, a 5-thiazolylethynyl group, and a phenylethynyl group.

The aryl group included in the substituent group Z is not particularly limited, but an aryl group having 6 to 20 carbon atoms is preferable and an aryl group having 6 to 12 carbon atoms is more preferable.

Examples of the aryl group included in the substituent group Z, which may have a substituent, include a phenyl group, a naphthyl group, a 2,4,6-trimethylphenyl group, a p-(t-butyl)phenyl group, a 4-methyl-2,6-dipropylphenyl group, a 4-fluorophenyl group, a 4-trifluoromethylphenyl group, a p-pentylphenyl group, a 3,4-dipentylphenyl group, a p-heptoxyphenyl group, and a 3,4-diheptoxyphenyl group.

Examples of the heterocyclic group included in the substituent group Z include heterocyclic groups which have 3 or more atoms constituting the ring and include at least one or more heteroatoms and 1 to 30 carbon atoms as the atoms constituting the ring. In addition, the heterocyclic group includes an aromatic heterocyclic group (heteroaryl group) and an aliphatic heterocyclic group.

Examples of a heteroatom constituting the ring include a nitrogen atom, an oxygen atom, and a sulfur atom, and the number thereof is not particularly limited, but is, for example, 1 or 2. The number of carbon atoms constituting the ring is preferably 3 to 20 and more preferably 5 to 12.

As the heterocyclic group, a 5-membered ring, a 6-membered ring, or a group of a fused ring of these rings is preferable.

Examples of the heterocyclic group included in the substituent group Z include a thienyl group, a thiazolyl group, an imidazolyl group, a pyridyl group, a pyrimidinyl group, a quinolyl group, a furanyl group, a selenophenyl group, a piperidyl group, a morpholino group, a benzoxazolyl group, a benzimidazolyl group, a benzthiazolyl group, a 2-hexylfuranyl group, and a pyranyl group.

The silyl group included in the substituent group Z, which may have a substituent, is not particularly limited, but a silyl group which has a group selected from an alkyl group and an aryl group as a substituent and has 3 to 40 (more preferably 3 to 30 and still more preferably 3 to 24) carbon atoms is preferable.

Examples of the silyl group included in the substituent group Z, which may have a substituent, include a trimethylsilyl group, a triethylsilyl group, a triphenylsilyl group, a triisopropylsilyl group, and a dimethylphenylsilyl group.

The alkoxy group included in the substituent group Z is not particularly limited, but an alkoxy group having 1 to 30 carbon atoms is preferable and an alkoxy group having 1 to 20 carbon atoms is more preferable.

Examples of the alkoxy group included in the substituent group Z include a methoxy group, an ethoxy group, a propoxy group, a butoxy group, a pentoxy group, a hexoxy group, a heptoxy group, an octoxy group, a nonoxy group, a decoxy group, a undecoxy group, a dodecoxy group, a tridecoxy group, a tetradecoxy group, a pentadecoxy group, and a hexadecoxy group.

The amino group included in the substituent group Z, which may have a substituent, is not particularly limited, but an amino group or an amino group which have a group selected from an alkyl group and an aryl group as a substituent and has 1 to 20 (more preferably 1 to 10 and still more preferably 1 to 6) carbon atoms is preferable.

Examples of the amino group included in the substituent group Z, which may have a substituent, include an amino group, a methylamino group, a dimethylamino group, a diethylamino group, a dibenzylamino group, and an anilino group.

The aryloxy group included in the substituent group Z is not particularly limited, but an aryloxy group having 6 to 20 carbon atoms is preferable, an aryloxy group having 6 to 16 carbon atoms is more preferable, and an aryloxy group having 6 to 12 carbon atoms is still more preferable.

Examples of the aryloxy group included in the substituent group Z include a phenyloxy group and 2-naphthyloxy.

The acyl group included in the substituent group Z is not particularly limited, but an acyl group having 1 to 30 carbon atoms is preferable and an acyl group having 1 to 20 carbon atoms is more preferable.

Examples of the acyl group included in the substituent group Z, which may have a substituent, include a formyl group, an acetyl group, a propionyl group, a (meth)acryloyl group, a butyryl group, an isobutyryl group, a pivaloyl group, a valeryl group, a hexanoyl group, a 2-ethylhexanoayl group, an octanoyl group, a decanoyl group, a undecanoyl group, a lauroyl group, a palmitoyl group, a stearoyl group, a cinnamoyl group, and a benzoyl group.

The alkoxycarbonyl group included in the substituent group Z is not particularly limited, but an alkoxycarbonyl group having 2 to 30 carbon atoms is preferable and an alkoxycarbonyl group having 2 to 20 carbon atoms is more preferable. Examples thereof include a methoxycarbonyl group, an ethoxycarbonyl group, a propoxycarbonyl group, a butoxycarbonyl group, a pentoxycarbonylcarbonyl group, a hexoxycarbonyl group, a heptoxycarbonyl group, an octoxycarbonyl group, a nonoxycarbonyl group, a decoxycarbonyl group, a undecoxycarbonyl group, a dodecoxycarbonyl group, a tridecoxycarbonyl group, a tetradecoxycarbonyl group, a pentadecoxycarbonyl group, and a hexadecoxycarbonyl group.

The aryloxycarbonyl group included in the substituent group Z is not particularly limited, but an aryloxycarbonyl group having 7 to 20 carbon atoms is preferable, an aryloxycarbonyl group having 7 to 16 carbon atoms is more preferable, an aryloxycarbonyl group having 7 to 10 carbon atoms is still more preferable, and a phenyloxycarbonyl group is particularly preferable.

The acyloxy group included in the substituent group Z is not particularly limited, but an acyloxy group having 2 to 30 carbon atoms is preferable and an acyloxy group having 2 to 20 carbon atoms is more preferable.

Examples of the acyloxy group included in the substituent group Z, which may have a substituent, include an acetoxy group, a benzoyloxy group, a (meth)acryloyloxy group, a propionyloxy group, a butyryloxy group, an isobutyryloxy group, a pivaloyloxy group, a valeryloxy group, a hexanoyloxy group, a 2-ethylhexanoyloxy group, an octanoyloxy group, a decanoyloxy group, a undecanoyloxy group, a lauroyloxy group, a palmitoyloxy group, a stearoyloxy group, a cinnamoyloxy group, and a benzoyloxy group.

The acylamino group included in the substituent group Z is not particularly limited, but an acylamino group having 2 to 20 carbon atoms is preferable, an acylamino group having 2 to 16 carbon atoms is more preferable, and an acylamino group having 2 to 10 carbon atoms is still more preferable.

Examples of the acylamino group included in the substituent group Z include an acetylamino group and a benzoylamino group.

The aminocarbonylamino group included in the substituent group Z is not particularly limited, but an aminocarbonylamino group having 2 to 20 carbon atoms is preferable, an aminocarbonylamino group having 2 to 16 carbon atoms is more preferable, an aminocarbonylamino group having 2 to 12 carbon atoms is still more preferable, and a ureido group is particularly preferable.

The alkoxycarbonylamino group included in the substituent group Z is not particularly limited, but an alkoxycarbonylamino group having 2 to 20 carbon atoms is preferable, an alkoxycarbonylamino group having 2 to 16 carbon atoms is more preferable, an alkoxycarbonylamino group having 2 to 12 carbon atoms is still more preferable, and a methoxycarbonylamino group, a tert-butoxycarbonylamino group, an allyloxycarbonylamino group, a 2,2,2-trichloroethoxycarbonylamino group, a 9-fluorenylmethyloxycarbonylamino group, a 2-trimethylsilethyloxycarbonylamino group, or a benzyloxycarbonylamino group is particularly preferable.

The aryloxycarbonylamino group included in the substituent group Z is not particularly limited, but an aryloxycarbonylamino group having 7 to 20 carbon atoms is preferable, an aryloxycarbonylamino group having 7 to 16 carbon atoms is more preferable, an aryloxycarbonylamino group having 7 to 12 carbon atoms is still more preferable, and a phenyloxycarbonylamino group is particularly preferable.

The alkylthio group included in the substituent group Z is not particularly limited, but an alkylthio group having 1 to 30 carbon atoms is preferable and an alkylthio group having 1 to 20 carbon atoms is more preferable. Examples of the alkylthio group included in the substituent group Z include a methylthio group, an ethylthio group, a propylthio group, a 2-methylpropylthio group, a butylthio group, an amylthio group, a pentylthio group, a 1-methylpentylthio group, a 2,2-dimethylpropylthio group, a hexylthio group, a heptylthio group, an octylthio group, a 2-ethylhexylthio group, a nonylthio group, a decylthio group, a 3,7-dimethyloctylthio group, a undecylthio group, a dodecylthio group, a tridecylthio group, a tetradecylthio group, a tetradecylthio group, a pentadecylthio group, a hexadecylthio group, an octadecylthio group, a 2,6-dimethyloctylthio group, a 2-decyltetradecylthio group, a 2-hexyldodecylthio group, a 2-ethyloctylthio group, a 2-butyloctylthio group, a 2-butyldecylthio group, a 2-octyldecylthio group, a 2-octyldodecylthio group, a 2-octyltetradecylthio group, a cyclopropylthio group, a cyclobutylthio group, a cyclopentylthio group, and a cyclohexylthio group.

The arylthio group included in the substituent group Z is not particularly limited, but an arylthio group having 6 to 20 carbon atoms is preferable, an arylthio group having 6 to 16 carbon atoms is more preferable, an arylthio group having 6 to 12 carbon atoms is still more preferable, and a phenylthio group is particularly preferable.

The above-described group selected from the substituent group Z may further have a substituent. Examples of such a substituent include a group selected from the substituent group Z.

In the group which further has a substituent, the number of substituents which may be further included is not particularly limited, but is, for example, preferably 1 to 6 and more preferably 1 to 3.

Examples of the group which is selected from the substituent group Z and further has a substituent include an acylalkyl group and an alkoxyalkyl group.

Among these, as the acylalkyl group, an acylalkyl group having 2 to 30 carbon atoms is preferable. In addition, the above-described acylalkyl group may be linear, branched, or cyclic.

Among these, as the alkoxyalkyl group, an alkoxyalkyl group having 2 to 30 carbon atoms is preferable. In addition, the above-described alkoxyalkyl group may be linear, branched, or cyclic.

From the viewpoint that the specific polymer has excellent solubility and transistor characteristics, as the substituent represented by $R^1$, an alkyl group, an alkenyl group, an alkynyl group, an alkoxyalkyl group, an acylalkyl group, an alkoxy group, an alkoxycarbonyl group, an acyloxy group, or an alkylthio group is preferable, an alkyl group, an alkenyl group, an alkynyl group, an alkoxyalkyl group, or an acylalkyl group is more preferable, and an alkyl group or an alkoxyalkyl group is particularly preferable.

* represents a bonding position.

It is preferable that the specific polymer includes a repeating unit (hereinafter, also referred to as a "specific repeating unit") including the partial structure (hereinafter, also referred to as a "specific partial structure") represented by Formula (1).

A content of the specific repeating unit is preferably 10% by mole or more, more preferably 30% by mole or more, and still more preferably 50% by mole or more with respect to all repeating units in the specific polymer. In addition, the upper limit value thereof is preferably 100% by mole or less.

A weight-average molecular weight of the specific polymer, which is measured by a gel permeation chromatography (GPC) method and expressed in terms of polystyrene, is preferably 5,000 to 1,000,000 and more preferably 10,000 to 500,000.

In the present specification, the weight-average molecular weight (Mw) of the specific polymer is defined as a value expressed in terms of polystyrene by means of gel permeation chromatography (GPC) measurement (solvent: 1,2,4-trichlorobenzene, flow amount (sample injection amount): 300 µL, column: two TSK gel GMH$_{HR}$-H (20) and one TSK gel G2000H$_{HR}$-H (20) HT, all manufactured by Tosoh Corporation, column temperature: 160° C., flow rate: 10 mL/min, detector: differential refractive index detector) using a GPC apparatus (HLC-8121 GPC manufactured by Tosoh Corporation).

In the specific polymer, the above-described specific repeating unit may be composed of only the specific partial structure, or may be composed of the specific partial structure and other structural sites other than the specific partial structure. In a case where the above-described specific repeating unit is composed of the specific partial structure and other structural sites other than the specific partial structure, as the above-described specific repeating unit, for example, a repeating unit represented by Formula (X) is preferable. In the following repeating unit, $X^1$ to $X^4$ and $Y^1$ to $Y^4$ are synonymous with $X^1$ to $X^4$ and $Y^1$ to $Y^4$ in Formula (1) described above, respectively. T represents the other structural sites described

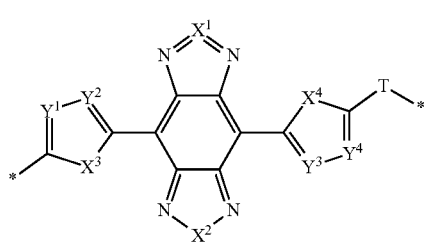

(X)

The repeating unit represented by Formula (X) described above is not particularly limited, and examples thereof include a repeating unit represented by Formula (2) described later and a repeating unit represented by Formula (3) described later.

Hereinafter, first, the repeating unit represented by Formula (2) will be described.

Repeating Unit Represented by Formula (2)

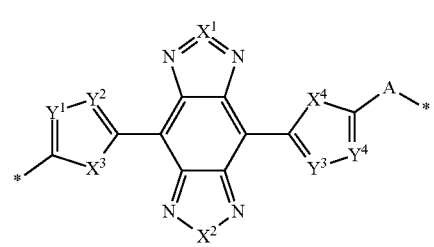

(2)

In Formula (2), $X^1$ to $X^4$ and $Y^1$ to $Y^4$ are synonymous with $X^1$ to $X^4$ and $Y^1$ to $Y^4$ in Formula (1), respectively, A represents a single bond or a divalent conjugated linking group, and * represents a bonding position.

The divalent conjugated linking group represented by A is a divalent linking group in which a conjugated system is connected from one bonding position to the other bonding position.

The divalent conjugated linking group represented by A is not particularly limited as long as the conjugated system is connected from one bonding position to the other bonding position, and for example, groups represented by Formulae (A) to (L) are preferable.

*-Lc-* (A)

*—(Ar)$_m$-Lc-(Ar)$_m$—* (B)

*(Ar)$_m$—* (C)

*—Z-Lc-Z—* (D)

*—Z—(Ar)$_m$—Z—* (E)

*—Z—(Ar)$_m$-Lc-(Ar)$_m$—Z—* (F)

*—(Ar)$_m$—Z—(Ar)$_m$—* (G)

*—(Ar)$_m$—Z—* (H)

*-Ld-* (I)

*—(Ar)$_m$-Ld-(Ar)$_m$—* (J)

*—Z-Ld-Z—* (K)

*—Z—(Ar)$_m$-Ld-(Ar)$_m$—Z—* (L)

In Formulae (A), (B), (D), and (F), Lc represents a conjugated fused ring group including two or more rings, which may have a substituent.

The above-described conjugated fused ring group is intended to be a group which is a divalent group formed by removing two hydrogen atoms from a fused ring consisting of two or more rings, and in which a conjugated system is connected from one bonding position to the other bonding position. The above-described fused ring may or may not exhibit aromaticity by itself.

Examples of the above-described fused ring include a fused ring obtained by combining two or more monocyclic aromatic rings and a fused ring obtained by combining one or more monocyclic aromatic rings and one or more rings other than the monocyclic aromatic ring (specifically, an anti-aromatic ring or a non-aromatic ring). The above-described aromatic ring is a ring in which the number of electrons included in the π-electron system is 4n+2 (n is an integer of 0 or more), the anti-aromatic ring is a ring in which the number of electrons included in the π-electron system is 4n (n is an integer of 1 or more), and the non-aromatic ring is intended to be a ring which does not satisfy the aromatic ring and the anti-aromatic ring.

For example, as shown below, a 2,7-fluorenylene group has a structure in which two benzene rings (aromatic rings) and one cyclopentadiene ring (non-aromatic ring) are fused. In the 2,7-fluorenylene group, since a conjugated system is connected by linking two benzene rings from one bonding position to the other bonding position, the 2,7-fluorenylene group corresponds to the conjugated fused ring group.

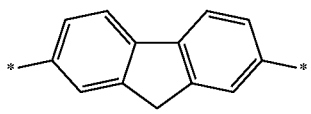 [SMILES: *c1ccc2c(c1)Cc1cc(*)ccc1-2]

In addition, as shown below, a dibenzo[a,e]pentalenylene group has a structure in which two benzene rings (aromatic rings) and one pentalene ring (anti-aromatic ring) are fused. In the dibenzo[a,e]pentalenylene group, since a conjugated system is connected from one bonding position to the other bonding position, the dibenzo[a,e]pentalenylene group corresponds to the conjugated fused ring group.

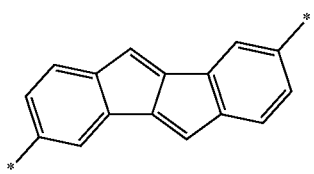 [SMILES: *c1ccc2c(c1)C1=Cc3ccc(*)cc3C1=C2]

The above-described fused ring may include a heteroatom. In a case where the above-described fused ring contains a heteroatom, examples of the heteroatom constituting the ring include a nitrogen atom, an oxygen atom, a sulfur atom, and a selenium atom. In addition, in the above-described fused ring, an atom constituting the ring may be >C=$W^1$ ($W^1$ represents an oxygen or sulfur atom).

The conjugated fused ring group represented by Lc may further have a substituent. Examples of the substituent include the groups exemplified as the above-described substituent group Z.

Examples of a divalent conjugated linking group represented by Lc include a group represented by Formula (A1). The divalent conjugated linking group represented by Lc is not limited to the group represented by Formula (A1).

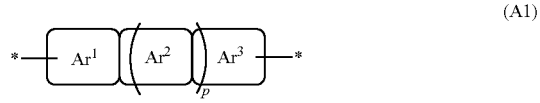

(A1)

In Formula (A1), $Ar^1$, $Ar^2$, and $Ar^3$ each independently represent a conjugated ring, p represents an integer of 0 to 8, and * represents a bonding site.

In Formula (A1), the above-described conjugated ring is intended to be a monocyclic aromatic ring, a monocyclic anti-aromatic ring, or a monocyclic non-aromatic ring. Among these, the above-described conjugated ring is preferably a monocyclic aromatic ring.

Examples of the above-described aromatic ring include a benzene ring, a pyrrole ring, a thiophene ring, a thiazole ring, an isothiazole ring, a selenophene ring, an oxazole ring, an isoxazole ring, a thiadiazole ring, an oxadiazole ring, an imidazole ring, a pyrazole ring, a triazole ring, a pyrazole ring, a pyridine ring, a pyridazine ring, a pyrimidine ring, a triazine ring, and a furan ring. Among these, a benzene ring, a selenophene ring, a thiazole ring, a furan ring, or a thiophene ring is preferable, and a benzene ring, a thiazole ring, or a thiophene ring is more preferable. In addition, examples of the above-described anti-aromatic ring include cyclobutadiene, pentalene, and cyclooctatetraene. In addition, examples of the above-described non-aromatic ring include cyclopentadiene 1-silacyclopenta-2,4-diene and 1-germacyclopenta-2,4-diene.

From the viewpoint that the transistor characteristics of the organic thin film transistor to be formed are more excellent, p is preferably 2 or more and more preferably 3 or more.

$Ar^1$, $Ar^2$, and $Ar^3$ may further have a substituent. Examples of the substituent include the groups exemplified as the above-described substituent group Z.

Hereinafter, specific examples of the divalent conjugated linking group represented by Lc (hereinafter, also referred to as a "Lc group") will be shown, but the divalent conjugated linking group is not limited thereto.

In each formula of the Lc group shown below, R represents a hydrogen atom or a substituent. X's each independently represent a sulfur atom, an oxygen atom, a selenium atom, or —$NR^{T1}$—. $X^a$ represents a sulfur atom or a selenium atom. Y's each independently represent —$CR^{T1}$= or a nitrogen atom. Z's each independently represent a sulfur atom, an oxygen atom, a selenium atom, —$NR^{T1}$—, —$SiR^{T2}_2$—, —$GeR^{T2}_2$—, or —$CR^{T2}_2$—. W's each independently represent an oxygen atom or a sulfur atom. V's each independently represent an oxygen atom, a sulfur atom, or —$NR^{T1}$—. $R^{T1}$'s each independently represent a hydrogen atom or a substituent. $R^{T2}$'s each independently represent an aliphatic hydrocarbon group (preferably having 1 to 30 carbon atoms and more preferably having 1 to 20 carbon atoms).

In each formula of the Lc group shown below, two single lines extending from the fused ring represent a bonding site. That is, in the following specific examples, it is shown in a form (-D-) including the two bonding sites of a fused ring (D).

In each formula of the Lc group shown below, X is preferably a sulfur atom, an oxygen atom, or a selenium atom, more preferably a sulfur atom or a selenium atom, and still more preferably a sulfur atom. Z is preferably a sulfur atom, an oxygen atom, a selenium atom, —$SiR^{T2}_2$—, —$GeR^{T2}_2$—, or —$CR^{T2}_2$—, and more preferably a sulfur atom, —$SiR^{T2}_2$—, —$GeR^{T2}_2$—, or —$CR^{T2}_2$—. W is preferably an oxygen atom. V is preferably —$NR^{T1}$—. R's are each independently preferably an aliphatic hydrocarbon group (preferably having 1 to 30 carbon atoms and more preferably having 1 to 20 carbon atoms) or an aryl group (preferably, a phenyl group), and more preferably an aliphatic hydrocarbon group.

(Lc group)

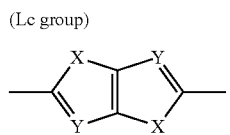

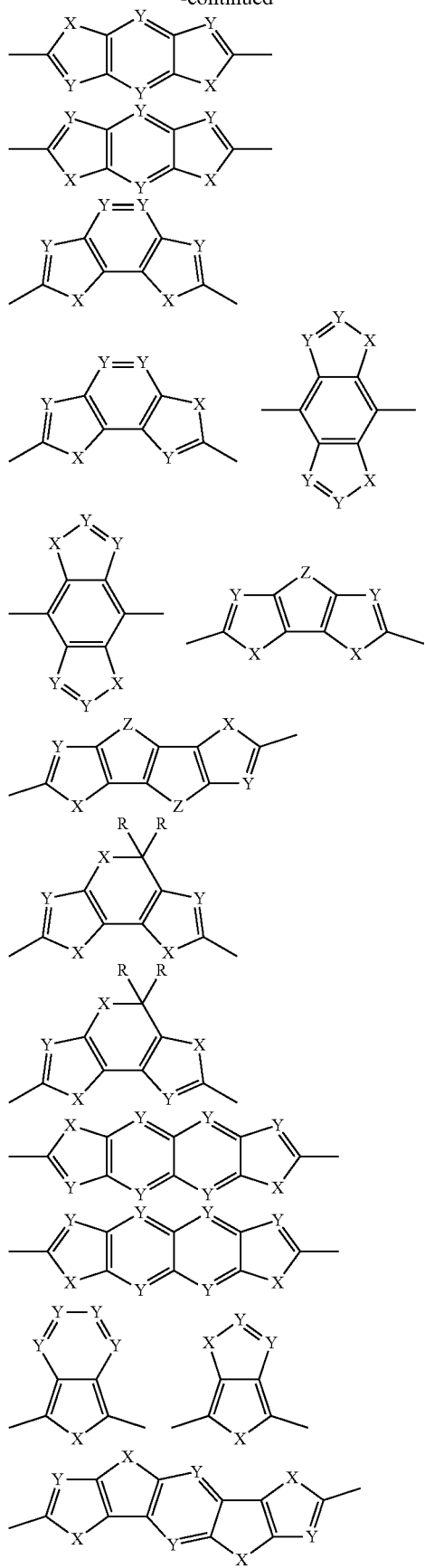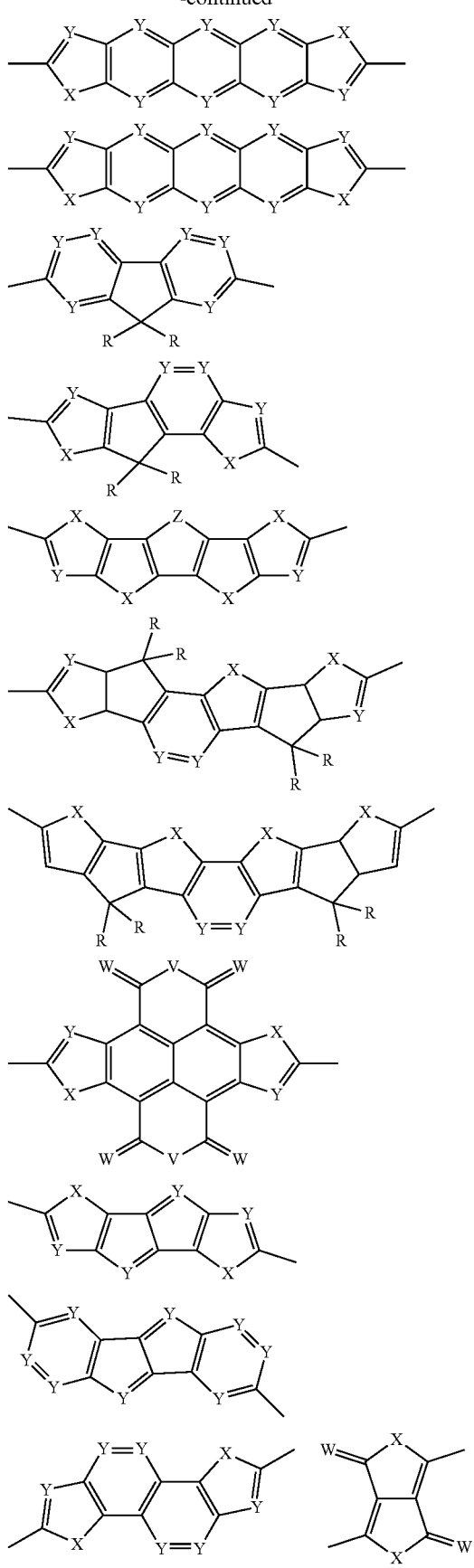

-continued
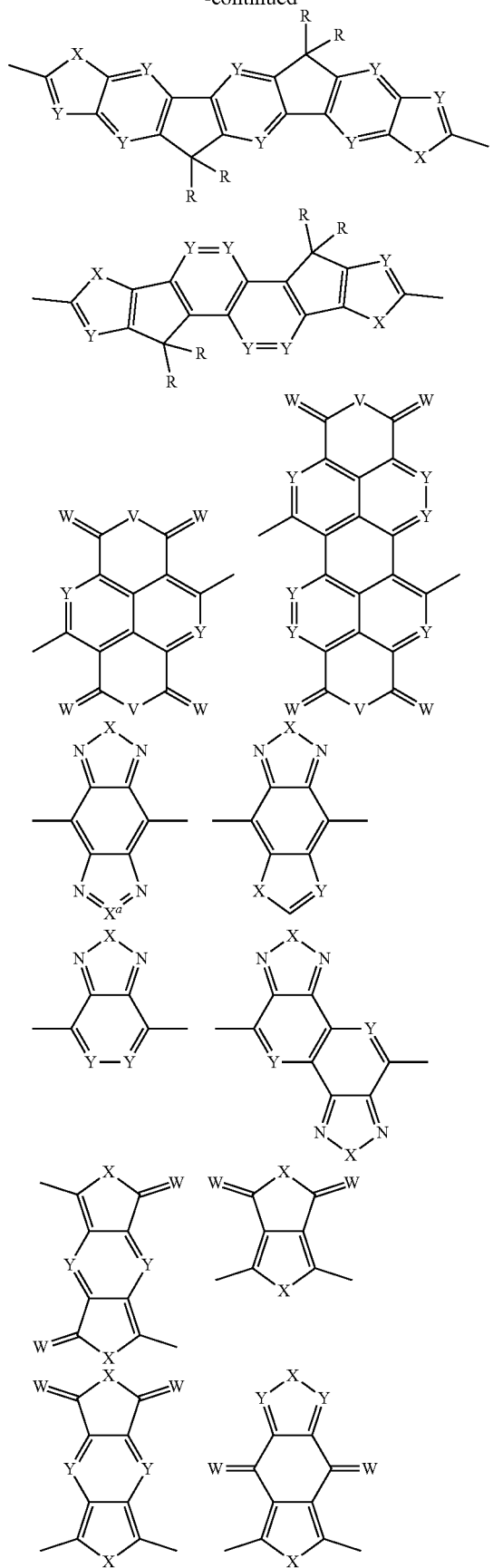
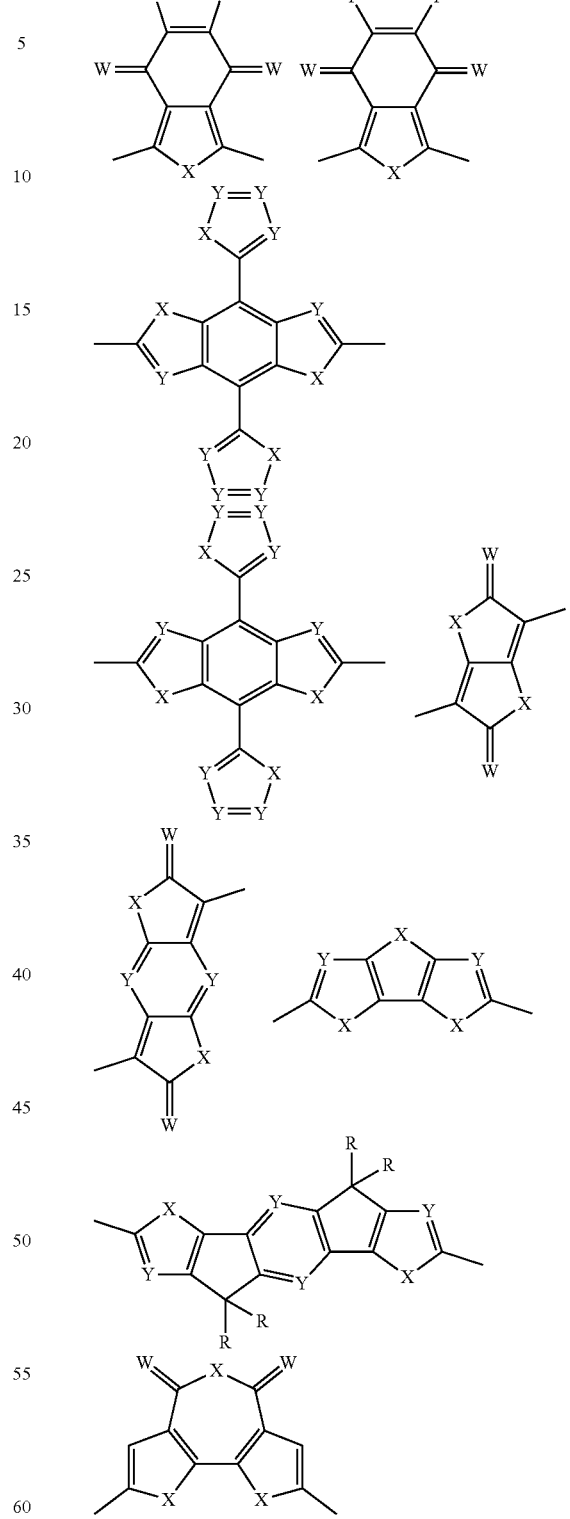
In a case where the specific polymer is used as an n-type organic semiconductor compound, it is preferable that the conjugated fused ring group represented by Lc includes at least one of $>C=W^1$, $-N=$, or $-CR^{Lc}=$. Here, $R^{Lc}$ represents an electron withdrawing group.

Examples of the electron withdrawing group represented by $R^{Lc}$ include a group of the groups exemplified as the substituent group Z, in which the Hammett substituent constants am and op are positive. Regarding the Hammett substituent constants, Chem. Rev. 1991, 91, pp. 165 to 195 can be referred to.

As the electron withdrawing group represented by $R^{Lc}$, a fluorine atom, a chlorine atom, —$CF_2R^X$, a cyano group, an acyl group, an acyloxy group, an alkanesulfonyl group, an alkanesulfinyl group, a (hetero)aryloxycarbonyl group, a (hetero)arylsulfonyl group, a (hetero)arylsulfinyl group, a (hetero)arylcarbonyl group, an alkoxycarbonyl group, a (hetero)aryloxycarbonyl group, or a perfluoroalkyl group is preferable, a fluorine atom, a chlorine atom, —$CF_2R^X$, a cyano group, an acyl group, an acyloxy group, an alkanesulfonyl group, an alkanesulfinyl group, an alkoxycarbonyl group, or a perfluoroalkyl group is more preferable, and a fluorine atom, —$CF_2R^X$, a cyano group, an acyl group, an alkanesulfonyl group, an alkoxycarbonyl group, or a perfluoroalkyl group is still more preferable. $R^X$ represents a hydrogen atom or a substituent.

In the conjugated fused ring group represented by Lc, it is preferable that each group of $>C=W^1$, —N=, and —$CR^{Lc}$=described above is included as an atom forming the ring.

$W^1$ represents an oxygen or sulfur atom.

$R^X$ represents a hydrogen atom or a substituent. Examples of the substituent represented by $R^X$ include the groups exemplified as the above-described substituent group Z.

Among the above-described Lc groups, from the viewpoint that the carrier mobility of the organic thin film transistor to be formed in the atmosphere is more excellent due to more excellent packing of the polymers, those having the structure described in the following Lc-1 group are more preferable. In the structure described in the following Lc-1 group, X, Y, and $X^a$ are as described above.

(Lc-1 group)

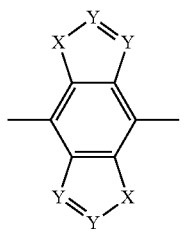
(Lc-1a)

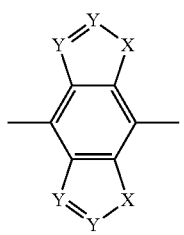
(Lc-1b)

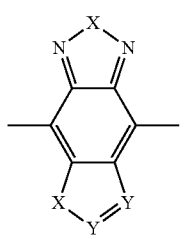
(Lc-1c)

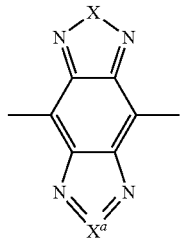
(Lc-1d)

In addition, in a case where the specific polymer is used as an n-type organic semiconductor compound, it is preferable that at least one Y in the above-described Lc group and the above-described Lc-1 group is a nitrogen atom or —$CR^{Lc}$=.

In Formulae (B), (C), (E), (F), (G), (H), (J), and (L), Ar represents a monocyclic aromatic ring group which may have a substituent. m represents an integer of 1 to 4.

The monocyclic aromatic ring in the aromatic ring group represented by Ar may be a monocyclic aromatic hydrocarbon ring or a monocyclic aromatic heterocyclic ring.

The monocyclic aromatic hydrocarbon ring is preferably a benzene ring.

Examples of a heteroatom (atom other than carbon atoms and hydrogen atoms) included in the monocyclic aromatic heterocyclic ring include a sulfur atom, an oxygen atom, a nitrogen atom, and a selenium atom, and a sulfur atom, an oxygen atom, or a nitrogen atom is preferable.

The number of heteroatoms included in the monocyclic aromatic heterocyclic ring is not particularly limited, but is preferably 1 to 4 and more preferably 1 or 2.

As the monocyclic aromatic heterocyclic ring, furan, thiophene, selenophene, pyrrole, thiazole, isothiazole, oxazole, isoxazole, thiadiazole, oxadiazole, imidazole, pyrazole, triazole, pyridine, pyrimidine, pyridazine, pyrazine, triazine, or tetradine is preferable, and thiophene or thiazole is more preferable.

The monocyclic aromatic ring group represented by Ar may further have a substituent.

Examples of the substituent include the groups exemplified as the above-described substituent group Z.

In a case where the specific polymer is used as an n-type organic semiconductor compound, it is preferable that the monocyclic aromatic ring group represented by Ar includes at least one of —N= or —$CR^{Lc}$=. Here, $R^{Lc}$ represents an electron withdrawing group. The electron withdrawing group represented by $R^{Lc}$ is synonymous with the electron withdrawing group represented by $R^{Lc}$ in —$CR^{Lc}$=which is preferably included in the conjugated fused ring group represented by Lc described above, and the suitable aspect thereof is also the same.

In the monocyclic aromatic ring represented by Ar, it is preferable that each group of —N= and —$CR^{Lc}$=described above is included as an atom forming the ring.

m represents an integer of 1 to 4. Among these, m in (B), (F), (G), (J), and (L) is preferably 1 or 2 and more preferably 1. Among these, m in (C), (E), and (H) is preferably 2 to 4.

In Formulae (I), (J), (K), and (L), Ld represents Formulae (L1) to (L3).

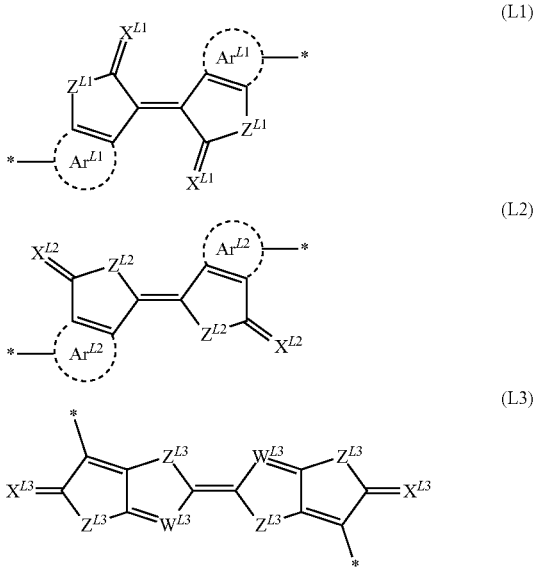

(L1)

(L2)

(L3)

In Formula (L1), $X^{L1}$'s each independently represent an oxygen atom or a sulfur atom. Among these, $X^{L1}$ is preferably an oxygen atom.

$Z^{L1}$'s each independently represent a sulfur atom, an oxygen atom, —$NR^{L1}$—, or a selenium atom. Among these, $Z^{L1}$ is preferably a sulfur atom, an oxygen atom, or —$NR^{L1}$—.

$R^{L1}$ represents a hydrogen atom or a substituent. Examples of the substituent represented by $R^{L1}$ include the groups exemplified as the above-described substituent group Z, and an alkyl group, an alkenyl group, an alkynyl group, or an alkoxyalkyl group is preferable.

$Ar^{L1}$'s each independently represent an aromatic ring which may be fused. $Ar^{L1}$ constitutes the above-described aromatic ring together with two carbon atoms specified in Formula (L1).

In a case where the aromatic ring represented by $Ar^{L1}$ is a monocyclic aromatic ring, the monocyclic aromatic ring represented by $Ar^{L1}$ is synonymous with the monocyclic aromatic ring represented by Ar in Formulae (B), (C), (E), (F), (G), (H), (J), and (L), and the suitable aspect thereof is also the same.

In a case where the aromatic ring represented by $Ar^{L1}$ is a fused aromatic ring, examples of the fused aromatic ring represented by $Ar^{L1}$ include a fused ring obtained by combining two or more monocyclic aromatic rings and a fused ring obtained by combining one or more monocyclic aromatic rings and one or more rings other than the monocyclic aromatic ring (specifically, an anti-aromatic ring or a non-aromatic ring). Among these, the fused aromatic ring represented by $Ar^{L1}$ is preferably a fused ring obtained by combining two or more monocyclic aromatic rings.

In addition, the aromatic ring represented by $Ar^{L1}$, which may be fused, may further have a substituent. Examples of the substituent include the groups exemplified as the above-described substituent group Z.

* represents a bonding position.

Specific examples of the aromatic ring represented by $Ar^{L1}$, which may be fused, include benzene, thiophene, thiazole, pyridine, and naphthalene.

$X^{L2}$, $Z^{L2}$, $Ar^{L2}$, $R^{L2}$, and * in Formula (L2) are synonymous with $X^{L1}$, $Z^{L1}$, $Ar^{L1}$, $R^{L1}$, and * in Formula (L1), respectively, and the suitable aspects thereof are also the same.

$X^{L3}$, $Z^{L3}$, $R^{L3}$, and * in Formula (L3) are synonymous with $X^{L1}$, $Z^{L1}$, $R^{L1}$, and * in Formula (L1), respectively, and the suitable aspects thereof are also the same.

$W^{L3}$'s each independently represent —$CR^{L32}$= or a nitrogen atom. $W^{L3}$ is preferably —$CR^{L32}$= and more preferably —CH=.

$R^{L32}$'s each independently represent a hydrogen atom or a substituent. Examples of the substituent represented by $R^{L32}$ include the groups exemplified as the above-described substituent group Z.

In Formulae (D) to (H), (K), and (L). Z represents a conjugated fused ring group including two or more rings, which may have a substituent, a monocyclic aromatic ring group which may have a substituent, and a divalent conjugated linking group other than the divalent conjugated linking groups represented by Formulae (L1) to (L3). That is, Z represents a divalent conjugated linking group other than Lc, Ar, and Ld described above.

The divalent conjugated linking group represented by Z is not particularly limited, but a vinylene group, an ethynylene group, —C=N—, a 1,3-cyclopentadienylene group, or an azo group is preferable, and a vinylene group or an ethynylene group is more preferable. The vinylene group and the 1,3-cyclopentadienylene group may further have a substituent.

Examples of the substituent include the groups exemplified as the above-described substituent group Z.

In Formulae (B), (F), (G), (J), and (L), a plurality of Ar's and a plurality of m's may be the same or different from each other, respectively. In addition, in Formulae (C), (E), and (H), in a case where m is an integer of 2 or more, a plurality of Ar's may be the same or different from each other. In addition, in Formulae (D), (E), (F), (K), and (L), a plurality of Z's may be the same or different from each other.

In a case where the specific polymer is used as an n-type organic semiconductor compound, it is preferable that Formulae (A) to (H) in the divalent conjugated linking group represented by A satisfy the following configurations, respectively.

• Formulae (A) and (D)

The conjugated fused ring group represented by Lc in Formulae (A) and (D) includes at least one of >C=$W^1$, —N=, or —$CR^{Lc}$=. $W^1$ represents an oxygen atom or a sulfur atom.

• Formulae (B) and (F) The conjugated fused ring group represented by Le and the monocyclic aromatic ring group represented by Ar in Formulae (B) and (F) satisfy any of the following requirements 1 to 3.

• Formulae (C), (E), (G), and (H).

The monocyclic aromatic ring group represented by Ar in Formulae (C), (E), (G), and (H) satisfies the following requirement 2.

Requirement 1: the conjugated fused ring group represented by Lc includes at least one of >C=$W^1$ or —$CR^{Lc}$=.

Requirement 2: the monocyclic aromatic ring group represented by Ar includes at least one of —N= or —$CR^{Lc}$=.

Requirement 3: one or more selected from the group consisting of the conjugated fused ring groups represented by Lc includes at least one of >C=$W^1$, —N=, or —$CR^{Lc}$=, and one or more selected from the group consisting of the monocyclic aromatic ring groups represented by Ar includes at least one of —N= or —$CR^{Lc}$=.

However, in Requirements 1 to 3, $W^1$ represents an oxygen atom or a sulfur atom and $R^{Lc}$ represents an electron withdrawing group. The electron withdrawing group represented by $R^{Lc}$ is synonymous with the electron withdrawing group represented by $R^{Lc}$ in —$CR^{Lc}$=which is preferably included in the conjugated fused ring group represented by Lc described above, and the suitable aspect thereof is also the same.

In a case where the specific polymer is used as an n-type organic semiconductor compound, as the divalent conjugated linking group represented by A, any one selected from the group consisting of Formulae (A) to (H) satisfying the above-described configurations and Formulae (I) to (L) described above is preferable.

In addition, from the viewpoint that the carrier mobility of the organic thin film transistor to be formed in the atmosphere is more excellent, the conjugated linking group represented by A in the specific polymer is preferably a conjugated linking group including a heteroatom.

In addition, from the viewpoint that the atmospheric stability of the organic thin film transistor to be formed is more excellent and/or viewpoint of ease of synthesis, in Formula (2), the conjugated linking group represented by A is preferably a single bond or any one selected from the group consisting of Formulae (A), (B), (C), (I), and (J).

Hereinafter, specific examples of the repeating unit represented by Formula (2) will be shown, but the repeating unit represented by Formula (2) is not limited thereto. In each repeating unit shown below, specific examples of "A" include conjugated linking groups listed in Tables 1 to 7 described later and other conjugated linking groups (-A-) described later.

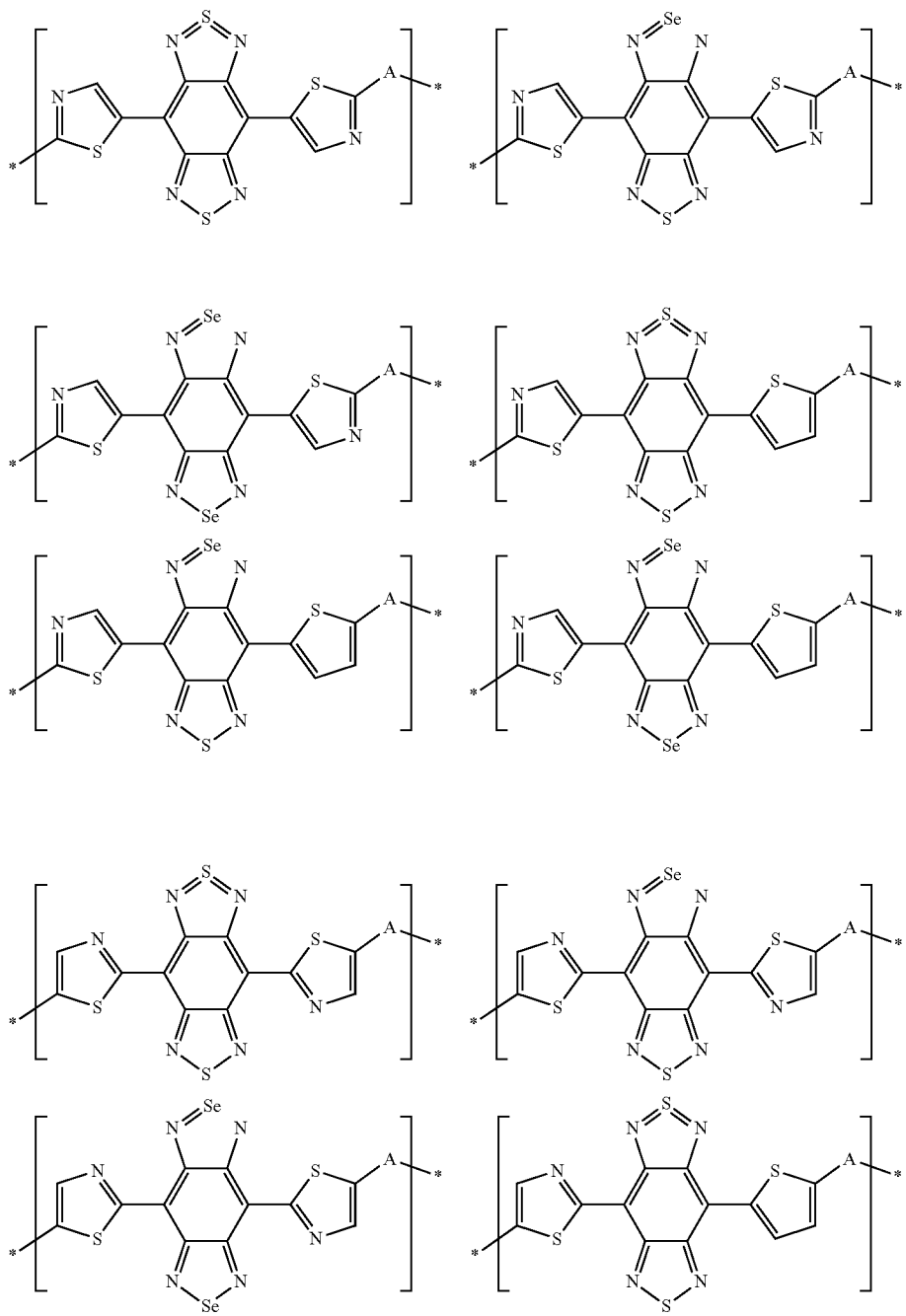

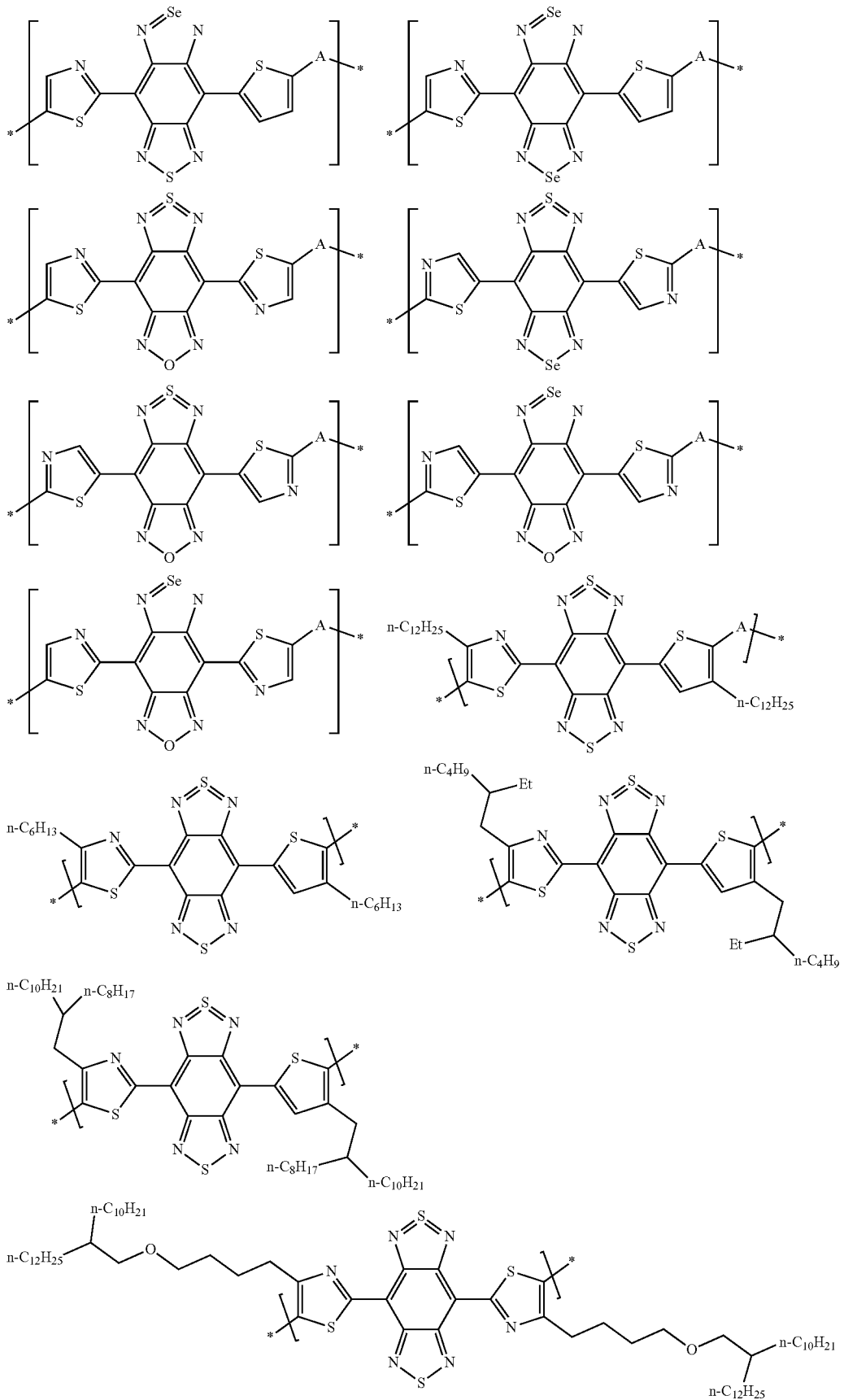

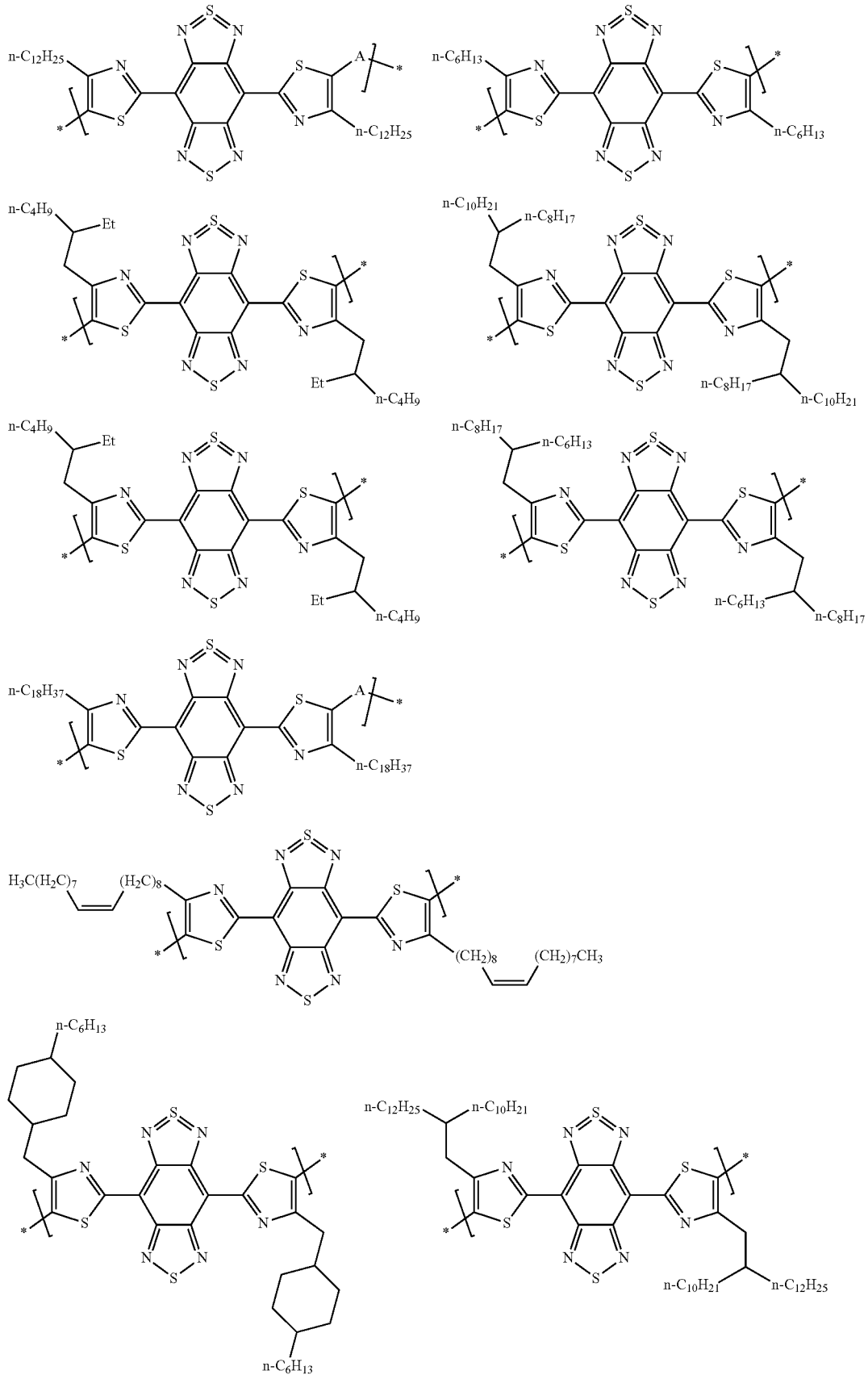

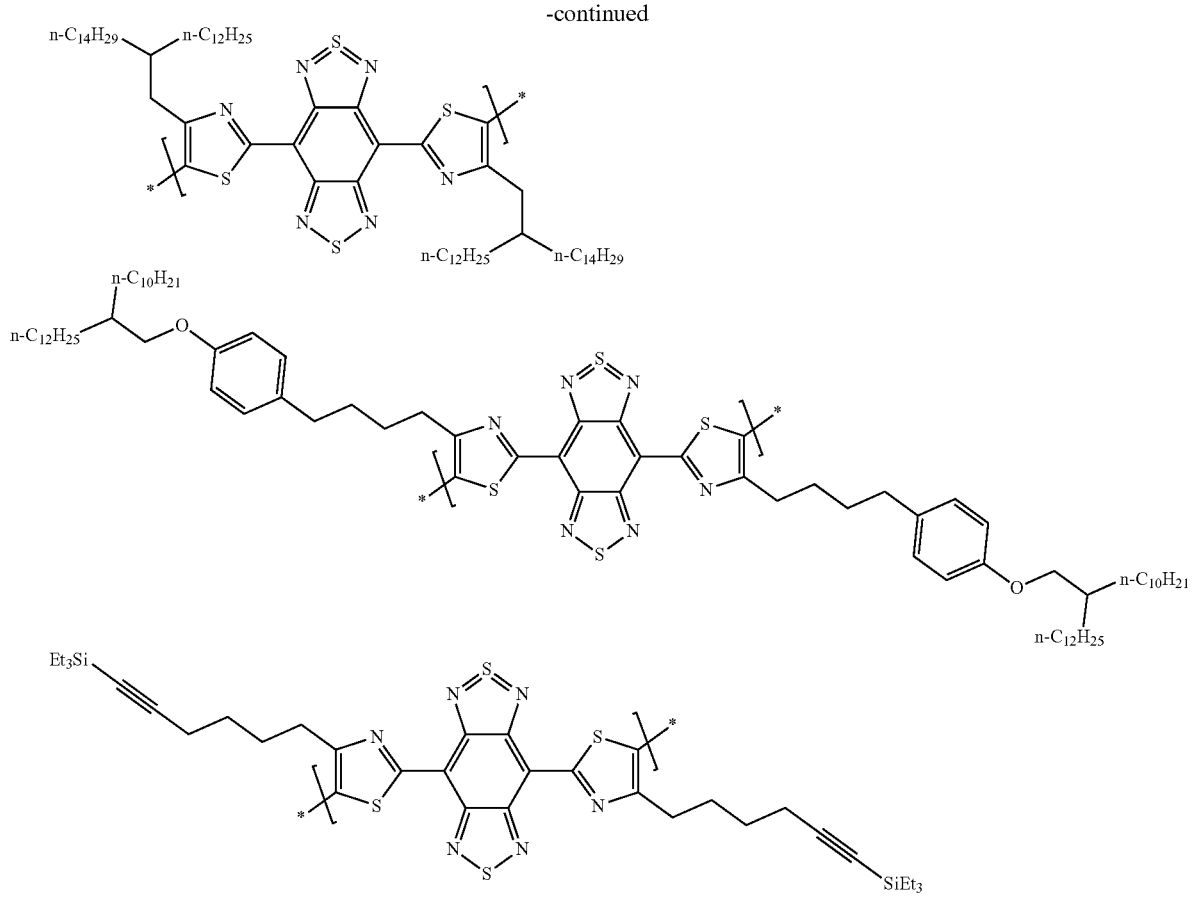

Hereinafter, specific examples of the divalent conjugated linking group represented by A in Formula (2) will be shown, but the divalent conjugated linking group represented by A is not limited thereto.

In the specific examples of -A- shown in Tables 1 to 7 and the specific examples of -A- shown in the column of "Other conjugated linking group (-A-)", two single lines represent a bonding site forming a polymer backbone.

TABLE 1

| Number | -A- | R |
|---|---|---|
| Example 1-(1) | (cyclopenta-dithiophene with R, R on C) | 2-ethylhexyl |
| Example 1-(2) | (dithienosilole with R, R on Si) | 2-ethylhexyl |
| Example 1-(3) | (dithienogermole with R, R on Ge) | n-octyl |

TABLE 1-continued

| Number | -A- | R |
|---|---|---|
| Example 1-(4) | (pyrrole-fused bisthiophene with N-R) | 2-octyldodecyl |
| Example 1-(5) | (benzodithiophene with OR groups) | 2-ethylhexyl |
| Example 1-(6) | (benzodithiophene with R groups) | 5-methyl-2-(n-C₆H₁₃)-thiophene |
| Example 1-(7) | (benzodithiophene with OR groups) | 2-ethylhexyl |
| Example 1-(8) | (pyran-fused bisthiophene with R,R) | 3,7-dimethyloctyl |
| Example 1-(9) | (thieno[3,2-b]thiophene) | — |
| Example 1-(10) | (fluorene with R,R) | R = n-octyl |
| Example 1-(11) | (bis-thiophene vinylene with R groups) | 2-ethylhexyl |
| Example 1-(12) | (indacenodithiophene with R,R) | n-dodecyl |

TABLE 1-continued

| Number | -A- | R |
|---|---|---|
| Example 1-(13) | (structure) | —⟨phenyl⟩—n-C$_{16}$H$_{33}$ |
| Example 1-(14) | (structure) | n-dodecyl |
| Example 1-(15) | (structure) | n-dodecyl |
| Example 1-(16) | (structure) | — |
| Example 1-(17) | (structure) | n-ocytyl |
| Example 1-(18) | (structure) | n-decyl |
| Example 1-(19) | (structure) | n-octadecyl |
| Example 1-(20) | (structure) | n-hexyl |

TABLE 1-continued
| Number | -A- | R |
|---|---|---|
| Example 1-(21) | 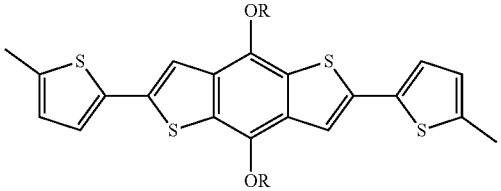 | 2-ethylhexyl |
| Example 1-(22) | 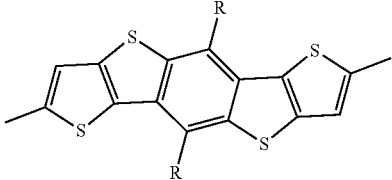 | butoxypropyl |
| Example 1-(23) | 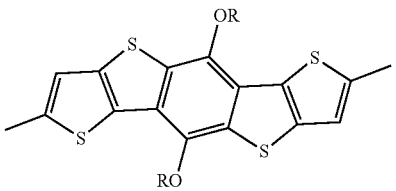 | 2-butyloctyl |
| Example 1-(24) | 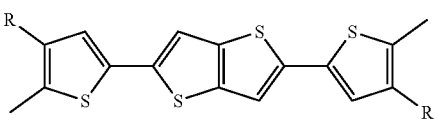 | R = 2-octyldodecyl |
| Example 1-(25) | 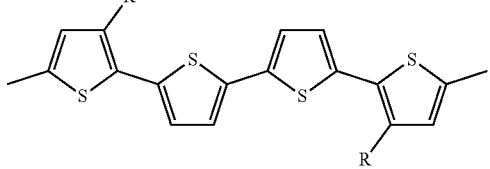 | R = n-dodecyl |
| Example 1-(26) | 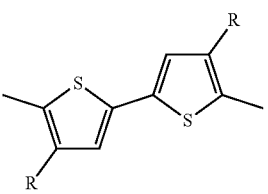 | n-ocytyl |
| Example 1-(27) | 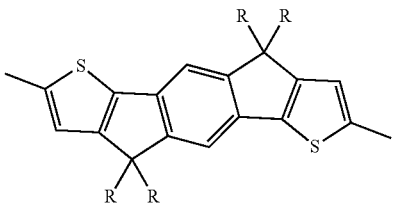 | n-dodecyl |
| Example 1-(28) | 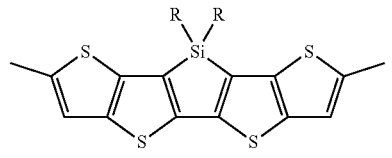 | 2-ethylhexyl |

TABLE 1-continued

| Number | -A- | R |
|---|---|---|
| Example 1-(29) | (structure) | 2-butyloctyl |
| Example 1-(30) | (structure) | 2-ethylhexyl |

TABLE 2

| Number | —A— | R |
|---|---|---|
| Example 1-(31) | (structure) | n-tetradecyl |
| Example 1-(32) | (structure) | 2-butyloctyl |
| Example 1-(33) | (structure) | 2-hexyldecyl |
| Example 1-(34) | (structure) | n-hexadecyl |
| Example 1-(35) | (structure) | n-octadecyl |

TABLE 2-continued
| Number | —A— | R |
|---|---|---|
| Example 1-(36) | 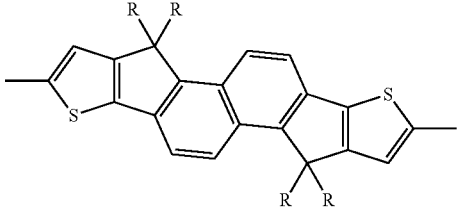 | n-hexadecyl |
| Example 1-(37) | 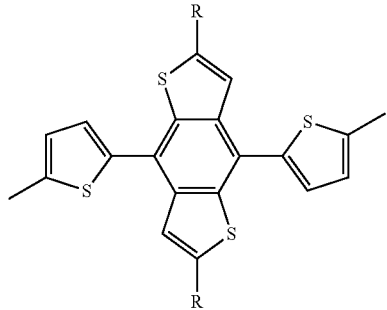 | n-hexadecyl |
| Example 1-(38) | 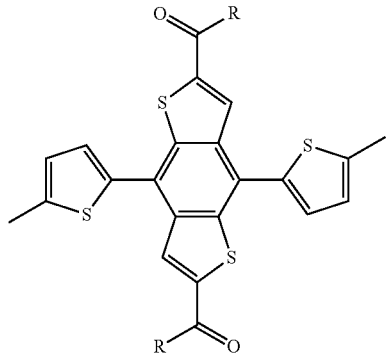 | n-hexadecyl |
| Example 1-(39) | 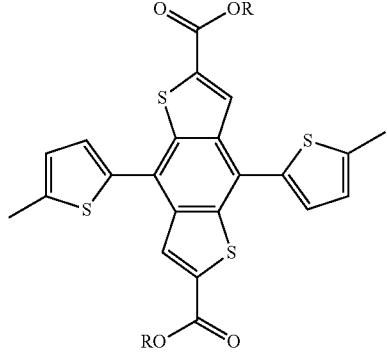 | n-hexadecyl |
| Example 1-(40) | 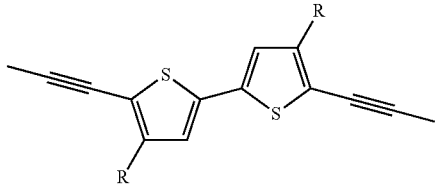 | n-decyl |
| Example 1-(41) | 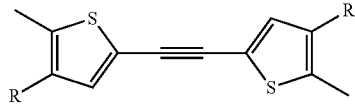 | n-decyl |

TABLE 2-continued
| Number | —A— | R |
|---|---|---|
| Example 1-(42) | 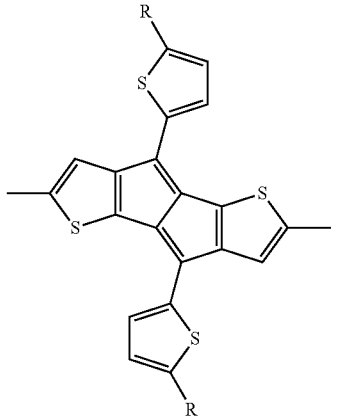 | n-octadecyl |
| Example 1-(43) | 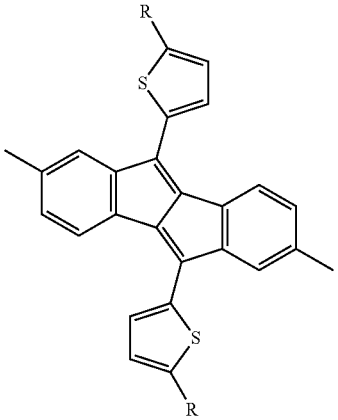 | n-octadecyl |
| Example 1-(44) | 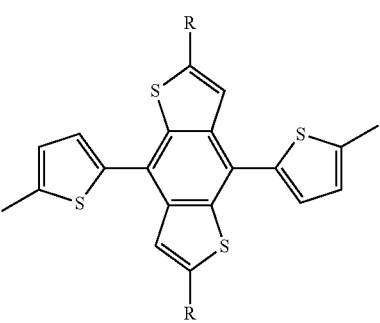 | 2-octyldodecyl |
| Example 1-(45) | 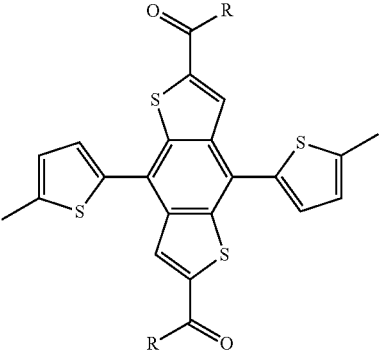 | 2-octyldodecyl |

TABLE 2-continued
| Number | —A— | R |
|---|---|---|
| Example 1-(46) | 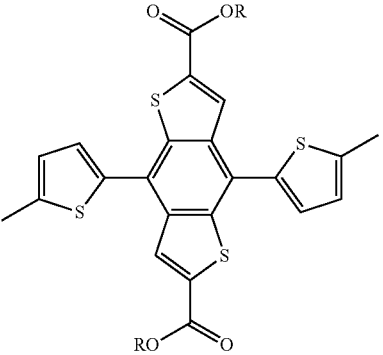 | 2-octyldodecyl |
TABLE 3
| Number | —A— | R |
|---|---|---|
| Example 2-(1) | 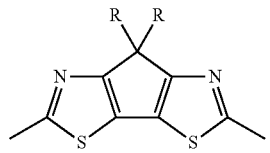 | 2-ethylhexyl |
| Example 2-(2) | 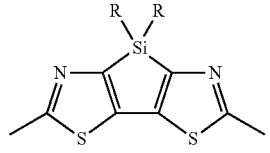 | 2-ethylhexyl |
| Example 2-(3) | 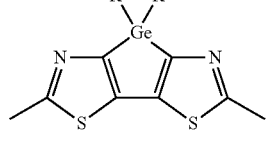 | n-octyl |
| Example 2-(4) | 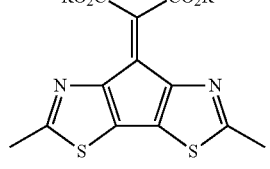 | 2-octyldodecyl |
| Example 2-(5) | 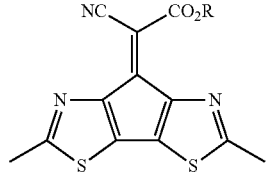 | 2-ethylhexyl |
| Example 2-(6) | 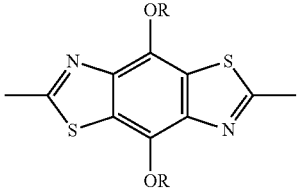 | 2-ethylhexyl |

TABLE 3-continued

| Number | —A— | R |
|---|---|---|
| Example 2-(7) | [fused bis-thiazole benzene structure with R groups] | [5-methyl-2-(n-hexyl)thiazole structure] |
| Example 2-(8) | [naphthalene diimide structure with methyl groups and N-R] | 2-butyloctyl |
| Example 2-(9) | [dimethylthienothiophene with CO$_2$R and F substituents] | n-octadecyl |
| Example 2-(10) | [thieno-pyrazine with two CO$_2$R groups and methyl groups] | n-hexyl |
| Example 2-(11) | [bis(methylthiophen-2(5H)-one) ylidene structure] | — |
| Example 2-(12) | [quinacridone-type structure with methyl and N-R groups] | 2-ethylhexyl |
| Example 2-(13) | [dimethyl-benzothiadiazole structure] | — |
| Example 2-(14) | [bis(methylthienyl)-benzothiadiazole with R groups] | 2-octyldodecyl |

TABLE 3-continued
| Number | —A— | R |
|---|---|---|
| Example 2-(15) | 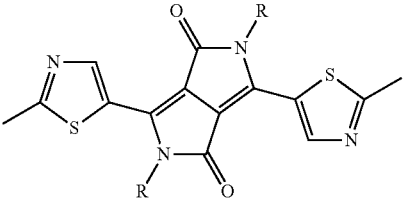 | 2-ethylhexyl |
| Example 2-(16) | 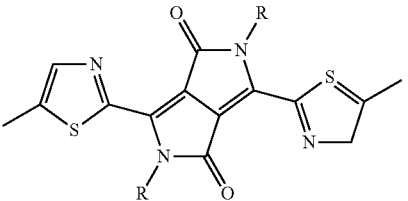 | n-octyl |
| Example 2-(17) | 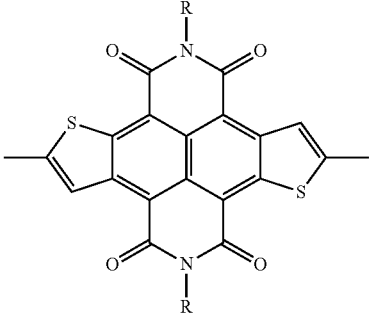 | n-octyl |
| Example 2-(18) | 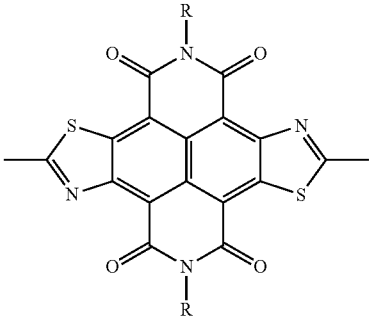 | 2-butyloctyl |
| Example 2-(19) | 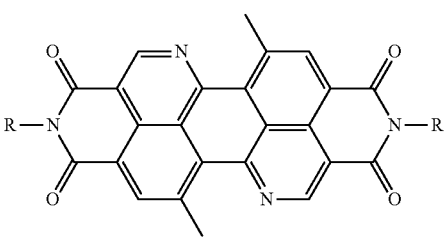 | 2-octyldodecyl |
| Example 2-(20) | 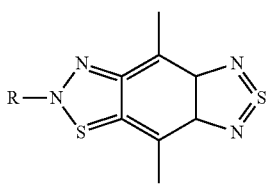 | n-dodecyl |

TABLE 3-continued

| Number | —A— | R |
|---|---|---|
| Example 2-(21) | (structure) | n-dodecyl |
| Example 2-(22) | (structure) | 3,7-dimethyloctyl |
| Example 2-(23) | (structure) | n-octadecyl |
| Example 2-(24) | (structure) | n-dodecyl |
| Example 2-(25) | (structure) | n-dodecyl |
| Example 2-(26) | (structure) | — |
| Example 2-(27) | (structure) | — |
| Example 2-(28) | (structure) | 2-dodecytetoradecyl |

TABLE 4

| Number | —A— | R |
|---|---|---|
| Example 2-(29) | benzothiadiazole with two methyl groups and CN substituent | — |
| Example 2-(30) | benzothiadiazole with two methyl groups and two CN substituents | — |
| Example 2-(31) | benzothiadiazole with two methyl groups and Cl substituent | — |
| Example 2-(32) | benzothiadiazole flanked by two methylthiophenes bearing R, with CN substituent | n-octadecyl |
| Example 2-(33) | benzothiadiazole flanked by two methylthiazoles bearing R, with CN substituent | 2-dodecylhexadecyl |
| Example 2-(34) | pyridine-fused thiadiazole flanked by two thiazoles bearing R | 3,7-dimethyloctyl |
| Example 2-(35) | naphthalene diimide with two propenyl groups and two N–R groups | n-octyl |

TABLE 4-continued

| Number | —A— | R |
|---|---|---|
| Example 2-(36) | (structure: polycyclic diimide with two propenyl substituents and two N–R groups) | 2-octyldodecyl |
| Example 2-(37) | (structure: benzothiadiazole flanked by two 4-R-5-methylthiophenes) | n-octyl |
| Example 2-(38) | (structure: difluorobenzothiadiazole flanked by two 4-R-5-methylthiophenes) | 2-ethylhexyl |
| Example 2-(39) | (structure: dicyanobenzothiadiazole flanked by two 4-R-5-methylthiophenes) | 2-hexyldecyl |
| Example 2-(40) | (structure: monofluoro-dimethyl benzothiadiazole) | — |
| Example 2-(41) | (structure: difluoro-dimethyl benzothiadiazole) | — |
| Example 2-(42) | (structure: dichloro-dimethyl benzothiadiazole) | — |

TABLE 4-continued

| Number | —A— | R |
|---|---|---|
| Example 2-(43) | [structure: benzothiadiazole with two F and two thiophene-R groups] | n-hexadecyl |
| Example 2-(44) | [structure: benzothiadiazole with two F and two thiazole-R groups] | n-octadecyl |
| Example 2-(45) | [structure: pyridine-fused thiadiazole with two thiophene-R groups] | 2-dodecylhexadecyl |
| Example 2-(46) | [structure: benzoxadiazole with two methyl groups] | — |
| Example 2-(47) | [structure: perylene diimide with two propenyl groups and two N-R groups] | 2-octyldodecyl |
| Example 2-(48) | [structure: pyridine-fused thiadiazole with two thiophene-R groups] | n-octyl |
| Example 2-(49) | [structure: benzothiadiazole with CN and two thiophene-R groups] | 2-ethylhexyl |

TABLE 4-continued

| Number | —A— | R |
|---|---|---|
| Example 2-(50) | [structure] | — |

TABLE 5

| Number | —A— | R |
|---|---|---|
| Example 2-(51) | [structure] | [structure with n-C$_{10}$H$_{21}$, O, n-C$_{12}$H$_{25}$] |
| Example 2-(52) | [structure] | — |
| Example 2-(53) | [structure] | n-tridecyl |
| Example 2-(54) | [structure] | 2-octyldodecyl |

TABLE 5-continued

| Number | —A— | R |
|---|---|---|
| Example 2-(55) | (structure) | n-octyl |
| Example 2-(56) | (structure) | 2-ethylhexyl |
| Example 2-(57) | (structure) | 2-hexyldecyl |
| Example 2-(58) | (structure) | 2-octyldodecyl |
| Example 2-(59) | (structure) | n-octyl |
| Example 2-(60) | (structure) | 2-ethylhexyl |
| Example 2-(61) | (structure) | n-decyl |

TABLE 5-continued

| Number | —A— | R |
|---|---|---|
| Example 2-(62) | (structure) | n-heptadecyl |
| Example 2-(63) | (structure) | 2-octyldodecyl |
| Example 2-(64) | (structure) | n-octyl |
| Example 2-(65) | (structure) | 2-ethylhexyl |
| Example 2-(66) | (structure) | 2-hexyldecyl |

TABLE 5-continued

| Number | —A— | R |
|---|---|---|
| Example 2-(67) | [structure] | R = 2-octyldodecyl |
| Example 2-(68) | [structure] | n-octyl |
| Example 2-(69) | [structure] | 2-ethylhexyl |
| Example 2-(70) | [structure] | n-nonyl |

TABLE 6

| Number | —A— | R |
|---|---|---|
| Example 2-(71) | [structure] | n-decyl |
| Example 2-(72) | [structure] | n-undecyl |
| Example 2-(73) | [structure] | 2-dodecyltetradecyl |

TABLE 6-continued

| Number | —A— | R |
|---|---|---|
| Example 2-(74) | | 2-hexyldecyl |
| Example 2-(75) | | 2-hexyldecyl |
| Example 2-(76) | | 2-hexyldecyl |
| Example 2-(77) | | — |
| Example 2-(78) | | — |
| Example 2-(79) | | — |
| Example 2-(80) | | n-hexadecyl |
| Example 2-(81) | | ![R group with n-C10H21 and n-C12H25 chains connected via ether linkage] |

TABLE 6-continued

| Number | —A— | R |
|---|---|---|
| Example 2-(82) | | 2-butyloctyl |
| Example 2-(83) | | 3,7-bimethyloctyl |
| Example 2-(84) | | n-butyl |
| Example 2-(85) | | 2-hexyldecyl |
| Example 2-(86) | | 2-hexyldecyl |
| Example 2-(87) | | n-decyl |
| Example 2-(88) | | n-dodecyl |

TABLE 6-continued

| Number | —A— | R |
|---|---|---|
| Example 2-(89) | | n-dodecyl |
| Example 2-(90) | | 2-octyldodecyl |
| Example 2-(91) | | n-tetradecyl |
| Example 2-(92) | | ~~~(CH2)4-O-CH2-CH(n-C10H21)(n-C12H25) |

TABLE 7

| Number | —A— | R |
|---|---|---|
| Example 2-(93) | | — |
| Example 2-(94) | | n-hexadecyl |
| Example 2-(95) | | 2-butyloctyl |

TABLE 7-continued
| Number | —A— | R |
|---|---|---|
| Example 2-(96) | 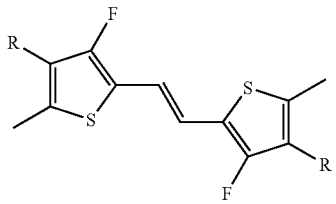 | 2-hexyldecyl |
| Example 2-(97) | 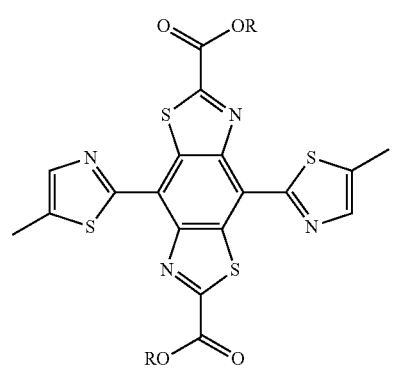 | n-hexadecyl |
| Example 2-(98) | 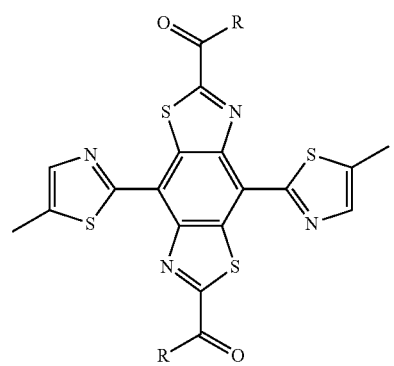 | n-hexadecyl |
| Example 2-(99) | 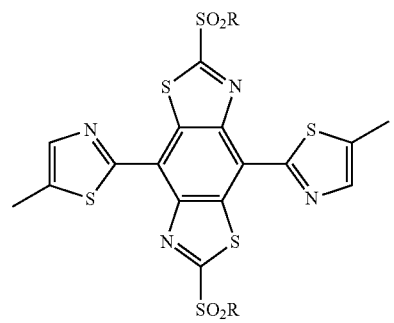 | n-hexadecyl |
| Example 2-(100) | 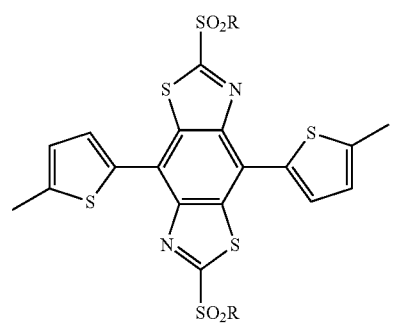 | n-hexadecyl |

TABLE 7-continued

| Number | —A— | R |
|---|---|---|
| Example 2-(101) | (benzobisthiazole core with 2,5-dimethylthiophene substituents and two -C(=O)OR groups) | n-hexadecyl |
| Example 2-(102) | (benzodithiophene core with 2-methylthiazole substituents and two -C(=O)OR groups) | n-hexadecyl |
| Example 2-(103) | (benzodithiophene core with 2-methylthiazole substituents and two -C(=O)R groups) | n-hexadecyl |
| Example 2-(104) | (benzodithiophene core with 5-methylthiazole substituents and two -SO$_2$R groups) | n-hexadecyl |

TABLE 7-continued

| Number | —A— | R |
|---|---|---|
| Example 2-(105) | (chemical structure) | n-hexadecyl |
| Example 2-(106) | (chemical structure) | — |
| Example 2-(107) | (chemical structure) | n-hexadecyl |
| Example 2-(108) | (chemical structure) | 2-octyldodecyl |
| Example 2-(109) | (chemical structure) | n-dodecyl |
| Example 2-(110) | (chemical structure) | 2-octyldodecyl |

TABLE 7-continued

| Number | —A— | R |
|---|---|---|
| Example 2-(111) | (structure shown) | 2-octyldodecyl |
| Example 2-(112) | (structure shown) | 2-octyldodecyl |
| Example 2-(113) | (structure shown) | 2-octyldodecyl |
| Example 2-(114) | (structure shown) | 2-octyldodecyl |

TABLE 7-continued

| Number | —A— | R |
|---|---|---|
| Example 2-(115) | (structure: benzodithiophene core with two 4-methylthiazol-2-yl substituents and two —C(=O)R acyl groups) | 2-octyldodecyl |
| Example 2-(116) | (structure: benzodithiophene core with two 2-methylthiazol-5-yl substituents and two —SO$_2$R groups) | 2-octyldodecyl |
| Example 2-(117) | (structure: benzodithiophene core with two 4-methylthiazol-2-yl substituents, two —SO$_2$R groups, and two F substituents) | 2-octyldodecyl |
| Example 2-(118) | (structure: benzobisthiadiazole core with two 5-methylthiophene substituents bearing R groups) | 2-octyldodecyl |

(Other Conjugated Linking Groups (-A-))
Specific examples of -A- other than that of Tables 1 to 7 are shown below.
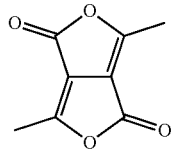
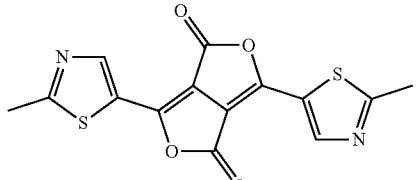
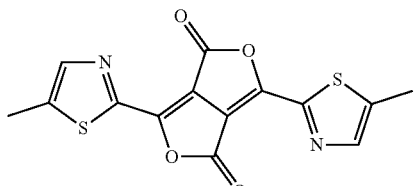
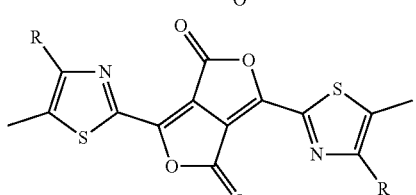
R = 2-octyldodecyl
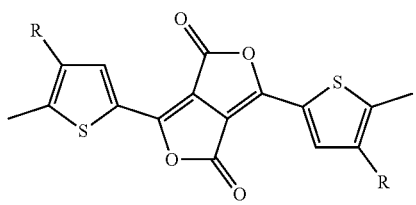
R = 2-octyldodecyl
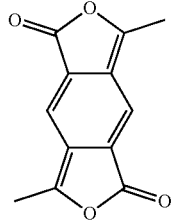
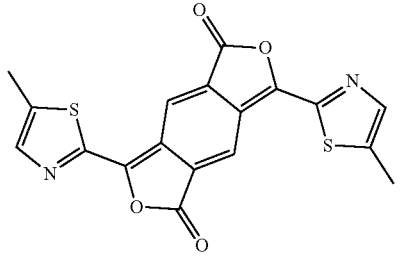
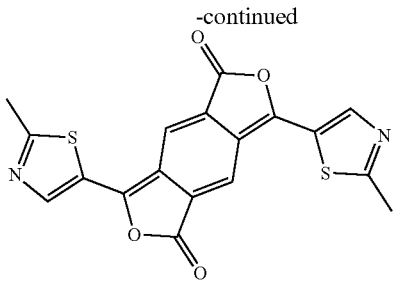
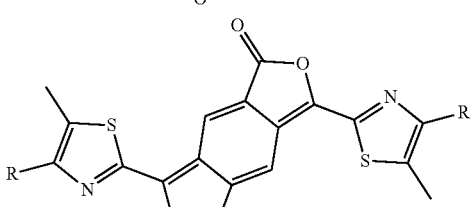
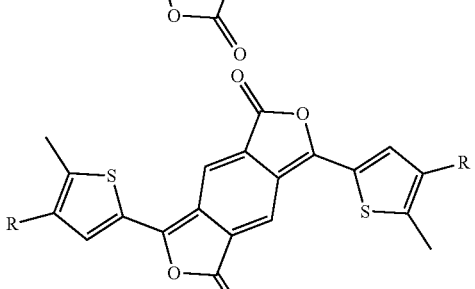
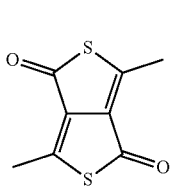
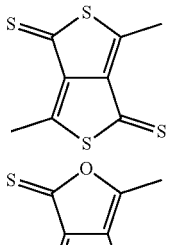
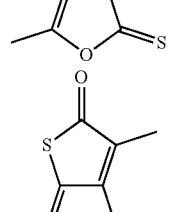
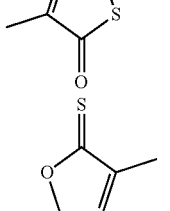
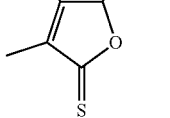

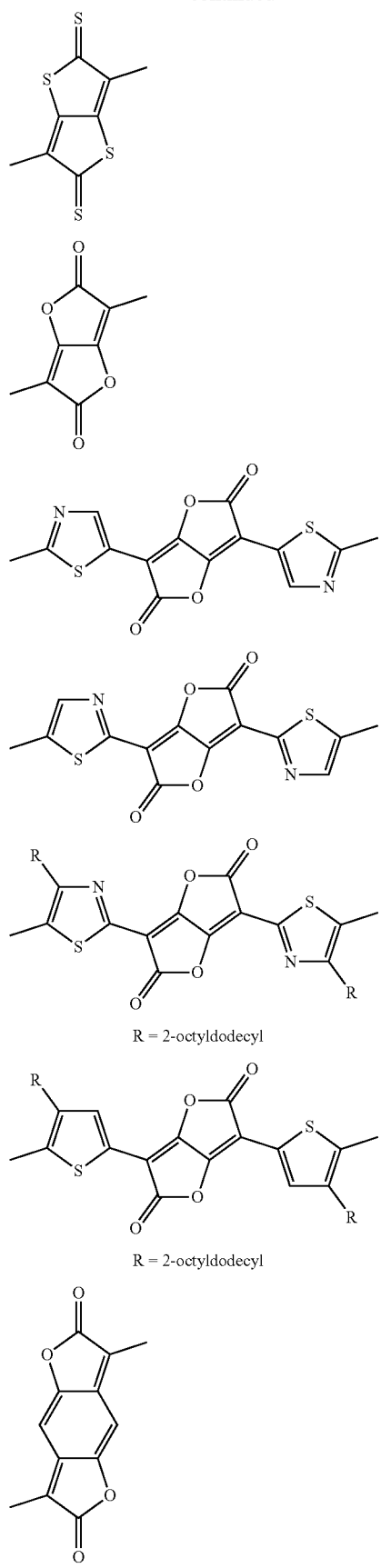
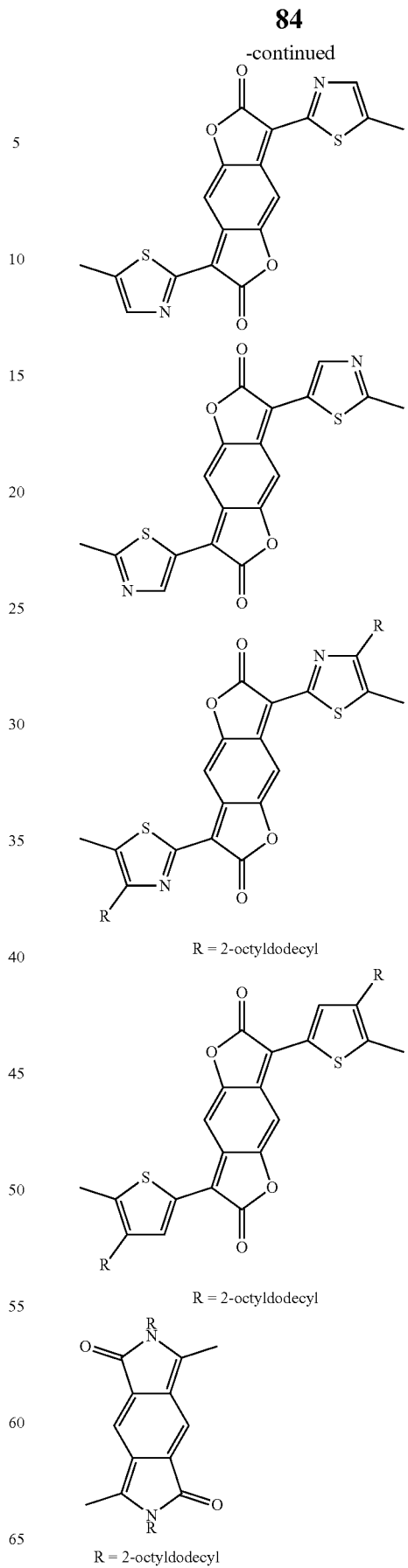

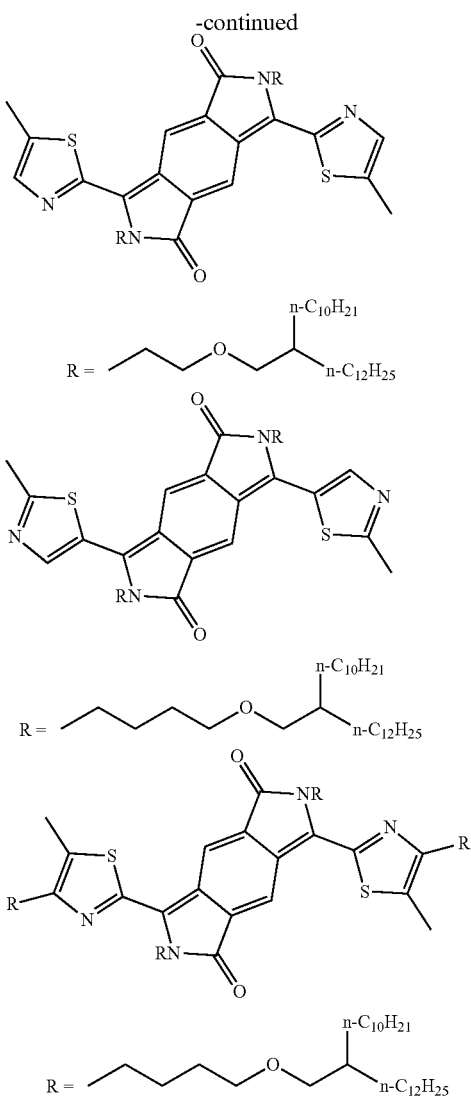

The specific polymer is preferably a polymer including a repeating unit represented by Formula (3).

<Repeating Unit Represented by Formula (3)>

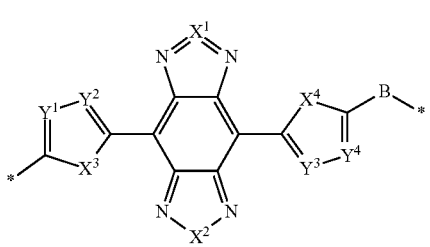

(3)

In Formula (3), $X^1$ represents a sulfur atom or a selenium atom, $X^2$ to $X^4$ each independently represent a sulfur atom, an oxygen atom, or a selenium atom, $Y^1$ to $Y^4$ each independently represent a group represented by —$CR^1$= or a nitrogen atom, where at least one of $Y^1$ to $Y^4$ represents a nitrogen atom, and $R^1$ represents a hydrogen atom or a substituent. B represents any of groups represented by Formula (O) to (R).

*-Le-*       (O)

*—(Ar)$_m$-Le-(Ar)$_m$—*       (P)

*—Zx-Le-Zx-*       (Q)

*—Zx-(Ar)$_m$-Le-(Ar)$_m$—Zx-*       (R)

In Formulae (O) to (R), Le represents a divalent linking group represented by Formula (LE).

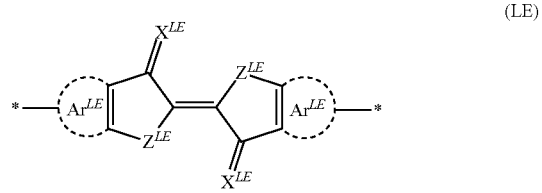

(LE)

In Formula (LE), $X^{LE}$'s each independently represent an oxygen atom or a sulfur atom, $Z^{LE}$'s each independently represent a sulfur atom, an oxygen atom, —$NR^{LE}$—, or a selenium atom, $R^{LE}$ represents a hydrogen atom or a substituent, $Ar^{LE}$'s each independently represent an aromatic ring which may be fused, and * represents a bonding position.

$X^{LE}$, $Z^{LE}$, $R^{LE}$, $Ar^{LE}$, and * in Formula (LE) are synonymous with $X^{L1}$, $Z^{L1}$, $R^{L1}$, $Ar^{L1}$, and * in Formula (L1) described above, respectively, and the suitable aspects thereof are also the same.

In Formulae (P) and (R), Ar represents a monocyclic aromatic ring group which may have a substituent. m represents an integer of 1 to 4.

Ar in Formulae (P) and (R) is synonymous with Ar in Formulae (B), (C), (E), (F), (G), (H), (J), and (L) described above, and the suitable aspect thereof is also the same.

In a case where the specific polymer is used as an n-type organic semiconductor compound, it is preferable that the monocyclic aromatic ring group represented by Ar includes at least one of —N= or —$CR^{Lc}$=.

In the monocyclic aromatic ring represented by Ar, it is preferable that each group of —N= and —$CR^{Lc}$=described above is included as an atom forming the ring.

The electron withdrawing group represented by $R^{Lc}$ is synonymous with the electron withdrawing group represented by $R^{Lc}$ in —$CR^{Lc}$=which is preferably included in the conjugated fused ring group represented by Lc described above, and the suitable aspect thereof is also the same.

In Formulae (P) and (R), m represents an integer of 1 to 4. Among these, m is preferably 1 or 2 and more preferably 1.

In Formulae (Q) and (R), Zx represents a monocyclic aromatic ring group which may have a substituent or a divalent conjugated linking group other than the divalent conjugated linking group represented by Formula (LE). That is, Zx represents a divalent conjugated linking group other than Le and Ar described above.

The divalent conjugated linking group represented by Zx is not particularly limited, but a vinylene group, an ethynylene group, —C=N—, a 1,3-cyclopentadienylene group, or an azo group is preferable, and a vinylene group or an ethynylene group is more preferable. The vinylene group and the 1,3-cyclopentadienylene group may further have a substituent. Examples of the substituent include the groups exemplified as the above-described substituent group Z.

In Formulae (P) and (R), a plurality of Ar's and a plurality of m's may be the same or different from each other, respectively.

From the viewpoint that the atmospheric stability of the organic thin film transistor to be formed is more excellent and/or viewpoint of ease of synthesis, the linking group represented by B is preferably a group represented by Formula (O) or Formula (P) and more preferably a group represented by Formula (O).

$X^1$ to $X^4$, $Y^1$ to $Y^4$, and * in Formula (3) are synonymous with $X^1$ to $X^4$, $Y^1$ to $Y^4$, and * in Formula (1), and the suitable aspects thereof are also the same.

[Method for Synthesizing Specific Polymer]

A method for synthesizing the specific polymer is not particularly limited, and examples thereof include a synthesizing method using a monomer represented by Formula (M1) or Formula (M2) as a starting raw material.

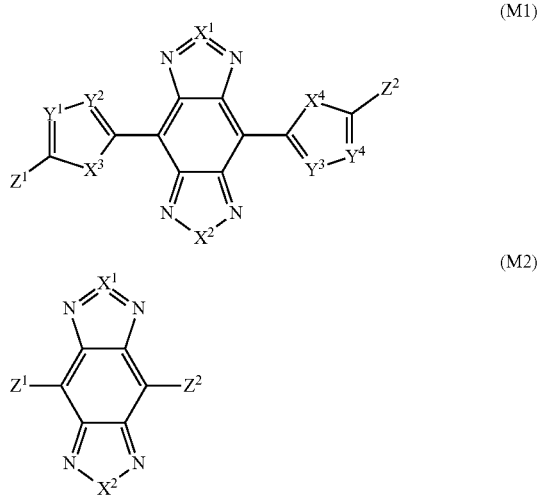

(M1)

(M2)

Hereinafter, the monomer represented by Formula (M1) will be described.

<Monomer Represented by Formula (M1)>

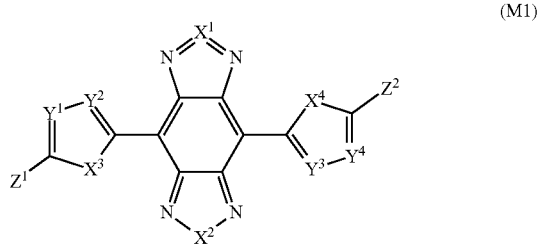

(M1)

$X^1$ to $X^4$, $Y^1$ to $Y^4$, and * in Formula (M1) are synonymous with $X^1$ to $X^4$, $Y^1$ to $Y^4$, and * in Formula (1) described above, and the suitable aspects thereof are also the same. However, at least one of $Y^1$ to $Y^4$ represents a nitrogen atom.

$Z^1$ and $Z^2$ each independently represent a hydrogen atom, a halogen atom, a perfluoroalkanesulfonyloxy group, a group represented by Formula (M1-1), a group represented by Formula (M1-2), a group represented by Formula (M1-3), or a group represented by Formula (M1-4).

*—$BR^{M1}_2$    Formula (M1-1):

*—$B^-R^{M2}_3X^+$    Formula (M1-2):

*—$SnR^{M3}_3$    Formula (M1-3):

*—$SiR^{M4}_3$    Formula (M1-4):

In Formula (M1-1), $R^{M1}$'s each independently represent a hydroxyl group or an alkoxy group, or two $R^{M1}$'s are bonded to each other to form a ring.

In Formula (M1-2), $R^{M2}$'s each independently represent a fluorine atom or an alkoxy group, or a plurality of $R^{M2}$'s are bonded to each other to form a ring. $X^+$ represents a potassium ion, a sodium ion, or a lithium ion.

In Formula (M1-3), $R^{M3}$'s each independently represent an alkyl group.

In Formula (M1-4), $R^{M4}$'s each independently represent a chlorine atom, a fluorine atom, or an alkyl group.

In Formula (M1), the suitable aspects of the combination of $X^1$ to $X^4$, $Y^1$ to $Y^4$, and the like are the same as the same combination in Formula (1) described above.

The number of carbon atoms in a fluoroalkane group of the perfluoroalkanesulfonyloxy group is preferably 1 to 10 and more preferably 1 to 5.

The alkoxy group represented by $R^{M1}$ and $R^{M2}$ is not particularly limited, but an alkoxy group having 1 to 10 carbon atoms is preferable and an alkoxy group having 1 to 5 carbon atoms is more preferable.

The alkyl group represented by $R^{M3}$ and $R^{M4}$ is not particularly limited, but an alkyl group having 1 to 10 carbon atoms is preferable and an alkyl group having 1 to 5 carbon atoms is more preferable.

An aspect in which the two $R^{M2}$'s are bonded to each other to form a ring is not particularly limited, and examples thereof include an aspect in which the two $R^{M2}$'s represent an alkoxy group and alkyl moieties in the two alkoxy groups are bonded to each other to form a ring structure.

An aspect in which the plurality of $R^{M2}$'s are bonded to each other to form a ring is not particularly limited, and examples thereof include an aspect in which two $R^{M2}$'s represent an alkoxy group and alkyl moieties in the two alkoxy groups are bonded to each other to form a ring structure, and an aspect in which three $R^{M2}$'s represent an alkoxy group and alkyl moieties in the three alkoxy groups are bonded to each other to form a ring structure.

Among these, $Z^1$ and $Z^2$ are preferably a hydrogen atom, a halogen atom, the group represented by Formula (M1-1), the group represented by Formula (M1-2), or the group represented by Formula (M1-3).

Hereinafter, specific examples of the monomer represented by Formula (M1) will be shown, but the monomer represented by Formula (M1) is not limited thereto.

In each structural formula of the following specific examples, $Z^1$ and $Z^2$ represent examples 3-(1) to 3-(34) in Table 8 shown in the latter part. In addition, R represents an alkyl group, an alkenyl group, or an alkynyl group exemplified in the substituent group Z.

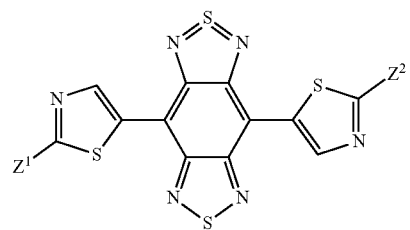

89
-continued
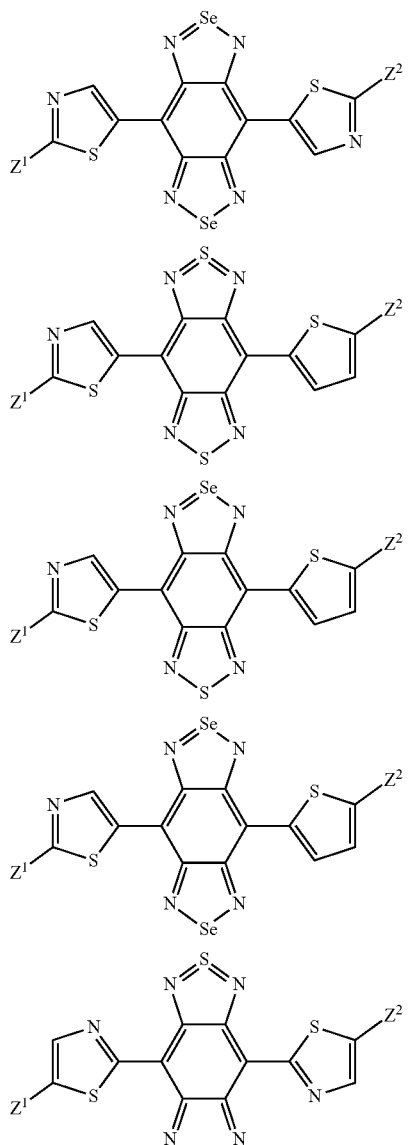
90
-continued
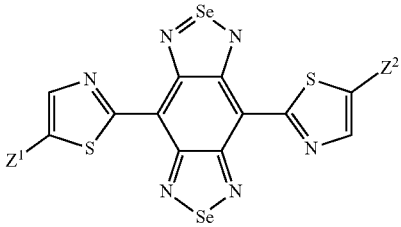
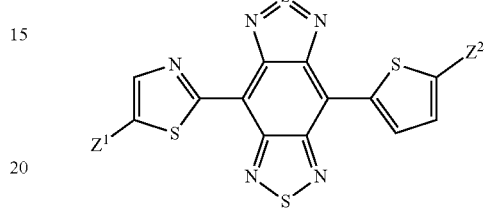
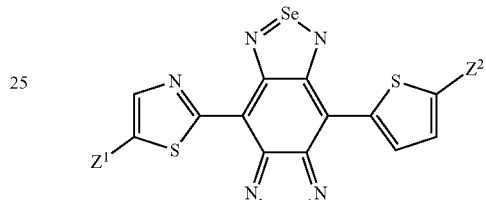
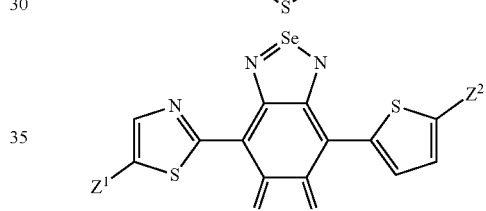
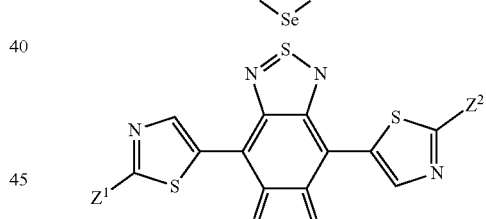
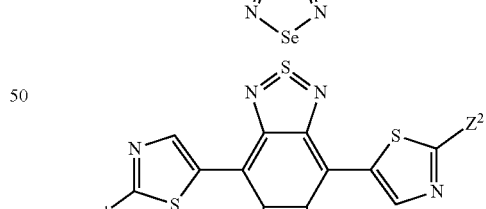
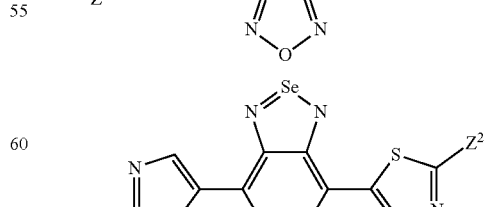

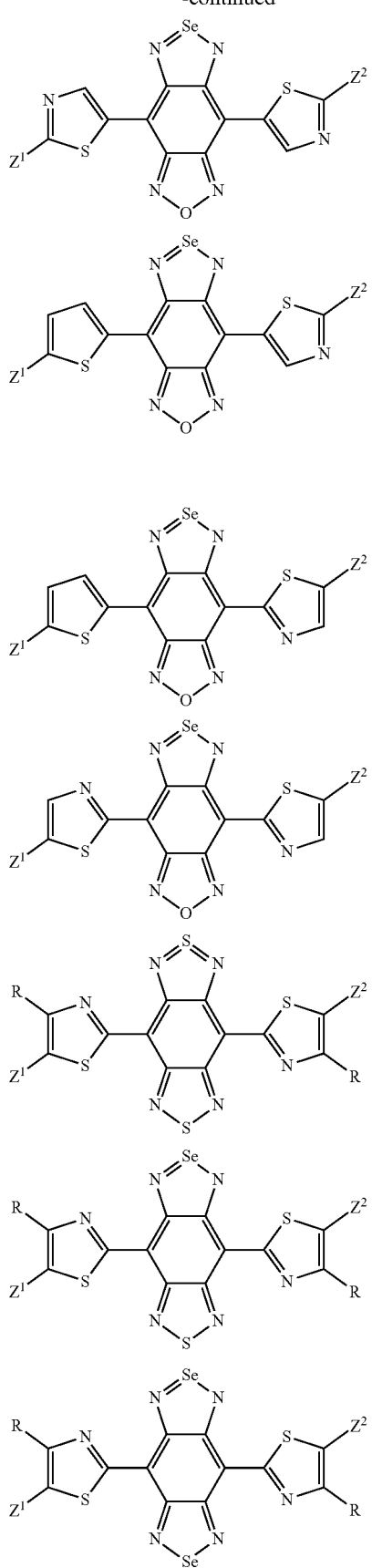

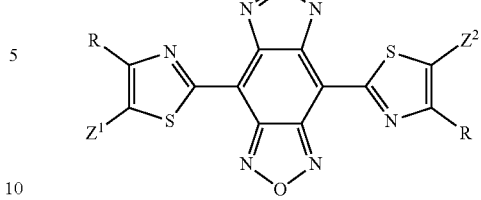

| Number | Z¹ | Z² |
|---|---|---|
| Example 3-(1) | H | H |
| Example 3-(2) | F | F |
| Example 3-(3) | Cl | Cl |
| Example 3-(4) | Br | Br |
| Example 3-(5) | I | I |
| Example 3-(6) | H | F |
| Example 3-(7) | H | Cl |
| Example 3-(8) | H | Br |
| Example 3-(9) | H | I |
| Example 3-(10) | —OSO$_2$CF$_3$ | —OSO$_2$CF$_3$ |
| Example 3-(11) | H | —OSO$_2$CF$_3$ |
| Example 3-(12) | —OSO$_2$C$_4$F$_9$ | —OSO$_2$C$_4$F$_9$ |
| Example 3-(13) | —SnMe$_3$ | —SnMe$_3$ |
| Example 3-(14) | —SnBu$_3$ | —SnBu$_3$ |
| Example 3-(15) | H | SnMe$_3$ |
| Example 3-(16) | H | —SnBu$_3$ |
| Example 3-(17) | —SiCl$_3$ | —SiCl$_3$ |
| Example 3-(18) | —SiF$_3$ | —SiF$_3$ |
| Example 3-(19) | —SiMe$_3$ | —SiMe$_3$ |
| Example 3-(20) | H | —SiCl$_3$ |
| Example 3-(21) | —B(OH)$_2$ | —B(OH)$_2$ |
| Example 3-(22) | (pinacol boronate) | (pinacol boronate) |
| Example 3-(23) | —BF$_3^-$K$^+$ | —BF$_3^-$K$^+$ |
| Example 3-(24) | —B(OBu)$_2$ | —B(OBu)$_2$ |
| Example 3-(25) | (1,3,2-dioxaborinane) | (1,3,2-dioxaborinane) |
| Example 3-(26) | (trioxaboraadamantane K$^+$) | (trioxaboraadamantane K$^+$) |
| Example 3-(27) | H | —B(OH)$_2$ |
| Example 3-(28) | H | (pinacol boronate) |
| Example 3-(29) | H | —BF$_3^-$K$^+$ |
| Example 3-(30) | H | —B(OBu)$_2$ |
| Example 3-(31) | H | (1,3,2-dioxaborinane) |

TABLE 8-continued

| Number | Z¹ | Z² |
|---|---|---|
| Example 3-(32) | H | ![B with O-linked cyclic structure with K⁺] |
| Example 3-(33) | H | —SiF₃ |
| Example 3-(34) | H | —SiMe₃ |

Next, the compound (M2) will be described.
<Compound (M2)>

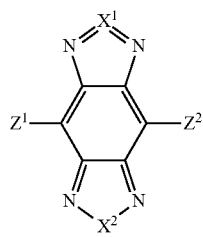

(M2)

$X^1$, $X^2$, $Z^1$, and $Z^2$ in Formula (M2) are synonymous with $X^1$, $X^2$, $Z^1$, and $Z^2$ in Formula (M1) described above, and the suitable aspects thereof are also the same.

A method for synthesizing the specific polymer using the monomer represented by Formula (M1) is not particularly limited, and a cross-coupling reaction in the presence of a transition metal catalyst can be adopted.

As a cross-coupling method in the presence of a transition metal catalyst, a known method such as Stille coupling reaction described in Chem. Rev., 2015, 115, pp. 3036 to 3140, Chem. Soc. Rev., 2015, 44, pp. 1113 to 1154, Journal of the Japan Rubber Association, Vol. 81, No. 10 (2008), and the like, Suzuki-Miyaura coupling reaction, and Hiyama coupling reaction can be adopted.

As a method for synthesizing the specific polymer using a monomer represented by Formula (M1) or (M2) in which both $Z^1$ and $Z^2$ are hydrogen atoms, for example, a known method described in Angewandte Chemie International Edition 2019, 58, pp. 11893 to 11902 and the like can be adopted.

In addition, a monomer represented by Formula (M1) or (M2) in which one of $Z^1$ and $Z^2$ is a hydrogen atom and the other is a group other than the hydrogen atom can be used for capping terminal reactive groups of the specific polymer synthesized by Stifle coupling reaction, Suzuki-Miyaura coupling reaction, Hiyama coupling reaction, and the like described above. As a result, it is possible to synthesize a specific polymer having no terminal reactive group or having very few terminal reactive groups.

[Organic Thin Film Transistor]

Hereinafter, an organic thin film transistor (hereinafter, also referred to as an "organic TFT") using the specific polymer will be described.

The organic TFT includes an organic semiconductor film described later. As a result, the organic TFT exhibits high carrier mobility and can effectively suppress a decrease over time even in the atmosphere, thereby driving stably. An ambient temperature or humidity in the atmosphere is not particularly limited as long as a temperature or humidity in the use environment of the organic TFT, and examples thereof include room temperature (20° C.) as a temperature and 10 to 90 RH % as a humidity.

The organic TFT is preferably used as an organic electric field effect transistor (FET) and more preferably used as an insulated gate type FET in which a gate and a channel are insulated.

A thickness of the organic TFT is not particularly limited, but in a case of a thinner transistor, for example, the thickness of the entire organic TFT is preferably 0.1 to 0.5 μm.

The organic TFT has an organic semiconductor film (also referred to as an organic semiconductor layer or a semiconductor active layer) including the specific polymer, and can further have a source electrode, a drain electrode, a gate electrode, and a gate insulating film.

It is preferable that the organic TFT has a gate electrode, an organic semiconductor film, a gate insulating film provided between the gate electrode and the organic semiconductor film, and a source electrode and a drain electrode which are provided in contact with the organic semiconductor film and are linked to each other through the organic semiconductor film, on a substrate. In the organic TFT, the organic semiconductor film and the gate insulating film are provided to be adjacent to each other.

A structure of the organic TFT is not particularly limited as long as the above-described respective layers are provided. For example, the organic TFT may have any structure of a bottom gate-bottom contact type, a top gate-bottom contact type, a bottom gate-top contact type, or a top gate-top contact type. The organic TFT is preferably a bottom gate type (bottom gate-bottom contact type or bottom gate-top contact type) in which the gate electrode is provided between the substrate and the organic semiconductor film, or a top gate-bottom contact type.

Hereinafter, an example of the organic TFT will be described with reference to the drawings.

Bottom Gate-Bottom Contact Type Organic TFT

FIG. 1 is a cross-sectional schematic view showing a structure of a bottom gate-bottom contact type organic TFT 10 which is an example of the organic TFT.

As illustrated in FIG. 1, the organic TFT 10 includes a substrate (base material) 1, a gate electrode 2, a gate insulating film 3, a source electrode 4A and a drain electrode 4B, an organic semiconductor film 5, and a sealing layer 6, in this order.

Hereinafter, the substrate (base material), the gate electrode, the gate insulating film, the source electrode, the drain electrode, the organic semiconductor film, the sealing layer, and a production method thereof will be described in detail.

(Substrate)

The substrate acts as supporting the gate electrode, the source electrode, the drain electrode, and other layers.

The type of the substrate is not particularly limited, and examples thereof include a plastic substrate, a silicon substrate, a glass substrate, and a ceramic substrate. Among these, from the viewpoint of applicability to each device and costs, a glass substrate or a plastic substrate is preferable.

A thickness of the substrate is not particularly limited. The upper limit of the thickness of the substrate is preferably 10 mm or less, more preferably 2 mm or less, and still more preferably 1.5 mm or less. The lower limit of the thickness of the substrate is preferably 0.01 mm or more and more preferably 0.05 mm or more.

Gate Electrode

As the gate electrode, a general electrode which is used as a gate electrode of the organic TFT can be applied without particular limitation.

A material (electrode material) for forming the gate electrode is not particularly limited, and examples thereof include metals including gold, silver, aluminum, copper, chromium, nickel, cobalt, titanium, platinum, magnesium, calcium, barium, and sodium; conductive oxides including $InO_2$, $SnO_2$, and indium tin oxide (ITO); conductive polymers including polyaniline, polypyrrole, polythiophene, polyacetylene, and polydiacetylene; semiconductors including silicon, germanium, and gallium arsenide; and carbon materials including fullerene, carbon nanotube, and graphite. Among these, the above-described metals are preferable, and silver or aluminum is more preferable.

A thickness of the gate electrode is not particularly limited, but is preferably 20 to 200 nm.

The gate electrode may function as the above-described substrate, and in this case, the above-described substrate may not be provided.

A method of forming the gate electrode is not particularly limited, and examples thereof include a method of performing vacuum deposition (hereinafter, simply referred to as "vapor deposition") or sputtering the above-described electrode material on the substrate, and a method of applying or printing a composition for forming an electrode, which includes the above-described electrode material, on the substrate. In addition, in a case of patterning the gate electrode, examples of a patterning method include printing methods including inkjet printing, screen printing, offset printing, and relief printing (flexographic printing), a photolithography method, and a mask vapor deposition method.

Gate Insulating Film

The gate insulating film is not particularly limited as long as the gate insulating film is a layer having insulating properties, and may be a single layer or a multilayer.

A material for forming the gate insulating film is not particularly limited, and examples thereof include polymers including polymethyl methacrylate, polystyrene, polyvinyl phenol, melamine resin, polyimide, polycarbonate, polyester, polyvinyl alcohol, polyvinyl acetate, polyurethane, polysulfone, polybenzoxazole, polysilsesquioxane, epoxy resin, and phenol resin; inorganic oxides including silicon dioxide, aluminum oxide, and titanium oxide; and nitrides including silicon nitride. Among these, from the viewpoint of compatibility with the organic semiconductor film, the above-described polymers are preferable, and from the viewpoint of uniformity of the film, the above-described inorganic oxides are preferable and silicon dioxide is more preferable.

These materials may be used singly, and two or more kinds thereof may be used in combination.

A film thickness of the gate insulating film is not particularly limited, but is preferably 100 to 1,000 nm.

A method of forming the gate insulating film is not particularly limited, and examples thereof include a method of applying a composition for forming a gate insulating film, which includes the above-described material, on the substrate on which the gate electrode has been formed, and a method of performing vapor deposition or sputtering the above-described material.

Source Electrode and Drain Electrode

In the organic TFT, the source electrode is an electrode in which a current flows from the outside through a wiring. In addition, the drain electrode is an electrode in which the current is sent to the outside through a wiring.

As materials for forming the source electrode and the drain electrode, the same materials as the electrode material for forming the above-described gate electrode can be used. Among them, metal is preferable, and gold or silver is more preferable.

Thicknesses of the source electrode and the drain electrode are not particularly limited, but are each preferably 1 nm or more and more preferably 10 nm or more. In addition, the upper limit of the thicknesses of the source electrode and the drain electrode is preferably 500 nm or less and more preferably 300 nm or less.

A distance (gate length L) between the source electrode and the drain electrode may be appropriately determined, but for example, the distance is preferably 200 μm or less and more preferably 100 μm or less. In addition, a gate width W may be appropriately determined, but is preferably 5000 μm or less and more preferably 1000 μm or less. A ratio of the gate width W to the gate length L is not particularly limited, but for example, the ratio W/L is preferably 10 or more and more preferably 20 or more.

A method of forming the source electrode and the drain electrode is not particularly limited, and examples thereof include a method of performing vacuum deposition or sputtering the electrode material on the substrate on which the gate electrode and the gate insulating film have been formed, and a method of applying or printing a composition for forming an electrode on the substrate. In a case of patterning the source electrode and the drain electrode, the patterning method is the same as the method of the gate electrode described above.

Organic Semiconductor Film

As the organic semiconductor film in the organic TFT, an organic semiconductor film including the specific polymer is used. The specific polymer included in the organic semiconductor film may be one kind or two or more kinds.

In a case where the organic semiconductor film includes the specific polymer, the carrier mobility of the organic semiconductor film can be improved, and the high carrier mobility can be maintained even in a case of being used or stored (left) in the atmosphere. The reason is not clear, but it is considered that the specific polymer of the present invention has strong electron withdrawing property and has deep energy levels in the highest occupied molecular orbital and lowest unoccupied molecular orbital.

A content of the specific polymer in the organic semiconductor film can be appropriately set without particular limitation. For example, the content of the specific polymer with respect to the total mass of the organic semiconductor film is preferably 10% by mass or more, more preferably 30% by mass or more, still more preferably 50% by mass or more. The upper limit thereof is not particularly limited, and the content of the specific polymer with respect to the total mass of the organic semiconductor film may be 100% by mass. In a case where the organic semiconductor film includes a binder polymer or other components, the upper limit of the content of the specific polymer with respect to the total mass of the organic semiconductor film is preferably 90% by mass or less and more preferably 80% by mass or less.

The organic semiconductor film may include the above-described binder polymer, in addition to the specific polymer. The binder polymer may be used singly, and two or more kinds thereof may be used in combination.

In the organic semiconductor film, a state of the specific polymer and the binder polymer is not particularly limited, but from the viewpoint of carrier mobility, it is preferable that the specific polymer and the binder polymer are phase-separated from each other along a film thickness direction.

A content of the binder polymer in the organic semiconductor film can be appropriately set without particular limitation. In a case where the organic semiconductor film includes a binder polymer, the content of the binder polymer with respect to the total mass of the organic semiconductor film is preferably 90% by mass or less and more preferably 70% by mass or less. The lower limit thereof is not particularly limited, and the content of the binder polymer with respect to the total mass of the organic semiconductor film may be 0% by mass or more, preferably 10% by mass or more, and more preferably 20% by mass or more.

The organic semiconductor film may include the above-described additive, in addition to the specific polymer. The additive may be used singly or in combination of two or more kinds thereof.

In a case where the organic semiconductor film includes an additive, the content of the additive with respect to the total mass of the organic semiconductor film is preferably 10% by mass or less, more preferably 5% by mass or less, and still more preferably 1% by mass or less.

A film thickness of the organic semiconductor film is appropriately determined depending on the organic TFT to be applied, but is preferably 10 to 500 nm, more preferably 20 to 200 nm.

A method for forming the organic semiconductor film is not particularly limited as long as the organic semiconductor film including the specific polymer can be formed, and among these, a solution process is preferable.

Examples of the solution process include a method of forming the organic semiconductor film using an organic semiconductor composition described later, which includes the specific polymer. The specific polymer is stable even in the atmosphere as described above. Therefore, the solution process can be performed in the atmosphere, and the organic semiconductor composition can be applied over a large area.

As a method for applying the organic semiconductor composition in the solution process, a usual method can be used. Examples thereof include coating methods including a drop casting method, a casting method, a dip coating method, a die coater method, a roll coater method, a bar coater method, and a spin coating method; various printing methods including an ink jet method, a screen printing method, a gravure printing method, a flexography printing method, an offset printing method, and a microcontact printing method; and a Langmuir-Blodgett (LB) method. Among these, a drop casting method, a casting method, a spin coating method, an ink jet method, a gravure printing method, a flexography printing method, an offset printing method, or a microcontact printing method is preferable.

In the solution process, it is preferable to dry the organic semiconductor composition applied to the substrate. The drying may be performed under normal pressure or reduced pressure. A temperature of the substrate during heat drying is preferably 20° C. to 200° C. and more preferably 50° C. to 150° C. A time for heat drying is preferably 0.1 to 20 hours and more preferably 0.2 to 10 hours.

A temperature of the substrate during drying under reduced pressure is preferably 20° C. to 100° C. and more preferably 40° C. to 80° C. A time for drying under reduced pressure is preferably 0.1 to 20 hours and more preferably 0.2 to 10 hours. A pressure during drying under reduced pressure is preferably $10^{-6}$ to $10^4$ Pa and more preferably $10^{-5}$ to $10^{-3}$ Pa.

The organic semiconductor composition dried as described above may be formed into a predetermined shape or a pattern shape as necessary.

Sealing Layer

Since the organic TFT provided with the above-described organic semiconductor film is stably driven even in the atmosphere, it is not necessary to seal the entire organic TFT and block either the atmosphere (oxygen gas) or moisture, but for the purpose of stable driving for a longer period of time, the entire organic TFT may be sealed with a metal sealing can, or a sealing layer may be formed using a sealing agent.

As the sealing layer, a sealing agent (composition for forming a sealing layer) generally used for the organic TFT can be used. Examples of the sealing agent include inorganic materials including glass and silicon nitride, polymer materials including parylene, and low molecular weight materials.

The sealing layer can be formed by a usual method such as coating and drying, using the above-described sealing agent.

A thickness of the sealing layer is not particularly limited, but is preferably 0.2 to 10 μm.

Bottom Gate-Top Contact Type Organic TFT

Figure 2:
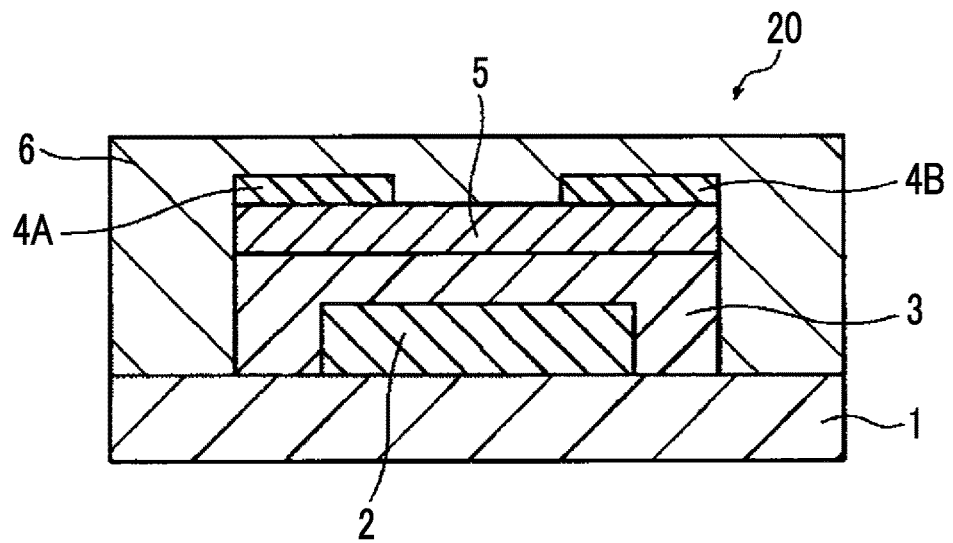
FIG. 2 is a cross-sectional schematic view showing a structure of a bottom gate-top contact type organic thin film transistor which is another example of the organic thin film transistor.

FIG. 2 is a cross-sectional schematic view showing a structure of a bottom gate-top contact type organic TFT 20 which is an example of the organic TFT.

As illustrated in FIG. 2, the organic TFT 20 includes a substrate 1, a gate electrode 2, a gate insulating film 3, an organic semiconductor film 5, a source electrode 4A and a drain electrode 4B, and a sealing layer 6, in this order.

The organic TFT 20 is the same as the organic TFT 10, except that a layer configuration (lamination aspect) is different. Accordingly, the substrate, the gate electrode, the gate insulating film, the source electrode, the drain electrode, the organic semiconductor film, and the sealing layer are the same as those of the bottom gate-bottom contact type organic TFT, and thus descriptions thereof are omitted.

Use of Organic TFT

The above-described organic TFT is not particularly limited in its use, and can be used for, for example, electronic paper, display devices, sensors, and electronic tags.

Polymer

The polymer according to an embodiment of the present invention corresponds to the above-described specific polymer.

Specific aspects of the specific polymer are as described above.

The specific polymer is used as a material for forming an organic semiconductor film included in electronic devices such as an organic thin film transistor.

Examples of such a device include an organic thin film transistor which controls the amount of current or the amount of voltage, an organic photoelectric conversion element which converts light energy into electric power (for example, a solid-state imaging element for light sensors, a solar cell for energy conversion, and the like), an organic light emitting diode (OLED), a phototransistor, an organic light emitting transistor (OLET), an organic thermoelectric conversion element which converts thermal energy into electric power, an organic electroluminescence element, a (gas) sensor, an organic rectifying element, an organic inverter, and an information recording element.

Compound (Monomer)

The compound (monomer) according to an embodiment of the present invention corresponds to the monomer represented by Formula (M1) or Formula (M2) described above.

Specific aspects of the monomers represented by Formula (M1) and Formula (M2) are as described above.

The monomers represented by Formula (M1) and Formula (M2) can be suitably used for the synthesis of the specific polymer described above.

Composition

The composition according to an embodiment of the present invention includes the above-described specific polymer and a solvent.

The use of the composition according to the embodiment of the present invention is not particularly limited, but the composition according to the embodiment of the present invention can be suitably used as a composition for forming an organic thin film transistor (hereinafter, also referred to as an "organic semiconductor composition") used for forming an organic semiconductor film in an organic thin film transistor.

Hereinafter, the composition according to the embodiment of the present invention will be described by taking as an example a case where the composition according to the embodiment of the present invention is an organic semiconductor composition.

Composition for Forming Organic Thin Film Transistor (Organic Semiconductor Composition)

The specific polymer included in the organic semiconductor composition is as described above, and may be used alone or in combination of two or more thereof.

A content of the specific polymer in the organic semiconductor composition can be expressed by the content in a solid content excluding the solvent described later, and for example, it is preferable that the content of the specific polymer with respect to the total mass of the solid content in the organic semiconductor composition is included in a suitable range of the content of the specific polymer with respect to the total mass of the organic semiconductor film described later.

Binder Polymer

The organic semiconductor composition may include a binder polymer. From the viewpoint that an organic semiconductor film having high film quality can be obtained, the organic semiconductor composition preferably includes a binder polymer.

The type of the binder polymer is not particularly limited, and a known binder polymer can be used. Examples of the binder polymer include insulating polymers including polystyrene, poly(α-methylstyrene), polycarbonate, polyarylate, polyester, polyamide, polyimide, polyurethane, polysiloxane, polysulfone, polymethyl methacrylate, polymethyl acrylate, cellulose, polyethylene, and polypropylene, and copolymers thereof.

In addition to these, examples thereof include rubbers including an ethylene-propylene rubber, an acrylonitrile-butadiene rubber, a hydrogenated nitrile rubber, a fluororubber, a perfluoro elastomer, a tetrafluoroethylene-propylene copolymer, an ethylene-propylene-diene copolymer, a styrene-butadiene rubber, polychloroprene, polyneoprene, a butyl rubber, a methylphenyl silicone resin, a methylphenylvinyl silicone resin, a methylvinyl silicone resin, a fluorosilicone resin, an acryl rubber, an ethylene acryl rubber, chlorosulfonated polyethylene, chloropolyethylene, an epichlorohydrin copolymer, a polyisoprene-natural rubber copolymer, a polyisoprene rubber, a styrene-isoprene block copolymer, a polyester-urethane copolymer, a polyetherurethane copolymer, a polyether ester thermoplastic elastomer, and a polybutadiene rubber, and thermoplastic elastomer polymers.

Furthermore, examples thereof include a photoconductive polymer including polyvinylcarbazole and polysilane, a conductive polymer including polythiophene, polypyrrole, polyaniline, and poly p-phenylenevinylene, and a semiconductive polymer described in Chemistry of Materials, 2014, 26, p. 647.

In consideration of charge mobility, it is preferable that the binder polymer has a structure not including a polar group. Here, the polar group refers to a functional group having a heteroatom other than carbon atoms and hydrogen atoms. In order to have a structure not including a polar group, polystyrene or poly(α-methylstyrene) is preferable as the binder polymer. In addition, a semiconductive polymer is also preferable.

A glass transition temperature of the binder polymer is not particularly limited, and is appropriately set according to the use. For example, in a case of imparting firm mechanical strength to the organic semiconductor film, it is preferable that the glass transition temperature is set to be high. On the other hand, in a case of imparting flexibility to the organic semiconductor film, it is preferable that the glass transition temperature is set to be low.

The binder polymer may be used singly, and two or more kinds thereof may be used in combination.

A content of the binder polymer in the organic semiconductor composition is not particularly limited, but from the viewpoint that the carrier mobility and durability of the organic semiconductor film in the organic thin film transistor are further improved, it is preferable that the content of the binder polymer with respect to the total mass of the solid content in the organic semiconductor composition is included in a suitable range of the content of the binder polymer with respect to the total mass of the organic semiconductor film described later.

A weight-average molecular weight of the binder polymer is not particularly limited, and is preferably 1,000 to 10,000,000, more preferably 3,000 to 5,000,000, and still more preferably 5,000 to 3,000,000. The weight-average molecular weight of the binder polymer can be obtained by gel permeation chromatography (GPC).

In the organic semiconductor composition, the specific polymer may be uniformly mixed with the binder polymer, or a part or all of the specific polymer may be phase-separated from the binder polymer. From the viewpoint of ease of application or uniformity of application, it is preferable that the specific polymer and the binder polymer are uniformly mixed at least in a case of application.

Solvent

The organic semiconductor composition may include a solvent, and from the viewpoint of improving coatability thereof, the organic semiconductor composition preferably includes a solvent. Such a solvent is not particularly limited as long as the solvent dissolves or disperses the above-described compounds, examples thereof include an inorganic solvent and an organic solvent, and an organic solvent is preferable. The solvent may be used singly, and two or more kinds thereof may be used in combination.

The organic solvent is not particularly limited, and examples thereof include hydrocarbon solvents including hexane, octane, decane, toluene, xylene, mesitylene, ethylbenzene, diethylbenzene, amylbenzene, decalin, 1-methylnaphthalene, 1-ethylnaphthalene, 1,6-dimethylnaphtalene, and tetralin; ketone solvents including acetone, methyl ethyl ketone, methyl isobutyl ketone, cyclohexanone, acetophenone, propiophenone, isophorone, and butyrophenone; halogenated hydrocarbon solvents including dichloromethane, chloroform, tetrachloromethane, dichloroethane, trichloroethane, tetrachloroethane, chlorobenzene, 1,2-dichlorobenzene, trifluoromethylbenzene, 1,2,4-trichlorobenzene, chlorotoluene, 1-chloronaphthalene, and 1-fluoronaphthalene; heterocyclic solvents including pyridine, picoline, quinoline, thiophene, 3-butylthiophene, and thieno[2,3-b]thiophene; halogenated heterocyclic solvents including 2-chlorothiophene, 3-chlorothiophene, 2,5-dichlorothiophene, 3,4-dichlorothiophene, 2-bromothiophene, 3-bromothiophene, 2,3-dibromothiophene, 2,4-dibromothiophene, 2,5-dibromothiophene, 3,4-dibromothiophene, and 3,4-dichloro-1,2, 5-thiadiawle; ester solvents including ethyl acetate, butyl acetate, amyl acetate, 2-ethylhexyl acetate, γ-butyrolactone, and phenyl acetate; alcohol solvents such as methanol, propanol, butanol, pentanol, hexanol, cyclohexanol, butoxyethanol, methyl cellosolve, ethyl cellosolve, ethylene glycol, diethylene glycol, and glycerin; ether solvents including dibutyl ether, tetrahydrofuran, dioxane, dimethoxyethane, anisole, ethoxybenzene, dimethoxybenzene, propoxybenzene, isopropoxybenzene, butoxybenzene, 2-methylanisole, 3-methylanisole, 4-methylanisole, 4-ethylanisole, dimethylanisole (any one of 2,3-, 2,4-, 2,5-, 2,6-, 3,4-, 3,5-, or 3,6-), and 1,4-benzodioxane; amide or imide solvents including N,N-dimethylformamide, N,N-dimethylacetamide, 1-methyl-2-pyrrolidone, 1-methyl-2-imidazolidinone, and 1,3-dimethyl-2-imidazolidinone; sulfoxide solvents including dimethyl sulfoxide; phosphoric acid ester solvents including trimethyl phosphoric acid; nitrile solvents including acetonitrile, propyronitrile, benzonitrile; and nitro solvents including nitromethane and nitrobenzene.

Among these, a hydrocarbon solvent, a ketone solvent, a halogenated hydrocarbon solvent, a heterocyclic solvent, a halogenated heterocyclic solvent, or an ether solvent is preferable; toluene, xylene, mesitylene, amylbenzene, tetralin, acetophenone, propiophenone, butyrophenone, isophorone, dichlorobenzene, anisole, ethoxybenzene, propoxybenzene, isopropoxybenzene, butoxybenzene, dimethoxybenzene, chlorobenzene, dichlorobenzene, diethylbenzene, 2-methylanisole, 3-methylanisole, 4-methylanisole, 1-methylnaphthalene, 1-fluoronaphthalene, 1-chloronaphthalene, 3-chlorothiophene, or 2,5-dibromothiophene is more preferable; and toluene, xylene, tetralin, acetophenone, propiophenone, butyrophenone, isophorone, anisole, ethoxybenzene, propoxybenzene, butoxybenzene, 2-methylanisole, 3-methylanisole, 4-methylanisole, 1-fluoronaphthalene, 1-chloronaphthalene, 3-chlorothiophene, or 2,5-dibromothiophene is still more preferable.

From the viewpoint of film quality, the solvent included in the organic semiconductor composition is preferably a solvent having a boiling point of 100° C. or higher.

Examples of the solvent having a boiling point of 100° C. or higher include toluene, xylene, diethylbenzene, mesitylene, tetralin, acetophenone, propiophenone, butyrophenone, isophorone, chlorobenzene, dichlorobenzene, 1,2,4-trichlorobenzene, chlorotoluene, anisole, dimethoxybenzene, ethoxybenzene, propoxybenzene, isopropoxybenzene, butoxybenzene, 2-methylanisole, 3-methylanisole, 1-methylnaphthalene, 1-fluoronaphthalene, 1-chloronaphthalene, and 4-methylanisole. Among these, toluene, xylene, mesitylene, diethylbenzene, chlorobenzene, dichlorobenzene, tetralin, acetophenone, propiophenone, butyrophenone, isophorone, anisole, dimethoxybenzene, ethoxybenzene, propoxybenzene, butoxybenzene, 2-methylanisole, 3-methylanisole, 1-methylnaphthalene, 1-fluoronaphthalene, 1-chloronaphthalene, or 4-methylanisole is more preferable.

In addition, from the viewpoint of environmental load and toxicity to humans, a non-halogen solvent (solvent having no halogen atom in the molecule) is preferable as the solvent having a boiling point of 100° C. or higher.

In a case where the organic semiconductor composition includes a solvent, a content of the solvent is preferably 90% to 99.99% by mass, more preferably 95% to 99.98% by mass, and still more preferably 96% to 99.98% by mass with respect to the total mass of the organic semiconductor composition.

Other Components

The organic semiconductor composition may include a component other than the specific polymer, the binder polymer, and the solvent. Examples of such a component include various additives.

As the additive, an additive usually used in the organic semiconductor composition can be used, and more specific examples thereof include a surfactant, an antioxidant, a crystallization control agent, and a crystal orientation control agent. As the surfactant and the antioxidant, paragraphs 0136 and 0137 of JP2015-195362A can be incorporated, and the contents thereof are incorporated in the present specification.

A content of the additive in the organic semiconductor composition is not particularly limited, but from the viewpoint that the organic semiconductor composition has excellent film forming property, and the carrier mobility and heat resistance are further improved, it is preferable that the content of the additive with respect to the total mass of the solid content in the organic semiconductor composition is included in a suitable range of the content of the additive with respect to the total mass of the organic semiconductor film described later.

From the viewpoint of high water resistance, a viscosity of the organic semiconductor composition is preferably 10 mPa·s or more.

Preparation Method

A method of preparing the organic semiconductor composition is not particularly limited, and a usual preparation method can be adopted. For example, it is possible to prepare the organic semiconductor composition by adding

103 respective components in a predetermined amount to an organic solvent and stirring the mixture appropriately.

The respective components can be heated during or after stirring as necessary. A heating temperature is not particularly limited, and is determined, for example, in a range of 40° C. to 200° C. In a case of using the solvent, the heating temperature is determined to be a temperature in the above-described range and lower than a boiling point of the solvent.

Organic Semiconductor Film

The organic semiconductor film according to an embodiment of the present invention includes the above-described specific polymer.

The organic semiconductor film including the specific polymer is used as an organic semiconductor film included in electronic devices such as an organic thin film transistor.

Examples of such a device include an organic thin film transistor which controls the amount of current or the amount of voltage, an organic photoelectric conversion element which converts light energy into electric power (for example, a solid-state imaging element for light sensors, a solar cell for energy conversion, and the like), an organic thermoelectric conversion element which converts thermal energy into electric power, an organic electroluminescence element, an organic light emitting transistor (OLET), a phototransistor, a (gas) sensor, an organic rectifying element, an organic inverter, and an information recording element.

The organic thin film transistor including the organic semiconductor film according to the embodiment of the present invention is as described above.

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention.

Therefore, the scope of the present invention should not be restrictively interpreted by the following Examples.

Synthesis Example

Monomer Synthesis

Synthesis of Monomer (M1)

A monomer (M1) was synthesized according to the following procedure.

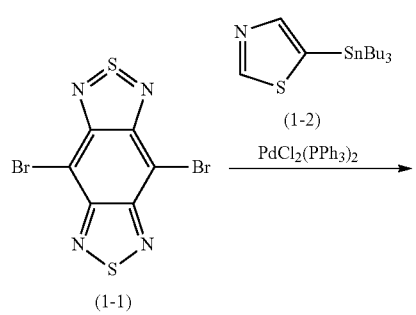

104

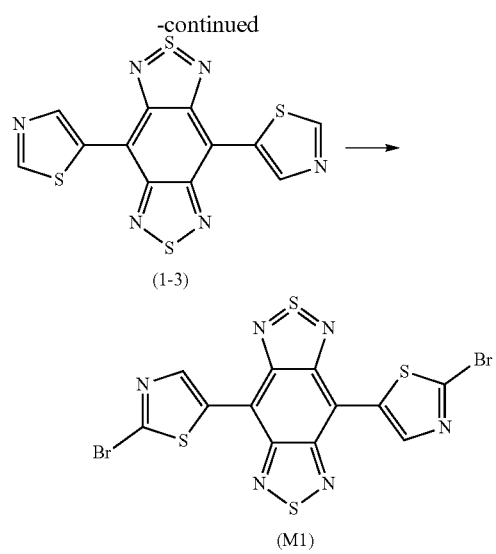

Synthesis of Compound (1-3)

1.06 g (3.00 mmol) of a compound (1-1), 3.36 g (9.00 mmol) of a compound (1-2), 525 mg (0.75 mmol) of dichlorobis(triphenylphosphine)palladium, and 30 mL of toluene were charged into a glass reaction container, and the mixture was reacted at 110° C. for 8 hours under a nitrogen atmosphere. After allowing to cool to room temperature, 150 mL of methanol was added thereto, and the precipitated solid was collected by filtration. The obtained solid was purified by silica gel column chromatography to obtain 336 mg (0.930 mmol) of a compound (1-3).

Synthesis of Monomer (M1)

5 mL of a tetrahydrofuran solution of lithium diisopropylamide (2.08 mmol) in a glass reaction container was cooled to −78° C., and a tetrahydrofuran solution of 300 mg (0.831 mmol) of the compound (1-3) was added dropwise thereto. After stirring at −78° C. for 30 minutes, 828 mg (2.49 mmol) of carbon tetrabromide was added thereto, and after stirring for 10 minutes, the temperature was raised to room temperature and the reaction was performed for 1 hour. 90 mL of methanol was added thereto, and the precipitated solid was collected by filtration. The obtained solid was purified by silica gel column chromatography to obtain 227 mg (0.438 mmol) of a monomer (M1).

Synthesis of Monomer (M2)

A monomer (M2) was synthesized according to the following procedure.

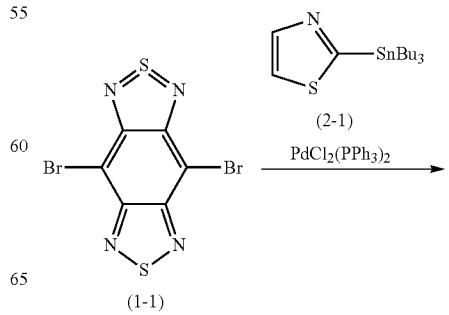

Synthesis of Compound (2-2)

315 mg (0.873 mmol) of a compound (2-2) was obtained by the same method as the method for synthesizing the compound (1-3), except that the compound (1-2) was replaced with a compound (2-1).

(Synthesis of Monomer (M2))

300 mg (0.831 mmol) of the compound (2-2), 592 mg (3.33 mmol) of N-bromosuccinimide, 15 mL of 1,1,2-trichloroethane, and 3 mL of NN-dimethylformamide were charged into a glass reaction container, and the mixture was reacted at 80° C. for 6 hours under a nitrogen atmosphere. After allowing to cool to room temperature, 75 mL of methanol was added thereto, and the precipitated solid was collected by filtration. The obtained solid was purified by silica gel column chromatography to obtain 264 mg (0.510 mmol) of a monomer (M2).

Synthesis of Monomer (M3)

A monomer (M3) was synthesized according to the following procedure.

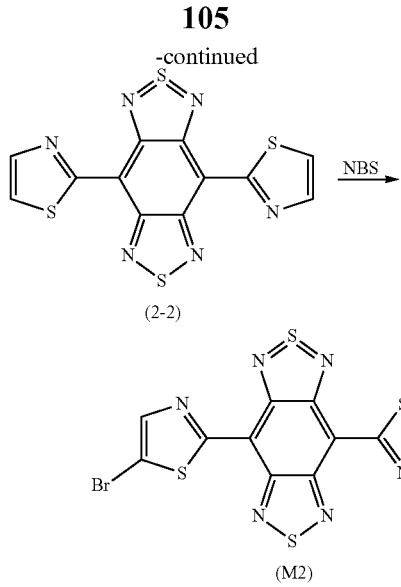

Synthesis of Compound (3-2)

2.00 g (5.21 mmol) of a compound (3-1), 4.86 g (13.0 mmol) of the compound (1-2), 634 mg (2.08 mmol) of o-tolylphosphine, 539 mg (0.521 mmol) of a tris(dibenzylideneacetone)dipalladium(0)-chloroform adduct, and 100 mL of tetrahydrofuran were charged into a glass reaction container, and the mixture was heated and refluxed for 12 hours under a nitrogen atmosphere. After allowing to cool to room temperature, the solvent was distilled off under reduced pressure, and the concentrate was purified by silica gel column chromatography to obtain 1.45 g (3.70 mmol) of a compound (3-2).

Synthesis of Compound (3-3)

1.40 g (3.57 mmol) of the compound (3-2), 4.67 g (71.4 mmol) of zinc powder, and 30 mL of acetic acid were charged into a glass reaction container, and the mixture was stirred at 60° C. for 3 hours. After allowing to cool to room temperature, the solvent was distilled off under reduced pressure, and the concentrate was purified by silica gel column chromatography to obtain 469 mg (1.54 mmol) of a compound (3-3).

(Synthesis of Compound (3-4))

460 mg (1.51 mmol) of the compound (3-3), 419 mg (3.78 mmol) of selenium dioxide, and 25 mL of ethanol were charged into a glass reaction container, and the mixture was stirred at 60° C. for 24 hours. After allowing to cool to room temperature, the solvent was concentrated under reduced pressure, and the concentrate was purified by silica gel column chromatography to obtain 447 mg (0.983 mmol) of a compound (3-4).

Synthesis of Monomer (M3)

A monomer (M3) was synthesized by the same method as the method for synthesizing the monomer (M1), except that the compound (1-3) was replaced with the compound (3-4).

Synthesis of Monomer (M4)

A monomer (M4) was synthesized according to the following procedure.

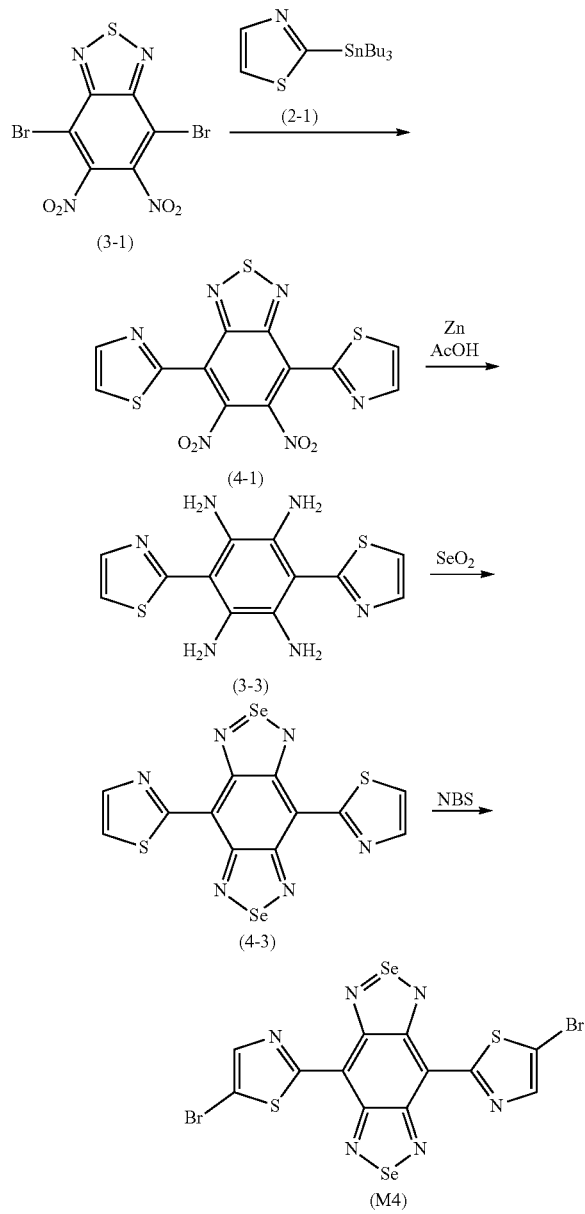

Synthesis of Compound (4-1)

A compound (4-1) was obtained by the same method as the method for synthesizing the compound (3-2), except that the compound (1-2) was replaced with the compound (2-1).

Synthesis of Compound (4-2)

A compound (4-2) was obtained by the same method as the method for synthesizing the compound (3-3), except that the compound (3-2) was replaced with the compound (4-1).

Synthesis of Compound (4-3)

A compound (4-3) was obtained by the same method as the method for synthesizing the compound (3-4), except that the compound (3-3) was replaced with the compound (4-2).

Synthesis of Monomer (M4)

A monomer (M4) was obtained by the same method as the method for synthesizing the monomer (M2), except that the compound (2-2) was replaced with the compound (4-3).

Synthesis of Monomer (M5)

A monomer (M5) was synthesized according to the following procedure.

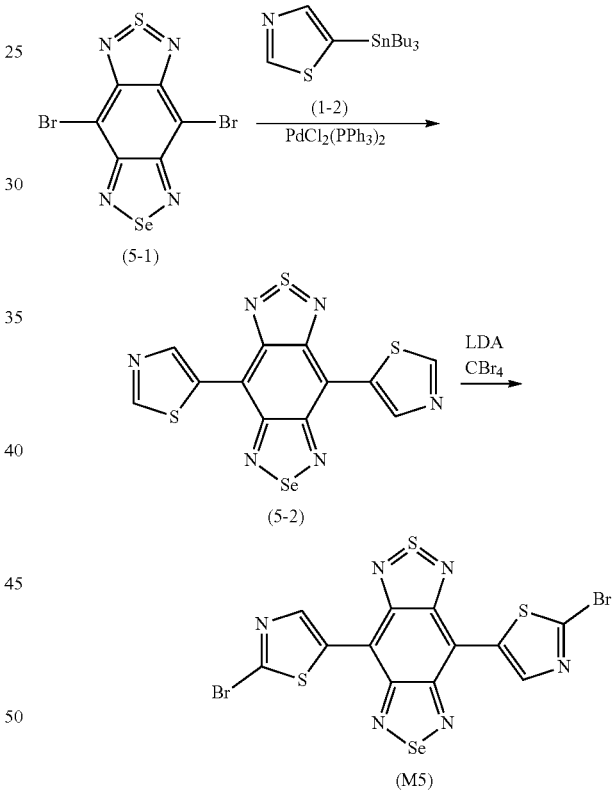

Synthesis of Compound (5-2)

A compound (5-2) was obtained by the same method as the method for synthesizing the compound (1-3), except that the compound (1-1) was replaced with a compound (5-1) synthesized according to Tetrahedron 1997, vol. 53, No. 29, pp. 10169 to 10178.

Synthesis of Monomer (M5)

A monomer (M5) was obtained by the same method as the method for synthesizing the monomer (M1), except that the compound (1-3) was replaced with the compound (5-2).

Synthesis of Monomer (M6)

A monomer (M6) was synthesized according to the following procedure.

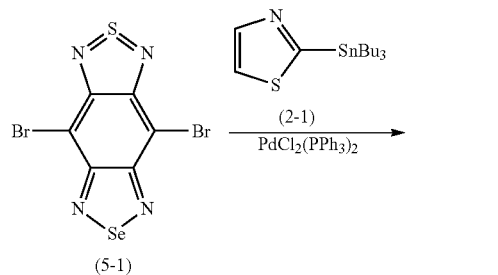

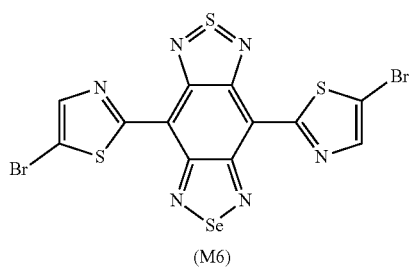

Synthesis of Compound (6-1)

A compound (6-1) was synthesized by the same method as the method for synthesizing the compound (5-2), except that the compound (1-2) was replaced with the compound (2-1).

Synthesis of Monomer (M6)

A monomer (M6) was synthesized by the same method as the method for synthesizing the monomer (M2), except that the compound (2-2) was replaced with the compound (6-1).

Synthesis of Monomer (M7)

A monomer (M7) was synthesized according to the following procedure.

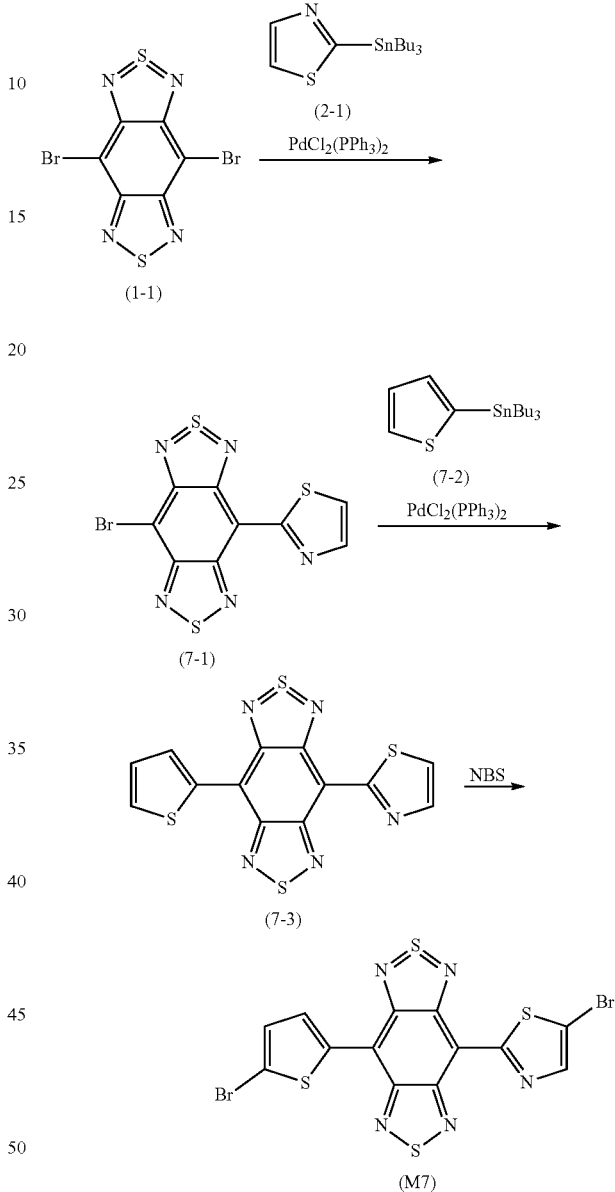

Synthesis of Compound (7-1)

3.52 g (10.0 mmol) of the compound (1-1), 1.50 g (4.00 mmol) of the compound (2-1), 525 mg (0.75 mmol) of dichlorobis(triphenylphosphine)palladium, and 50 mL of toluene were charged into a glass reaction container, and the mixture was reacted at 110° C. for 8 hours under a nitrogen atmosphere. After allowing to cool to room temperature, 150 mL of methanol was added thereto, and the precipitated solid was collected by filtration. The obtained solid was purified by silica gel column chromatography to obtain 427 mg (1.20 mmol) of a compound (7-1).

Synthesis of Compound (7-3)

400 mg (1.12 mmol) of the compound (7-1), 836 mg (2.24 mmol) of a compound (7-2), 98.3 mg (0.14 mmol) of dichlorobis(triphenylphosphine)palladium, and 20 mL of toluene were charged into a glass reaction container, and the mixture was reacted at 110° C. for 8 hours under a nitrogen atmosphere. After allowing to cool to room temperature, 150 mL of methanol was added thereto, and the precipitated solid was collected by filtration. The obtained solid was purified by silica gel column chromatography to obtain 238 mg (0.661 mmol) of a compound (7-3).

Synthesis of Monomer (M7)

230 mg (0.640 mmol) of the compound (7-3), 251 mg (1.41 mmol) of N-bromosuccinimide, 15 mL of 1,1,2-trichloroethane, and 3 mL of NN-dimethylformamide were charged into a glass reaction container, and under a nitrogen atmosphere, the mixture was reacted at room temperature for 1 hour and at 80° C. for 6 hours. After allowing to cool to room temperature, 75 mL of methanol was added thereto, and the precipitated solid was collected by filtration. The obtained solid was purified by silica gel column chromatography to obtain 199 mg (0.384 mmol) of a monomer (M7).

Synthesis of Monomer (M8)

A monomer (M8) was synthesized according to the following procedure.

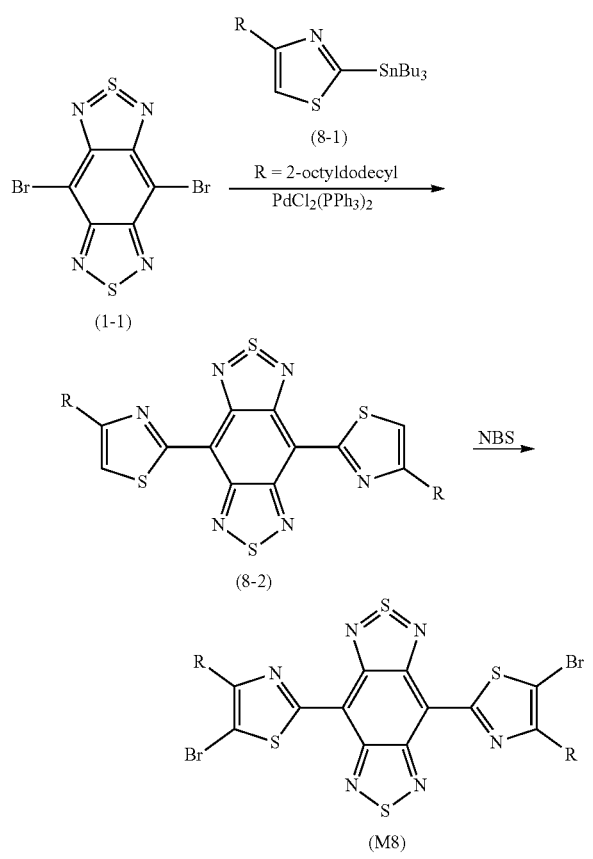

Synthesis of Compound (8-2)

A compound (8-2) was obtained by the same method as the method for synthesizing the compound (2-2), except that the compound (2-1) was replaced with a compound (8-1).

Synthesis of Monomer (M8)

A monomer (M8) was obtained by the same method as the method for synthesizing the monomer (M2), except that the compound (2-2) was replaced with the compound (8-2).

Synthesis of Monomer (M9)

A monomer (M9) was synthesized according to the following procedure.

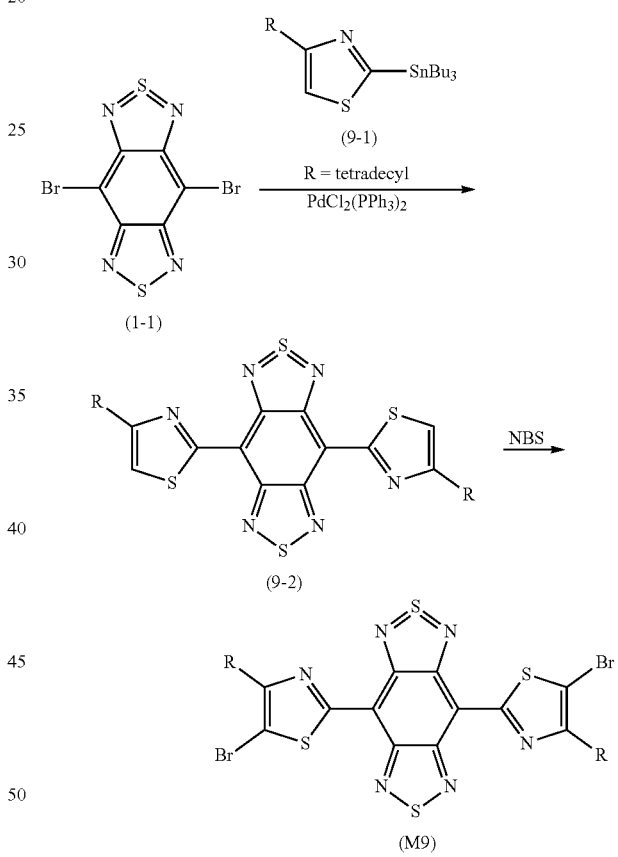

Synthesis of Compound (9-2)

A compound (9-2) was obtained by the same method as the method for synthesizing the compound (2-2), except that the compound (2-1) was replaced with a compound (9-1).

Synthesis of Monomer (M9)

A monomer (M9) was obtained by the same method as the method for synthesizing the monomer (M2), except that the compound (2-2) was replaced with the compound (9-2).

113

Polymer Synthesis (1)

Example 1

Synthesis of Polymer (P1A)

A polymer (P1A) was synthesized according to the following procedure.

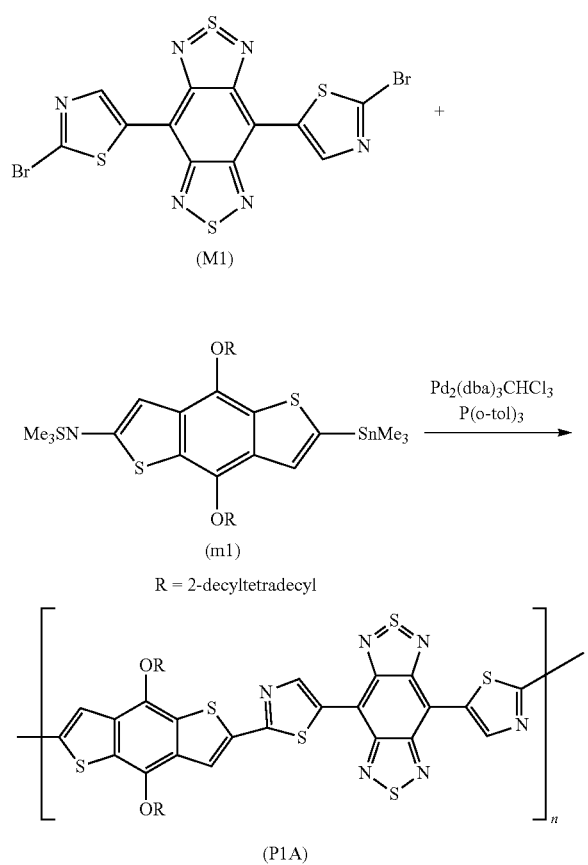

(M1)

(m1)

R = 2-decyltetradecyl (P1A)

77.7 mg (0.150 mmol) of the monomer (M1), 192 mg (0.150 mmol) of a monomer (m1), 3.11 mg (3.00 μmol) of a tris(dibenzylideneacetone)dipalladium(0)-chloroform adduct, 7.30 mg (24.0 μmol) of tri(o-tolyl)phosphine, and 3 mL of chlorobenzene (dehydrated) were charged into a reaction container for microwave, and the mixture was reacted at 140° C. for 1 hour under a nitrogen atmosphere (conditions: Power 300 W, Ramp time 1 min). After allowing to cool to room temperature, the resultant was poured into 50 mL of methanol for crystallization, and collected by filtration. The obtained solid was extracted by Soxhlet with methanol, acetone, and hexane, washed, and extracted with chlorobenzene to recover a polymer. The chlorobenzene solution of the obtained polymer was concentrated under reduced pressure to approximately 10 mL, and poured into 20 mL of methanol for crystallization. The obtained solid was collected by filtration and dried under reduced pressure (80° C.) to obtain 177 mg (yield: 91.1%) of a polymer (P1A). A weight-average molecular weight of the obtained polymer (P1A) was 49,000.

114

Examples 2 to 21 and Comparative Example 1

Synthesis of Polymers (P2A) to (P21A) and Synthesis of Comparative Example Polymer (RP1A)

According to the method for synthesizing the polymer (P1A) of Example 1, polymers (P2A) to (P21A) and comparative example polymer (RP1A) described in Table 9(1,2) and Table 10(1,2) were synthesized. A weight-average molecular weight of each polymer was as follows.

(P2A) 51,000, (P3A) 36,000, (P4A) 39,000, (P5A) 38,000, (P6A) 40,000, (P7A) 34,000, (P8A) 48,000, (P9A) 44,000, (P10A) 44,000, (P11A) 39,000, (P12A) 56,000, (P13A) 58,000, (P14A) 62,000, (P15A) 51,000, (P16A) 51,000, (P17A) 50,000, (P18A) 33,000, (P19A) 56,000, (P20A) 49,000, (P21A) 55,000, (RP1A) 50,000

Production and Evaluation of Organic Thin Film Transistor (1)

Production of Organic Thin Film Transistors (Examples T1 to T41 and Comparative Example RT1)

Using each of the compounds of Examples and Comparative Examples, a bottom gate-top contact type organic thin film transistor as shown in FIG. 2 was produced as follows.

As a substrate for measuring FET characteristics, a substrate (size: 25 mm×25 mm) having a thermal oxide film (thickness: 300 nm) of $SiO_2$ on a surface of an n-type silicon substrate (thickness: 0.4 mm, corresponding to the substrate 1 provided with the gate electrode 2) 1 was prepared. A surface of the thermal oxide film (gate insulating film 3) of the substrate was washed with ultraviolet rays (UV)-ozone, and treated with β-phenethyl trimethoxysilane.

The above-described substrate was spin-coated with 50 μL of a chlorobenzene solution (0.2% by mass) of the polymer (polymers (P1A) to (P21A) and polymer (RP1A)) obtained by the production method of each Example and each Comparative Example at a rotation speed of 1500 rpm. The obtained film was dried under reduced pressure at 150° C. for 1 hour to form the organic semiconductor film 5. By placing a mask having a predetermined opening on the obtained organic semiconductor film 5 obtained and vapor-depositing 2,3,5,6-tetrafluoro-7,7,8,8-tetracyano-quinodimethane (film thickness: 1.5 nm) and gold (50 nm), the source electrode 4A and the drain electrode 4B (both thickness: 40 nm, gate width W=2 mm, gate length L=50 μm, ratio W/L=40) were formed. In this way, an organic thin film transistor for measuring FET characteristics was produced. Using the compound obtained by the production method of each Example and each Comparative Example, 10 organic thin film transistors were produced. In order to compare transistor characteristics under the atmosphere (atmosphere of normal pressure of 1 atm (temperature: room temperature)) and transistor characteristics under a nitrogen atmosphere, two conditions of a condition (condition A) for carrying out from element production to element evaluation under the atmosphere and a condition (condition B) for carrying out from element production to element evaluation in a glove box with a nitrogen atmosphere were performed.

Evaluation (P-Type) of Organic Thin Film Transistors (Examples T1 to T41 and Comparative Example RT1)

1. Measuring Method of Carrier Mobility

With regard to each of the produced organic thin film transistors, carrier mobility (hereinafter, also referred to as "mobility") was measured using a semiconductor parameter analyzer (device name: Agilent 4155C) connected to a semi-auto prober (AX-2000, manufactured by Vector Semiconductor Co., Ltd.).

As described above, for the element produced under the atmosphere (atmosphere of normal pressure of 1 atm (temperature: room temperature)), the carrier mobility was also measured under the atmosphere (atmosphere of normal pressure of 1 atm (temperature: room temperature)). In addition, for the element produced in a glove box with a nitrogen atmosphere, the carrier mobility was also measured in a glove box with a nitrogen atmosphere.

Specifically, the measuring method of the carrier mobility was as follows.

A voltage of −15 V was applied between the source electrode and the drain electrode of each organic thin film transistor, the gate voltage was changed to in a range of +40 V to −40 V, and the carrier mobility (hole) μ (cm²/Vs) was calculated using the following equation representing the drain current $I_d$.

$$I_d = (w/2L)\mu C_i (V_g - V_{th})^2$$

In the equation, L represents the gate length, w represents the gate width, μ represents the carrier mobility, $C_i$ represents the capacity per unit area of the gate insulating film, $V_g$ represents the gate voltage, and $V_{th}$ represents the threshold voltage.

2. Evaluation of Carrier Mobility

(1) Evaluation of Atmospheric Stability (Examples T1 to T21 and Comparative Example RT1)

Mobility ratios under the atmosphere and the nitrogen atmosphere were calculated, and atmospheric stability of each organic thin film transistor was evaluated.

Average Mobility Under Atmosphere

With regard to the 10 organic thin film transistors produced under the atmosphere (atmosphere of normal pressure of 1 atm (temperature: room temperature)) for each Example and each Comparative Example, carrier mobility was calculated for each under the atmosphere (atmosphere of normal pressure of 1 atm (temperature: room temperature)), and the average mobility thereof was obtained.

Average Mobility Under Nitrogen Atmosphere

With regard to the 10 organic thin film transistors produced in a glove box with a nitrogen atmosphere for each Example and each Comparative Example, carrier mobility was calculated for each in a glove box with a nitrogen atmosphere, and the average mobility thereof was obtained.

Evaluation of Atmospheric Stability

Mobility ratio was calculated from the following expression, and based on the following evaluation standard, atmospheric stability of each organic thin film transistor was evaluated.

Mobility ratio=(Average mobility of organic thin film transistor produced and evaluated under atmosphere)/(Average mobility of organic thin film transistor produced and evaluated in glove box with nitrogen atmosphere)

Evaluation Standard

"A": mobility ratio was 0.75 or more.
"B": mobility ratio was 0.50 or more and less than 0.75.
"C": mobility ratio was 0.25 or more and less than 0.50.
"D": mobility ratio was less than 0.25.

The results are shown in Table 9(1,2).

In Table 9(1,2), in the column of "A or B", a case of "A" means that the specific polymer is a polymer including a repeating unit represented by Formula (2) described above, and a case of "B" means that the specific polymer is a polymer including a repeating unit represented by Formula (3) described above.

In addition, in Table 9(1,2), in a case where the column of "A or B" corresponds to "A" (in other words, in a case where the specific polymer is a polymer including a repeating unit represented by Formula (2) described above), the column of "Type of A" indicates whether "A" in Formula (2) corresponds to a single bond or any of Formulae (A) to (L).

TABLE 9

Table 9(1)

| Organic thin film transistor | Number | Polymer in organic semiconductor layer<br>Polymer containing repeating unit represented by Formula (2) or polymer containing repeating unit represented by Formula (3) |
|---|---|---|
| Example T1 | P1A | |

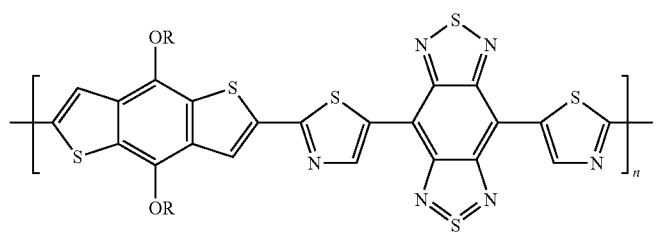

TABLE 9-continued
Table 9(1)
| Example T2 | P2A | 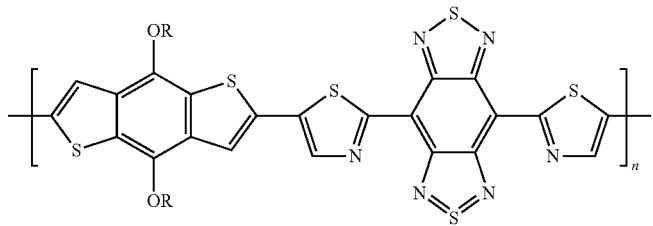 |
| Example T3 | P3A | 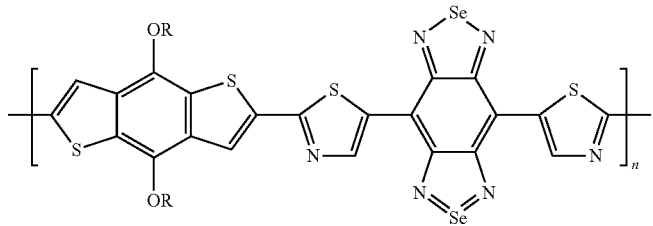 |
| Example T4 | P4A | 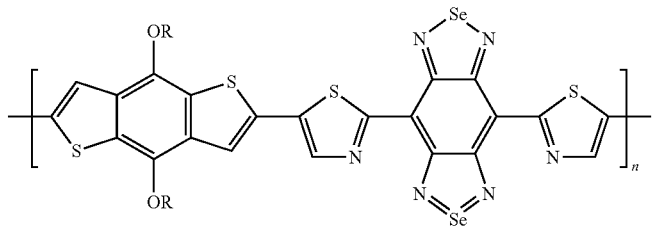 |
| Example T5 | P5A | 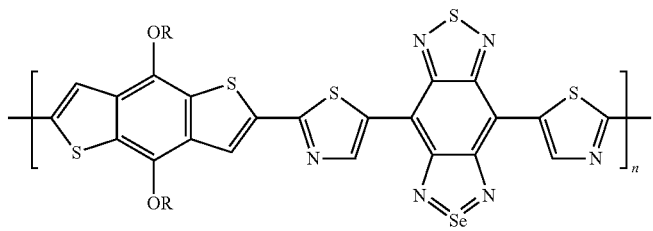 |
| Example T6 | P6A | 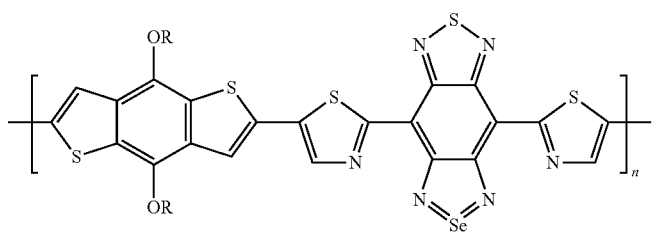 |
| Example T7 | P7A | 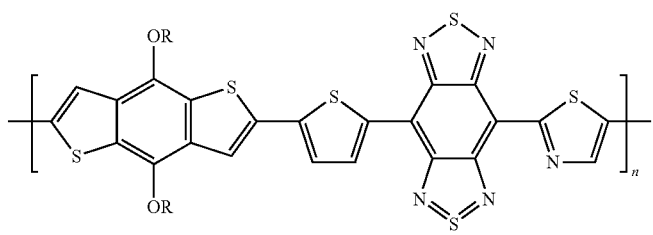 |

TABLE 9-continued

Table 9(1)

| | | |
|---|---|---|
| Example T8 | P8A | (structure) |
| Example T9 | P9A | (structure) |
| Example T10 | P10A | (structure) |
| Example T11 | P11A | (structure) |

| | Polymer in organic semiconductor layer | | | | |
|---|---|---|---|---|---|
| | Polymer containing repeating unit | | Remark | | |
| Organic thin film transistor | represented by Formula (2) or polymer containing repeating unit represented by Formula (3) | Example number | Type of constituent monomer | A or B | Type of A | Evaluation Atmospheric stability |
| Example T1 | R = 2-octyldodecyl | Example 1 | M1 | A | (A) | A |
| Example T2 | R = 2-octyldodecyl | Example 2 | M2 | A | (A) | A |
| Example T3 | R = 2-octyldodecyl | Example 3 | M3 | A | (A) | A |
| Example T4 | R = 2-octyldodecyl | Example 4 | M4 | A | (A) | A |
| Example T5 | R = 2-octyldodecyl | Example 5 | M5 | A | (A) | A |
| Example T6 | R = 2-octyldodecyl | Example 6 | M6 | A | (A) | A |
| Example T7 | R = 2-octyldodecyl | Example 7 | M7 | A | (A) | B |
| Example T8 | R = 2-octyldodecyl | Example 8 | M1 | A | (B) | A |
| Example T9 | R = 2-octyldodecyl | Example 9 | M1 | A | (G) | B |
| Example T10 | R = 2-octyldodecyl | Example 10 | M1 | A | (C) | A |
| Example T11 | $R^1$ = hexyl, $R^2$ = dodecyl | Example 11 | M1 | A | (B) | A |

TABLE 10
Table 9(2)
| Organic thin film transistor | Number | Polymer in organic semiconductor layer — Polymer containing repeating unit represented by Formula (2) or polymer containing repeating unit represented by Formula (3) |
|---|---|---|
| Example T12 | P12A | 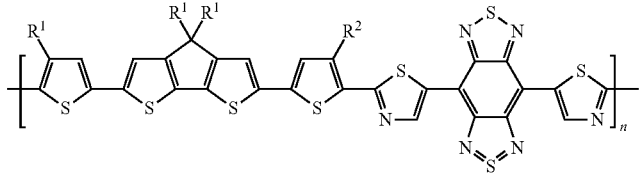 |
| Example T13 | P13A | 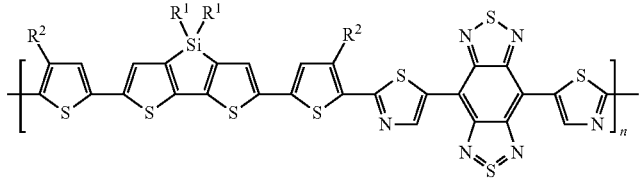 |
| Example T14 | P14A | 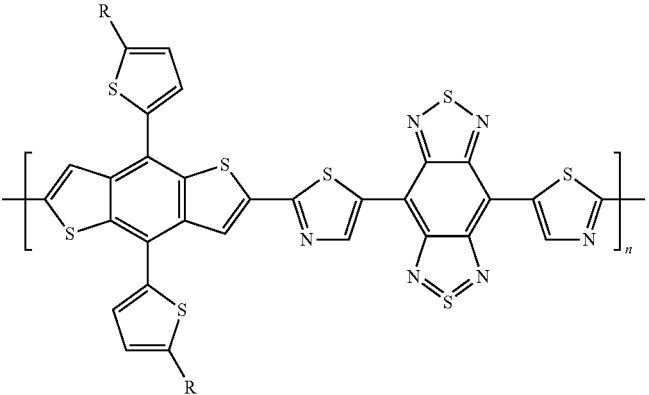 |
| Example T15 | P15A | 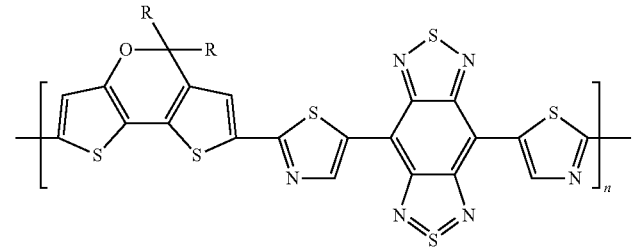 |
| Example T16 | P16A | 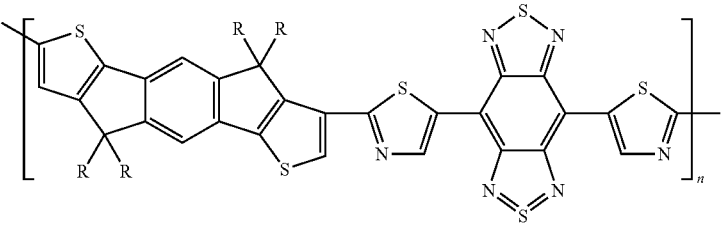 |

TABLE 10-continued
Table 9(2)
| | | |
|---|---|---|
| Example T17 | P17A | 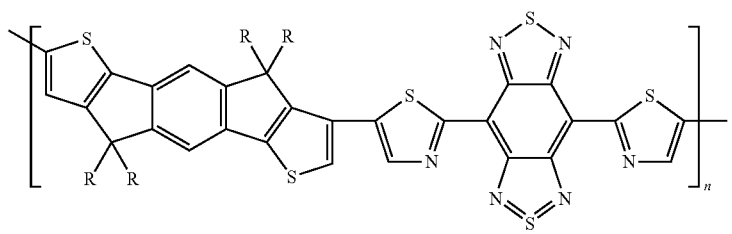 |
| Example T18 | P18A | 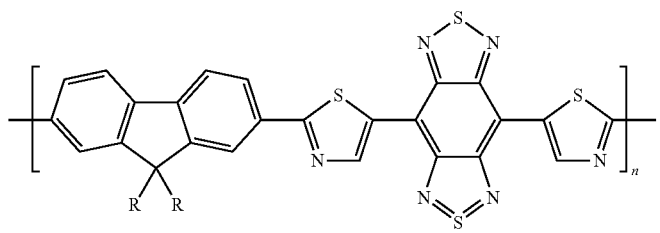 |
| Example T19 | P19A | 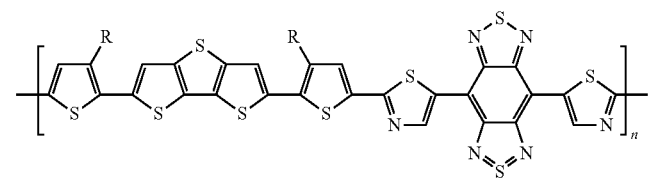 |
| Example T20 | P20A | 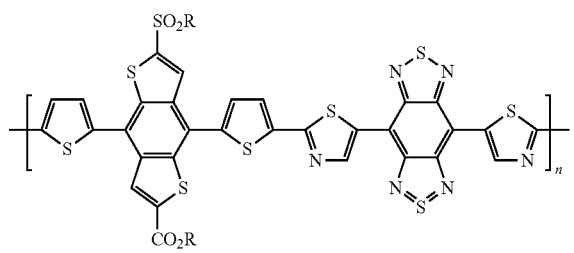 |
| Example T21 | P21A | 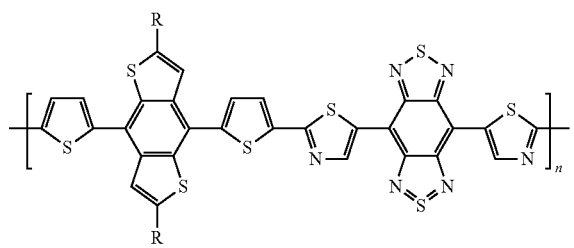 |
| Comparative Example RT1 | RP1A | 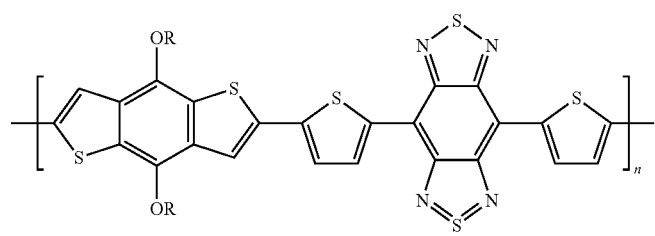 |

TABLE 10-continued

Table 9(2)

| | Polymer in organic semiconductor layer | | | | | |
|---|---|---|---|---|---|---|
| | Polymer containing repeating unit | Remark | | | | |
| Organic thin film transistor | represented by Formula (2) or polymer containing repeating unit represented by Formula (3) | Example number | Type of constituent monomer | A or B | Type of A | Evaluation Atmosphere stability |
| Example T12 | $R^1$ = 2-ethylhexyl, $R^2$ = octyl | Example 12 | M1 | A | (B) | A |
| Example T13 | $R^1$ = 2-ethylhexyl, $R^2$ = octyl | Example 13 | M1 | A | (B) | A |
| Example T14 | R = 2-hexyldecyl | Example 14 | M1 | A | (A) | A |
| Example T15 | R = 3,7-dimethloctyl | Example 15 | M1 | A | (A) | A |
| Example T16 | R = 4-hexylphenyl | Example 16 | M1 | A | (A) | A |
| Example T17 | R = 2-octyldodecyl | Example 17 | M2 | A | (A) | A |
| Example T18 | R = 2-octyldodecyl | Example 18 | M1 | A | (A) | A |
| Example T19 | R = 2-octyldodecyl | Example 19 | M1 | A | (B) | A |
| Example T20 | R = 2-octyldodecyl | Example 20 | M1 | A | (B) | A |
| Example T21 | R = 2-octyldodecyl | Example 21 | M1 | A | (B) | A |
| Comparative Example RT1 | R = 2-octyldodecyl | Comparative Example 1 | — | — | — | C |

From the results of Table 9(1,2), it was clear that the organic thin film transistors (Examples T1 to T21) which included the organic semiconductor film including the polymer of Examples had a small mobility difference between the case of being produced and evaluated under the atmosphere and the case of being produced and evaluated under the nitrogen atmosphere, and exhibited high atmospheric stability.

In addition, from the comparison between Example 12 and Example 17, in a case where, in Formula (1) and Formula (2), at least one of $Y^1$ or $Y^2$ represents a nitrogen atom and at least one of $Y^3$ or $Y^4$ represents a nitrogen atom, it was found that the atmospheric stability is more excellent.

In addition, from the results of Example T9, in a case where the type of the divalent conjugated linking group represented by A in Formula (1) is (G), it was confirmed that the atmospheric stability is slightly inferior.

From the results of Table 9(1,2), it was clear that the organic thin film transistor which included the organic semiconductor film including the polymer of Comparative Example did not obtain the desired effect.

(2) Calculation of Relative Mobility Under Atmosphere (Examples T22 to T41)

Based on the average mobility of the organic thin film transistor of Example T22 in Table 10(1,2) under the atmosphere, relative mobility was calculated by the following expression and evaluated by the following evaluation standard.

Relative mobility=(Average mobility of each Example or each Comparative Example under atmosphere)/(Average mobility of Example T22 under atmosphere)

Evaluation Standard

"A": relative mobility was 1.5 or more.
"B": relative mobility was 0.5 or more and less than 1.5.
"C": relative mobility was less than 0.5.
The results are shown in Table 10(1,2).
In Table 10(1,2), in the column of "A or B", a case of "A" means that the specific polymer is a polymer including a repeating unit represented by Formula (2) described above, and a case of "B" means that the specific polymer is a polymer including a repeating unit represented by Formula (3) described above.

In addition, in Table 10(1,2), in a case where the column of "A or B" corresponds to "A" (in other words, in a case where the specific polymer is a polymer including a repeating unit represented by Formula (2) described above), the column of "Type of A" indicates whether "A" in Formula (2) corresponds to a single bond or any of Formulae (A) to (L).

TABLE 11
Table 10(1)
| Organic thin film transistor | Polymer in organic semiconductor layer | |
|---|---|---|
| | Number | Polymer containing repeating unit represented by Formula (2) or polymer containing repeating unit represented by Formula (3) |
| Example T22 | P1A | 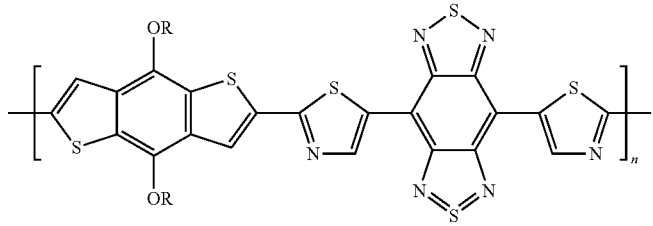 |
| Example T23 | P2A | 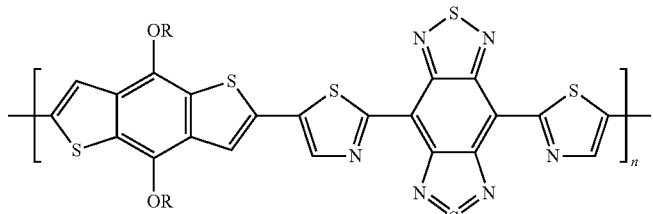 |
| Example T24 | P3A | 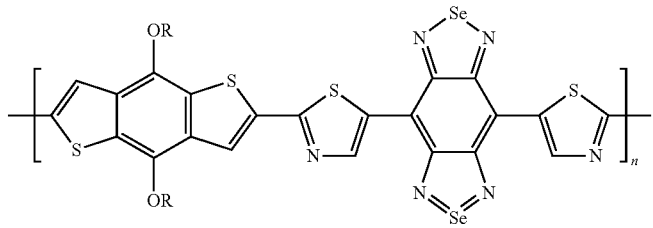 |
| Example T25 | P4A | 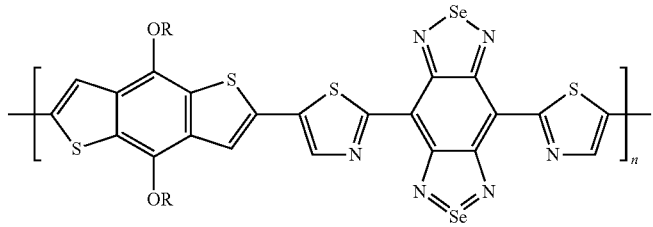 |
| Example T26 | P5A | 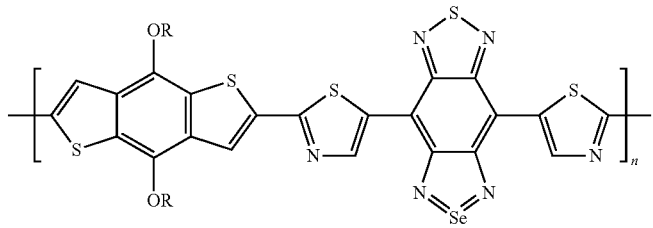 |
| Example T27 | P6A | 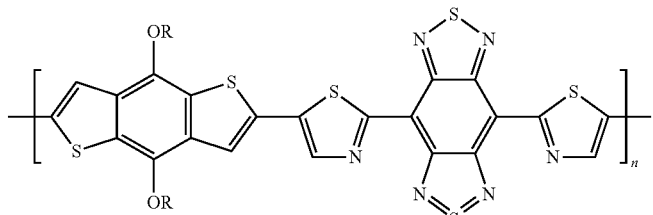 |

TABLE 11-continued

Table 10(1)

| | | |
|---|---|---|
| Example T28 | P8A |  |
| Example T29 | P9A |  |
| Example T30 | P10A |  |
| Example T31 | P11A | 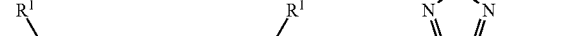 |

| | Polymer in organic semiconductor layer | | | | | |
|---|---|---|---|---|---|---|
| | Polymer containing repeating unit | | Remark | | | |
| Organic thin film transistor | represented by Formula (2) or polymer containing repeating unit represented by Formula (3) | Example number | Type of constituent monomer | A or B | Type of A | Evaluation Relative mobility |
| Example T22 | R = 2-octyldodecyl | Example 1 | M1 | A | (A) | B |
| Example T23 | R = 2-octyldodecyl | Example 2 | M2 | A | (A) | C |
| Example T24 | R = 2-hexyldecyl | Example 3 | M3 | A | (A) | B |
| Example T25 | R = 3,7-dimethloctyl | Example 4 | M4 | A | (A) | C |
| Example T26 | R = 4-hexylphenyl | Example 5 | M5 | A | (A) | B |
| Example T27 | R = 2-octyldodecyl | Example 6 | M6 | A | (A) | C |
| Example T28 | R = 2-octyldodecyl | Example 8 | M1 | A | (A) | B |
| Example T29 | R = 2-octyldodecyl | Example 9 | M1 | A | (G) | B |
| Example T30 | R = 2-octyldodecyl | Example 10 | M1 | A | (C) | B |
| Example T31 | $R^1$ = hexyl, $R^2$ = dodecyl | Example 11 | M1 | A | (B) | B |

TABLE 12

Table 10(2)

| Organic thin film transistor | Number | Polymer in organic semiconductor layer — Polymer containing repeating unit represented by Formula (2) or polymer containing repeating unit represented by Formula (3) |
|---|---|---|
| Example T32 | P12A | |
| Example T33 | P13A | |
| Example T34 | P14A | |
| Example T35 | P15A | |
| Example T36 | P16A | |

TABLE 12-continued

Table 10(2)

| Example T37 | P17A | 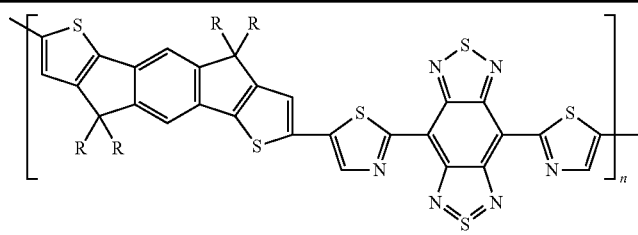 |
| Example T38 | P18A | 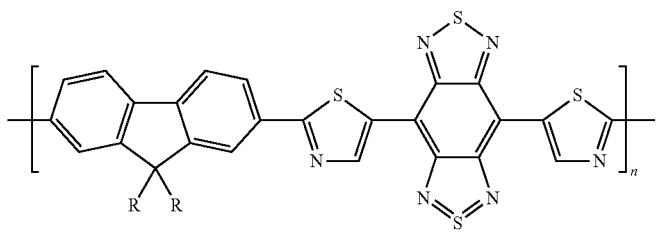 |
| Example T39 | P19A | 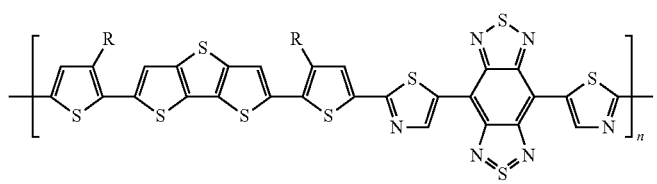 |
| Example T40 | P20A | 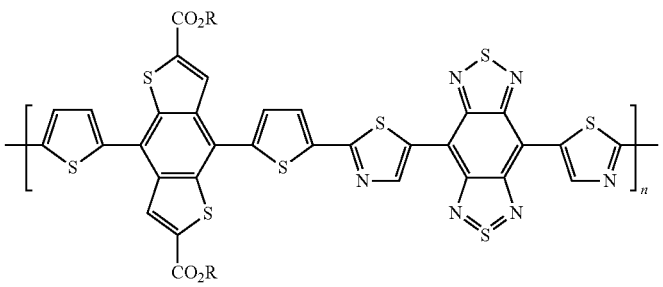 |
| Example T41 | P21A | 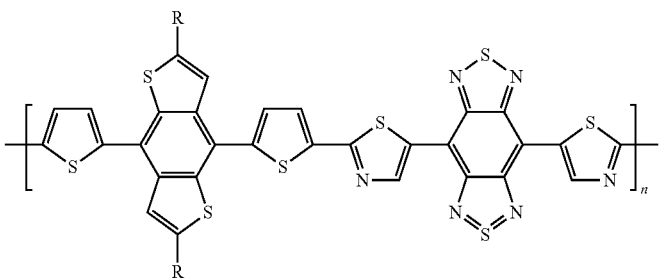 |

| | Polymer in organic semiconductor layer | | | | | |
|---|---|---|---|---|---|---|
| | Polymer containing repeating unit | | Remark | | | |
| Organic thin film transistor | represented by Formula (2) or polymer containing repeating unit represented by Formula (3) | Example number | Type of constituent monomer | A or B | Type of A | Evaluation Relative mobility |
| Example T32 | $R^1$ = 2-ethylhexyl, $R^2$ = octyl | Example 12 | M1 | A | (B) | B |
| Example T33 | $R^1$ = 2-ethylhexyl, $R^2$ = octyl | Example 13 | M1 | A | (B) | B |
| Example T34 | R = 2-hexyldecyl | Example 14 | M1 | A | (A) | B |
| Example T35 | R = 3,7-dimethloctyl | Example 15 | M1 | A | (A) | B |
| Example T36 | R = 4-hexylphenyl | Example 16 | M1 | A | (A) | A |

TABLE 12-continued

Table 10(2)

| | | | | | | |
|---|---|---|---|---|---|---|
| Example T37 | R = 2-octyldodecyl | Example 17 | M2 | A | (A) | A |
| Example T38 | R = 2-octyldodecyl | Example 18 | M1 | A | (A) | C |
| Example T39 | R = 2-octyldodecyl | Example 19 | M1 | A | (B) | B |
| Example T40 | R = 2-octyldodecyl | Example 20 | M1 | A | (B) | A |
| Example T41 | R = 2-octyldodecyl | Example 21 | M1 | A | (B) | A |

From the comparison of Examples T22 to T27, in Formula (1), in a case where $Y^1$ and $Y^4$ represent a nitrogen atom and $Y^2$ and $Y^3$ represent —CH=, compared to a case where $Y^1$ and $Y^4$ represent —CH= and $Y^2$ and $Y^3$ represent a nitrogen atom, it was clear that the mobility under the atmosphere was higher.

In addition, from the results of Examples T36 and T37, in a case where the specific polymer includes a repeating unit represented by Formula (2) and the conjugated linking group represented by A in the repeating unit represented by Formula (2) is a divalent conjugated linking group represented by Formula (A1) (where p is 2 or more, preferably 3 or more), it was clear that the mobility under the atmosphere was higher.

In addition, from the results of Example T38, in a case where the conjugated linking group represented by A in Formula (2) is a conjugated linking group including a heteroatom, it was clear that the mobility under the atmosphere was higher.

It was confirmed that Examples T40 and T41 had more excellent mobility under the atmosphere.

It is considered that this is because packing of the polymers is promoted in a case where the conjugated linking group represented by A in Formula (2) has substantially the same shape as the partial structure represented by Formula (1) (preferably, in a case where the conjugated linking group represented by A in Formula (2) is selected from the above-described Lc-1 group).

Polymer Synthesis (2)

Examples 22 to 33, Examples 35 and 36, and Comparative Example 2

Synthesis of Polymers (P1B) to (P12B), (P14B), and (P15B) and Comparative Polymer (RPB1)

According to the method for synthesizing the polymer (P1A) of Example 1, polymers (P2B) to (P12B), (P14B), and (P15B) and comparative example polymer (RP1B) described in Table 11(1,2) and Table 12(1,2) were synthesized. A weight-average molecular weight of each polymer was as follows.

(P1B) 69,000, (P2B) 61,000, (P3B) 28,000, (P4B) 49,000, (P5B) 62,000, (P6B) 49,000, (P7B) 50,000, (P8B) 33,000, (P9B) 39,000, (P10B) 32,000, (P11B) 55,000, (P12B) 46,000, (P14B) 59,000, (P15B) 51,000, (RPB1) 68,000

Example 34

Synthesis of Polymer (P13B)

A polymer (P13B) was synthesized according to the following procedure.

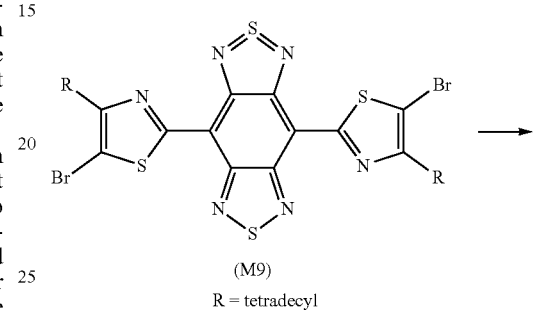

228 mg (0.250 mmol) of the monomer (M9), 82.5 mg (0.300 mmol) of bis(1,5-cyclooctadiene)nickel (0), 27.0 mg (0.25 mmol) of 1,5-cyclooctadiene, 46.9 mg (0.300 mmol) of 2,2'-bipyridine, 2 mL of chlorobenzene, and 1 mL of N,N-dimethylformamide were charged into a glass reaction container, and under a nitrogen atmosphere, the mixture was stirred at room temperature for 30 minutes and at 70° C. for 24 hours. 196 mg (1.25 mmol) of bromobenzene was added thereto, and after stirring at 70° C. for 6 hours, the mixture was allowed to cool to room temperature. The reaction solution was added to 30 mL of a 10:1 mixed solvent of methanol and 12 M hydrochloric acid. The precipitated solid was collected by filtration, extracted by Soxhlet with methanol, acetone, and hexane, washed, and extracted with chlorobenzene to recover a polymer. The chlorobenzene solution of the obtained polymer was concentrated under reduced pressure to approximately 10 mL, and the obtained concentrate was poured into 20 mL of methanol for crystallization. The obtained solid was collected by filtration and dried under reduced pressure (80° C.) to obtain 168 mg (yield: 89.3%) of a polymer (P13B).

A weight-average molecular weight of the polymer (P13B) was 31,000.

Production and Evaluation of Organic Thin Film Transistor (2)

Production of Organic Thin Film Transistors (Examples T42 to T56 and Comparative Example RT2)

Using the polymers (P1B) to (P15B) and comparative polymer (RPB1), production of organic thin film transistors Examples T42 to T56 and Comparative Example RT2 were performed by the same method as in Example 1, respectively, except that 2,3,5,6-tetrafluoro-7,7,8,8-tetracyano-quinodimethane was not used.

Evaluation (n-Type) of Organic Thin Film Transistors (Examples T42 to T56 and Comparative Example RT2)

<Evaluation of Atmospheric Stability>
Atmospheric stability of the organic thin film transistors of Examples T42 to T56 and Comparative Example $R^{12}$ was evaluated by the same method as in Example T1, except that a voltage of +15 V was applied between the source electrode and the drain electrode of each organic thin film transistor and the gate voltage was changed to in a range of −40 V to +40 V to calculate carrier mobility (electrons). The results are shown in Table 11(1,2).

The results are shown in Table 11(1,2).

In Table 11(1,2), in the column of "A or B", a case of "A" means that the specific polymer is a polymer including a repeating unit represented by Formula (2) described above, and a case of "B" means that the specific polymer is a polymer including a repeating unit represented by Formula (3) described above.

In addition, in Table 11(1,2), in a case where the column of "A or B" corresponds to "A" (in other words, in a case where the specific polymer is a polymer including a repeating unit represented by Formula (2) described above), the column of "Type of A" indicates whether "A" in Formula (2) corresponds to a single bond or any of Formulae (A) to (L).

TABLE 13

| | Table 11(1) | |
|---|---|---|
| Organic | Polymer in organic semiconductor layer | |
| thin film transistor | Number | Polymer containing repeating unit represented by Formula (2) or polymer containing repeating unit represented by Formula (3) |
| Example T42 | P1B | (structure) |
| Example T43 | P2B | (structure) |
| Example T44 | P3B | (structure) |
| Example T45 | P4B | (structure) |

TABLE 13-continued

Table 11(1)

| Example T46 | P5B | (structure shown) |
| Example T47 | P6B | (structure shown) |
| Example T48 | P7B | (structure shown) |

| Organic thin film transistor | Polymer containing repeating unit represented by Formula (2) or polymer containing repeating unit represented by Formula (3) | Polymer in organic semiconductor layer | | | | Evaluation Atmosphere stability |
|---|---|---|---|---|---|---|
| | | Example number | Type of constituent monomer | A or B | Type of A (Remark) | |
| Example T42 | R = (CH$_2$)$_4$-O-CH(n-C$_{10}$H$_{21}$)(n-C$_{12}$H$_{25}$) | Example 22 | M1 | A | (B) | A |
| Example T43 | R = (CH$_2$)$_4$-O-CH(n-C$_{10}$H$_{21}$)(n-C$_{12}$H$_{25}$) | Example 23 | M2 | A | (B) | A |
| Example T44 | R = (CH$_2$)$_4$-O-CH(n-C$_{10}$H$_{21}$)(n-C$_{12}$H$_{25}$) | Example 24 | M7 | A | (B) | C |
| Example T45 | R = 4-octyldodecyl | Example 25 | M1 | A | (B) | A |
| Example T46 | R = (CH$_2$)$_4$-O-CH(n-C$_{10}$H$_{21}$)(n-C$_{12}$H$_{25}$) | Example 26 | M1 | A | (B) | A |
| Example T47 | R = 4-octyldodecyl | Example 27 | M1 | A | (B) | A |
| Example T48 | R = (CH$_2$)$_4$-O-CH(n-C$_{10}$H$_{21}$)(n-C$_{12}$H$_{25}$) | Example 28 | M1 | A | (I) | A |

TABLE 14
Table 11(2)
| Organic thin film transistor | Polymer in organic semiconductor layer | |
|---|---|---|
| | Number | Polymer containing repeating unit represented by Formula (2) or polymer containing repeating unit represented by Formula (3) |
| Example T49 | P8B | 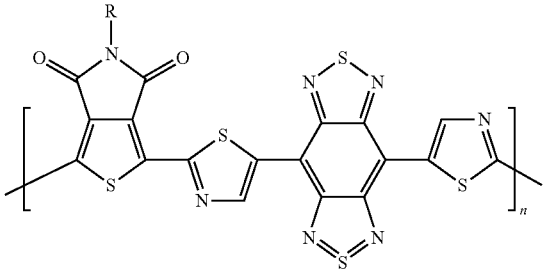 |
| Example T50 | P9B | 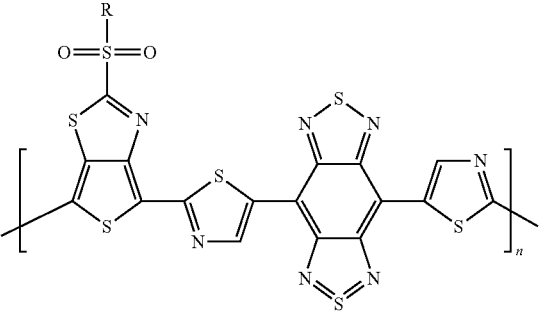 |
| Example T51 | P10B | 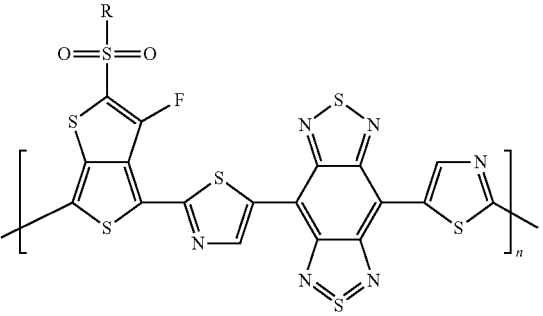 |
| Example T52 | P11B | 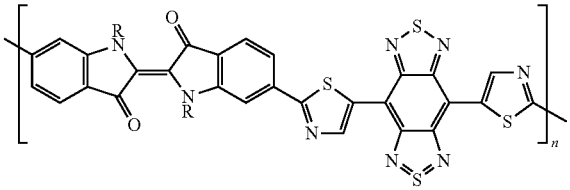 |
| Example T53 | P12B | 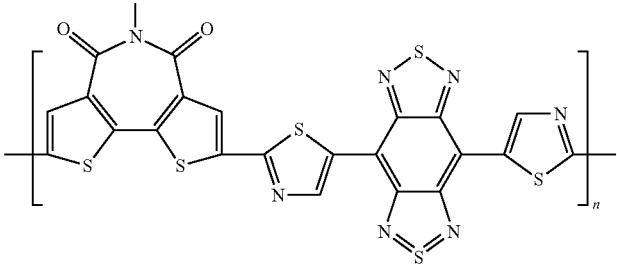 |

TABLE 14-continued

Table 11(2)

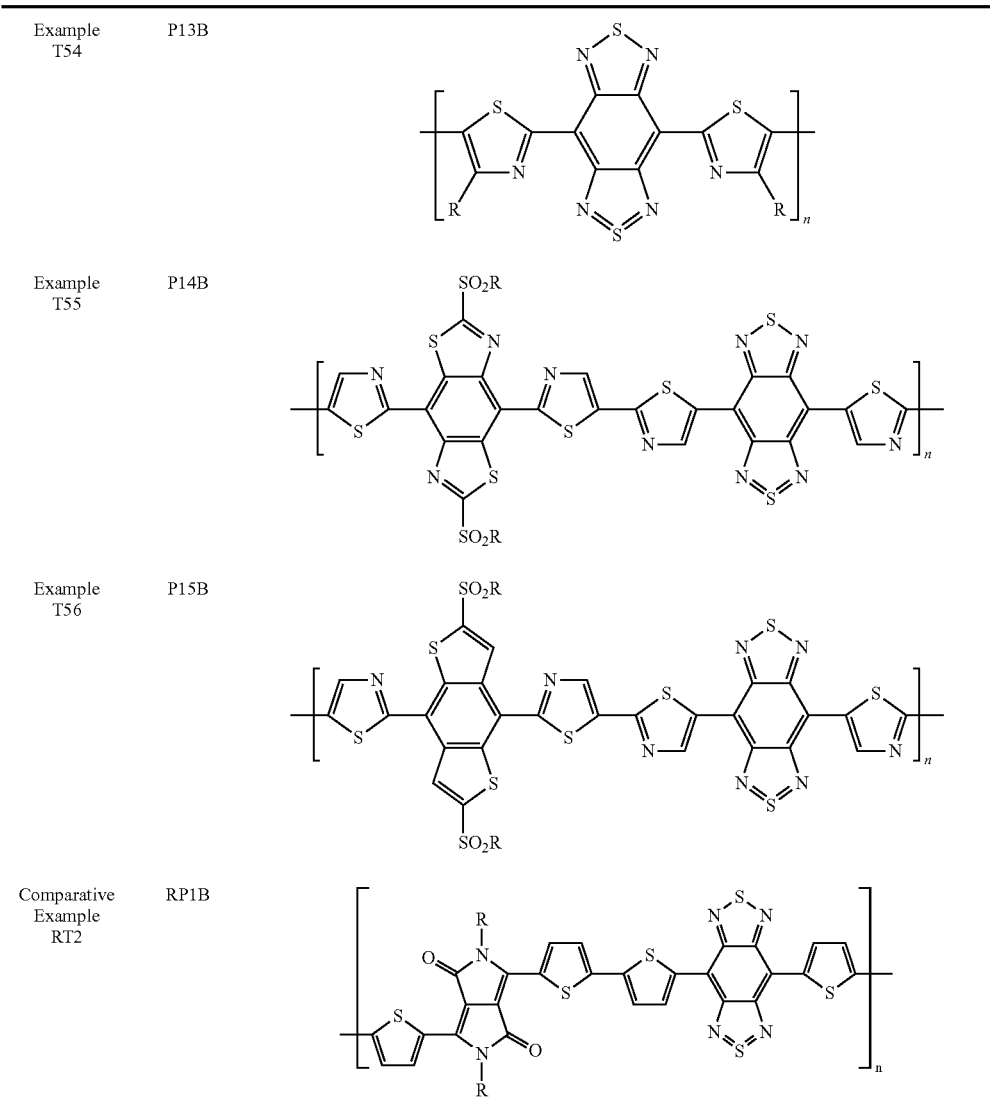

| | Polymer in organic semiconductor layer | | | | | |
|---|---|---|---|---|---|---|
| | | | Remark | | | Evaluation |
| Organic thin film transistor | Polymer containing repeating unit represented by Formula (2) or polymer containing repeating unit represented by Formula (3) | Example number | Type of constituent monomer | A or B | Type of A | Atmosphere stability |
| Example T49 | R = ~~~O~~~O~~~ n-C$_{10}$H$_{21}$ / n-C$_{12}$H$_{25}$ | Eample 29 | M1 | A | (A) | A |
| Example T50 | R = n-octadecyl | Example 30 | M1 | A | (A) | A |
| Example T51 | R = 2-octyldodecyl | Example 31 | M1 | A | (A) | A |
| Example T52 | R = ~~~O~~~O~~~ n-C$_{10}$H$_{21}$ / n-C$_{12}$H$_{25}$ | Example 32 | M1 | B | — | A |

TABLE 14-continued

Table 11(2)

| Example | | Example | | | | |
|---|---|---|---|---|---|---|
| Example T53 | R = (structure with O, n-C₁₀H₂₁, n-C₁₂H₂₅) | Example 33 | M1 | A | (A) | A |
| Example T54 | R = 2-octyldodecyl | Example 34 | M8 | A | Single bond | A |
| Example T55 | R = 2-octyldodecyl | Example 35 | M1 | A | (B) | A |
| Example T56 | R = 2-octyldodecyl | Example 36 | M1 | A | (B) | A |
| Comparative Example RT2 | R = (structure with n-C₁₀H₂₁, O, n-C₁₂H₂₅) | Comparative Example 2 | — | — | — | D |

From the results of Table 11(1,2), it was clear that the organic thin film transistors (Examples T42 to T56) which included the organic semiconductor film including the polymer of Examples had a small mobility difference between the case of being produced and evaluated under the atmosphere and the case of being produced and evaluated under the nitrogen atmosphere, and exhibited high atmospheric stability.

In addition, from the comparison of Examples T42 to T44, in a case where, in Formulae (1) to (3), at least one of $Y^1$ or $Y^2$ represents a nitrogen atom and at least one of $Y^3$ or $Y^4$ represents a nitrogen atom, it was found that the atmospheric stability is more excellent.

From the results of Table 11(1,2), it was clear that the organic thin film transistor which included the organic semiconductor film including the polymer of Comparative Example did not obtain the desired effect.

Evaluation of Relative Mobility

Relative mobility of the organic thin film transistors of Examples T57 to T71 was evaluated by the same method as in Example 122, except that a voltage of +15 V was applied between the source electrode and the drain electrode of each organic thin film transistor, the gate voltage was changed to in a range of −40 V to +40 V to calculate carrier mobility (electrons), and the average mobility of Example T57 was used as basis. The results are shown in Table 12(1,2).

The results are shown in Table 12(1,2).

In Table 12(1,2), in the column of "A or B", a case of "A" means that the specific polymer is a polymer including a repeating unit represented by Formula (2) described above, and a case of "B" means that the specific polymer is a polymer including a repeating unit represented by Formula (3) described above.

In addition, in Table 12(1,2), in a case where the column of "A or B" corresponds to "A" (in other words, in a case where the specific polymer is a polymer including a repeating unit represented by Formula (2) described above), the column of "Type of A" indicates whether "A" in Formula (2) corresponds to a single bond or any of Formulae (A) to (L).

TABLE 15

Table 12(1)

| Organic thin film transistor | Number | Polymer in organic semiconductor layer — Polymer containing repeating unit represented by Formula (2) or polymer containing repeating unit represented by Formula (3) |
|---|---|---|
| Example T57 | P1B | 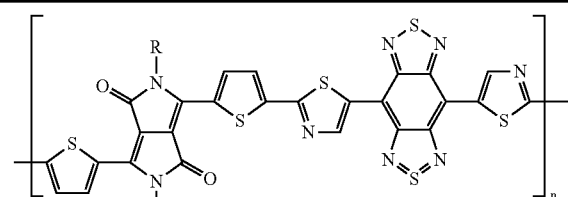 |
| Example T58 | P2B | 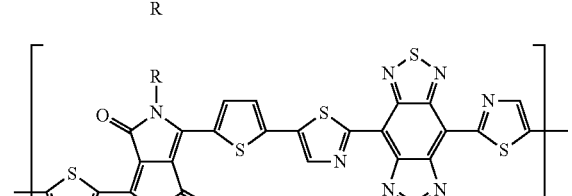 |

TABLE 15-continued

Table 12(1)

| | | |
|---|---|---|
| Example T59 | P3B | 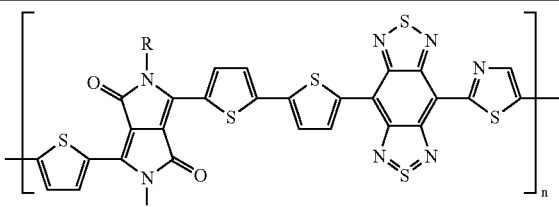 |
| Example T60 | P4B | 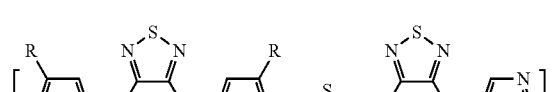 |
| Example T61 | P5B | 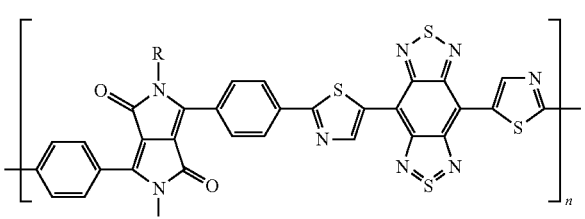 |
| Example T62 | P6B | 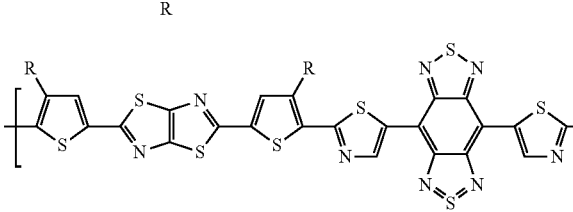 |
| Example T63 | P7B | 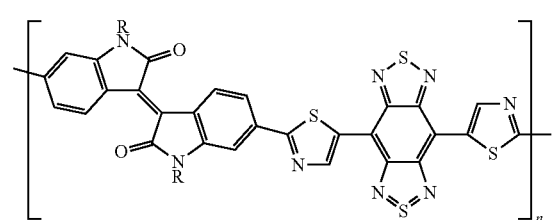 |

| | Polymer in organic semiconductor layer | | | | |
|---|---|---|---|---|---|
| | | | Remark | | |
| Organic thin film transistor | Polymer containing repeating unit represented by Formula (2) or polymer containing repeating unit represented by Formula (3) | Example number | Type of constituent monomer | A or B Type of A | Evaluation Relative mobility |
| Example T57 | R = ~~~O~~~ n-C$_{10}$H$_{21}$ / n-C$_{12}$H$_{25}$ | Eample 22 | M1 | A (B) | A |
| Example T58 | R = ~~~O~~~ n-C$_{10}$H$_{21}$ / n-C$_{12}$H$_{25}$ | Example 23 | M2 | A (B) | B |
| Example T59 | R = ~~~O~~~ n-C$_{10}$H$_{21}$ / n-C$_{12}$H$_{25}$ | Example 24 | M7 | A (B) | C |
| Example T60 | R = 4-octyldodecyl | Example 25 | M1 | A (B) | A |

TABLE 15-continued

Table 12(1)

| Example T61 | 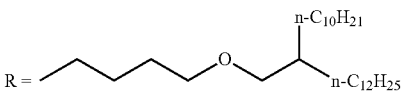 R = (structure with n-C10H21, O, n-C12H25) | Example 26 | M1 | A | (B) | A |
| --- | --- | --- | --- | --- | --- | --- |
| Example T62 | R = 4-octyldodecyl | Example 27 | M1 | A | (B) | B |
| Example T63 | 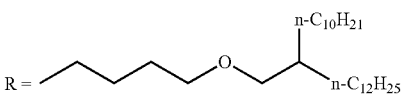 R = (structure with n-C10H21, O, n-C12H25) | Example 28 | M1 | A | (I) | A |

TABLE 16

Table 12(2)

| Organic thin film transistor | Polymer in organic semiconductor layer |  |
| --- | --- | --- |
|  | Number | Polymer containing repeating unit represented by Formula (2) or polymer containing repeating unit represented by Formula (3) |
| Example T64 | P8B | 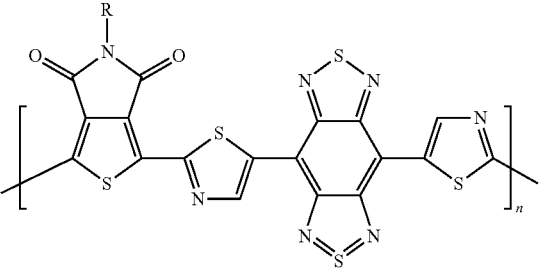 |
| Example T65 | P9B | 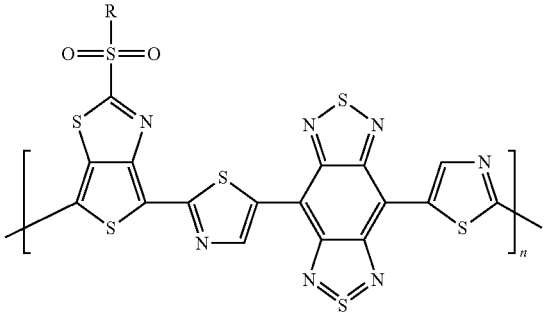 |
| Example T66 | P10B | 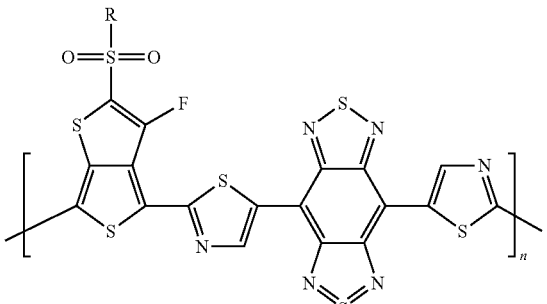 |

TABLE 16-continued

Table 12(2)

| Example T67 | P11B |  |
| Example T68 | P12B | 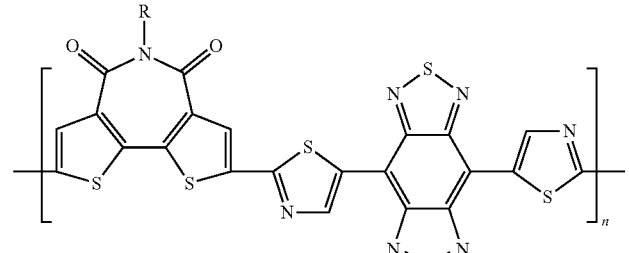 |
| Example T69 | P13B | 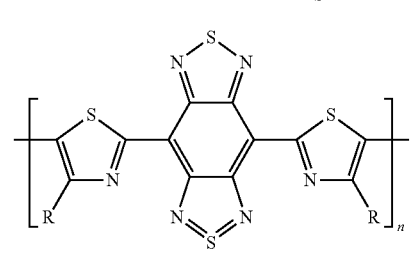 |
| Example T70 | P14B | 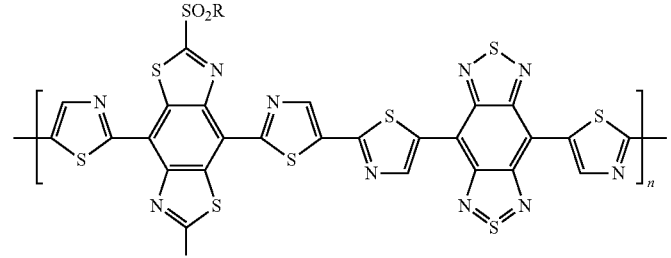 |
| Example T71 | P15B | 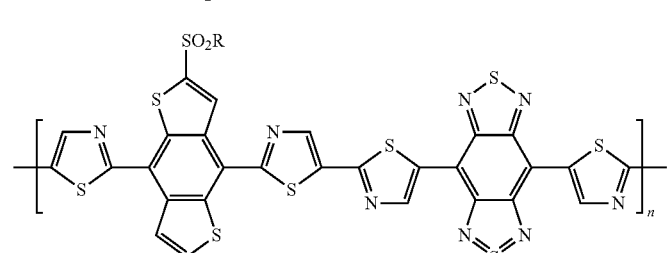 |

Polymer in organic semiconductor layer

| Organic thin film transistor | Polymer containing repeating unit represented by Formula (2) or polymer containing repeating unit represented by Formula (3) | Example number | Remark Type of constituent monomer | A or B | Type of A | Evaluation Relative mobility |
|---|---|---|---|---|---|---|
| Example T64 | R = –CH₂CH₂–O–CH₂CH₂–O–CH₂–CH(n-C₁₀H₂₁)(n-C₁₂H₂₅) | Eample 29 | M1 | A | (A) | B |

TABLE 16-continued

Table 12(2)

| Example | R | Example | | | | |
|---|---|---|---|---|---|---|
| Example T65 | R = n-octadecyl | Example 30 | M1 | A | (A) | B |
| Example T66 | R = 2-octyldodecyl | Example 31 | M1 | A | (A) | B |
| Example T67 | R = 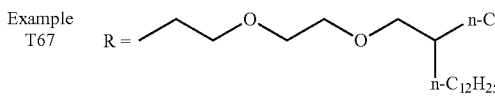 | Example 32 | M1 | B | — | A |
| Example T68 | R = 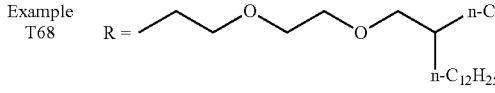 | Example 33 | M1 | A | (A) | A |
| Example T69 | R = 2-octyldodecyl | Example 34 | M8 | A | Single bond | A |
| Example T70 | R = 2-octyldodecyl | Example 35 | M1 | A | (B) | A |
| Example T71 | R = 2-octyldodecyl | Example 36 | M1 | A | (B) | A |

From the comparison of Examples T57 to T59, in Formula (1), in a case where $Y^1$ and $Y^4$ represent a nitrogen atom and $Y^2$ and $Y^3$ represent —CH=, compared to a case where $Y^1$ and $Y^4$ represent —CH= and $Y^2$ and $Y^3$ represent a nitrogen atom, it was clear that the mobility under the atmosphere was higher.

It was confirmed that Examples 170 and 171 had more excellent mobility under the atmosphere.

It is considered that this is because packing of the polymers is promoted in a case where the conjugated linking group represented by A in Formula (2) has substantially the same shape as the partial structure represented by Formula (1) (preferably, in a case where the conjugated linking group represented by A in Formula (2) is selected from the above-described Lc-1 group).

What is claimed is:

1. An organic thin film transistor comprising:
an organic semiconductor film which includes a polymer having a partial structure represented by Formula (1),

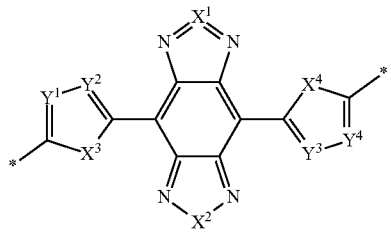

(1)

in Formula (1), $X^1$ represents a sulfur atom or a selenium atom,
$X^2$ to $X^4$ each independently represent a sulfur atom, an oxygen atom, or a selenium atom,
$Y^1$ to $Y^4$ each independently represent a group represented by —$CR^1$= or a nitrogen atom, where at least one of $Y^1$ to $Y^4$ represents a nitrogen atom,
$R^1$ represents a hydrogen atom or a substituent, and
* represents a bonding position,
wherein the polymer having a partial structure represented by Formula (1) is a polymer including a repeating unit represented by Formula (2),

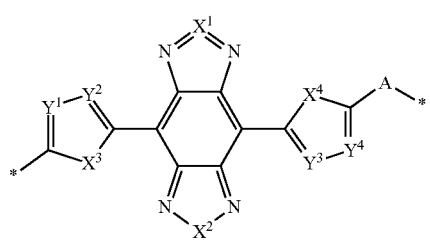

(2)

in Formula (2), $X^1$ to $X^4$ and $Y^1$ to $Y^4$ are synonymous with $X^1$ to $X^4$ and $Y^1$ to $Y^4$ in Formula (1), respectively,
A represents a single bond or a divalent conjugated linking group, and
* represents a bonding position,
and wherein the divalent conjugated linking group represented by A in Formula (2) represents a group represented by any of Formulae (A) to (L),

*-Lc-*  (A)

*—$(Ar)_m$-Lc-$(Ar)_m$—*  (B)

*—$(Ar)_m$—*  (C)

*—Z-Lc-Z—*  (D)

*—Z—$(Ar)_m$—Z—*  (E)

*—Z—$(Ar)_m$-Lc-$(Ar)_m$—Z—*  (F)

*—$(Ar)_m$—Z—$(Ar)_m$—*  (G)

*—$(Ar)_m$—Z—*  (H)

*-Ld-*  (I)

*—$(Ar)_m$-Ld-$(Ar)_m$—*  (J)

*—Z-Ld-Z—*  (K)

*—Z—$(Ar)_m$-Ld-$(Ar)_m$—Z—*  (L)

in Formulae (A), (B), (D), and (F), Lc represents a conjugated fused ring group including two or more rings, which may have a substituent, in Formulae (B), (C), (E), (F), (G), (H), (J), and (L), Ar represents a monocyclic aromatic ring group which may have a substituent, and m represents an integer of 1 to 4, in Formulae (I), (J), (K), and (L), Ld represents Formulae (L1) to (L3),

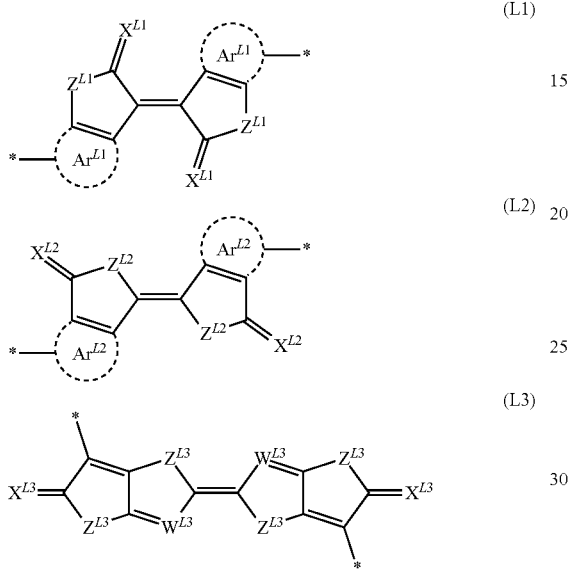

in Formula (L1), $X^{L1}$'s each independently represent an oxygen atom or a sulfur atom, $Z^{L1}$'s each independently represent a sulfur atom, an oxygen atom, $-NR^{L1}-$, or a selenium atom, $R^{L1}$ represents a hydrogen atom or a substituent, $Ar^{L1}$'s each independently represent an aromatic ring which may be fused, and

* represents a bonding position, in Formula (L2), $X^L$'s each independently represent an oxygen atom or a sulfur atom, $Z^{L2}$'s each independently represent a sulfur atom, an oxygen atom, $-NR^{L2}-$, or a selenium atom, $R^{L2}$ represents a hydrogen atom or a substituent, $Ar^{L2}$'s each independently represent an aromatic ring which may be fused, and

* represents a bonding position, in Formula (L3), XU's each independently represent an oxygen atom or a sulfur atom, $Z^{L3}$'s each independently represent a sulfur atom, an oxygen atom, $-NR^{L31}-$, or a selenium atom, $W^{L3}$'s each independently represent $-CR^{L32}=$ or a nitrogen atom, $R^{L31}$ and $R^{L32}$ each independently represent a hydrogen atom or a substituent, and

* represents a bonding position, in Formulae (D) to (H), (K), and (L), Z represents a conjugated fused ring group including two or more rings, which may have a substituent, a monocyclic aromatic ring group which may have a substituent, and a divalent conjugated linking group other than Formulae (L1) to (L3), in Formulae (B), (F), (G), (J), and (L), a plurality of Ar's and a plurality of m's may be the same or different from each other, respectively, in Formulae (C), (E), and (H), in a case where m is an integer of 2 or more, a plurality of Ar's may be the same or different from each other, and in Formulae (D), (E), (F), (K), and (L), a plurality of Z's may be the same or different from each other.

2. The organic thin film transistor according to claim 1, wherein, in Formulae (A), (B), (D), and (F), Lc is a divalent conjugated linking group represented by Formula (A1),

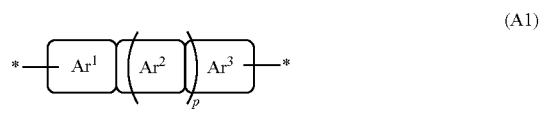

in Formula (A1), $Ar^1$, $Ar^2$, and $Ar^3$ each independently represent a conjugated ring, p represents an integer of 0 to 8, and

* represents a bonding site.

3. The organic thin film transistor according to claim 1, wherein the conjugated fused ring group represented by Lc in Formulae (A) and (D) includes at least one of $>C=W^1$, $-N=$, or $-CR^{Lc}=$, the conjugated fused ring group represented by Lc and the monocyclic aromatic ring group represented by Ar in Formulae (B) and (F) satisfy any of the following requirements 1 to 3, the monocyclic aromatic ring group represented by Ar in Formulae (C), (E), (G), and (H) satisfies the following requirement 2, and $W^1$ represents an oxygen atom or a sulfur atom and $R^{Lc}$ represents an electron withdrawing group, requirement 1: the conjugated fused ring group represented by Lc includes at least one of $>C=W^1$, $-N=$, or $-CR^{Lc}=$, requirement 2: the monocyclic aromatic ring group represented by Ar includes at least one of $-N=$ or $-CR^{Lc}=$, requirement 3: one or more selected from the group consisting of the conjugated fused ring groups represented by Lc includes at least one of $>C=W^1$, $-N=$, or $-CR^{Lc}=$, and one or more selected from the group consisting of the monocyclic aromatic ring groups represented by Ar includes at least one of $-N=$ or $-CR^{Lc}=$, where, in the requirements 1 to 3, $W^1$ represents an oxygen atom or a sulfur atom and $R^{Lc}$ represents an electron withdrawing group.

4. The organic thin film transistor according to claim 1, wherein, in Formula (2), A represents any of divalent conjugated linking groups selected from the group consisting of Formulae (A), (B), (C), (I), and (J).

5. An organic thin film transistor comprising:

an organic semiconductor film which includes a polymer having a partial structure represented by Formula (1),

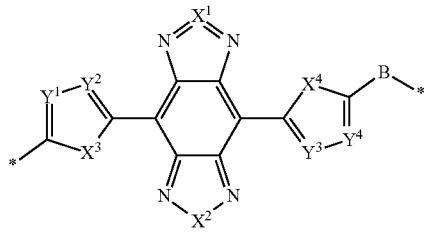
(3)

in Formula (1), $X^1$ represents a sulfur atom or a selenium atom,
$X^2$ to $X^4$ each independently represent a sulfur atom, an oxygen atom, or a selenium atom,
$Y^1$ to $Y^4$ each independently represent a group represented by —$CR^1$═ or a nitrogen atom, where at least one of $Y^1$ to $Y^4$ represents a nitrogen atom,
$R^1$ represents a hydrogen atom or a substituent, and
* represents a bonding position,
wherein the polymer having a partial structure represented by Formula (1) is a polymer including a repeating unit represented by Formula (3),

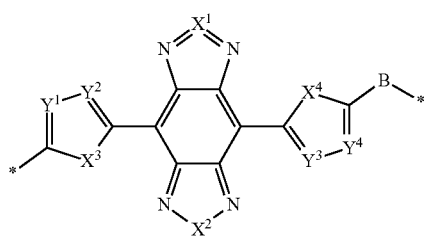
(3)

in Formula (3), $X^1$ represents a sulfur atom or selenium atom,
$X^2$ to $X^4$ each independently represent a sulfur atom, an oxygen atom, or a selenium atom,
$Y^1$ to $Y^4$ each independently represent a group represented by —$CR^1$═ or a nitrogen atom, where at least one of $Y^1$ to $Y^4$ represents a nitrogen atom,
$R^1$ represents a hydrogen atom or a substituent, and
B represents a divalent linking group represented by Formula (LE),

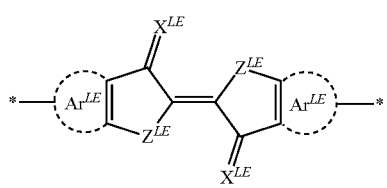
(LE)

in Formula (LE), $X^{LE}$'s each independently represent an oxygen atom or a sulfur atom,
$Z^{LE}$'s each independently represent a sulfur atom, an oxygen atom, —$NR^{LE}$—, or a selenium atom,
$R^{LE}$ represents a hydrogen atom or a substituent,
$Ar^{LE}$'s each independently represent an aromatic ring which may be fused, and
* represents a bonding position.

6. The organic thin film transistor according to claim 1, wherein at least one of $Y^1$ or $Y^2$ represents a nitrogen atom and at least one of $Y^3$ or $Y^4$ represents a nitrogen atom.
7. The organic thin film transistor according to claim 1, wherein $Y^1$ and $Y^4$ represent a nitrogen atom and $Y^2$ and $Y^3$ represent —CH═.
8. The organic thin film transistor according to claim 1, wherein $Y^1$ and $Y^4$ represent —CH═ and $Y^2$ and $Y^3$ represent a nitrogen atom.
9. The organic thin film transistor according to claim 1, wherein $X^3$ and $X^4$ represent a sulfur atom.
10. The organic thin film transistor according to claim 1, wherein $X^1$ to $X^4$ represent a sulfur atom.
11. A polymer having a partial structure represented by Formula (1),

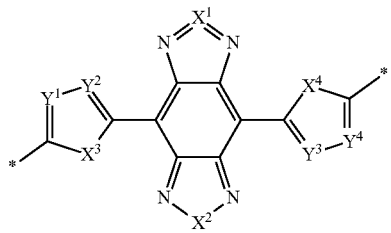
(1)

in Formula (1), $X^1$ represents a sulfur atom or a selenium atom,
$X^2$ to $X^4$ each independently represent a sulfur atom, an oxygen atom, or a selenium atom,
$Y^1$ to $Y^4$ each independently represent a group represented by —$CR^1$═ or a nitrogen atom, where at least one of $Y^1$ to $Y^4$ represents a nitrogen atom,
$R^1$ represents a hydrogen atom or a substituent, and
* represents a bonding position,

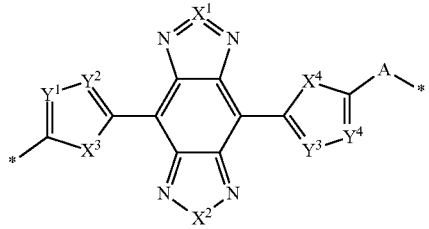
(2)

in Formula (2), $X^1$ to $X^4$ and $Y^1$ to $Y^4$ are synonymous with $X^1$ to $X^4$ and $Y^1$ to $Y^4$ in Formula (1), respectively,
A represents a divalent conjugated linking group selected from the group consisting of group represented by any of Formulae (A) to (L), and
* represents a bonding position,

*-Lc-*     (A)

*—$(Ar)_m$-Lc-$(Ar)_m$—*     (B)

*—$(Ar)_m$—*     (C)

*—Z-Lc-Z—*     (D)

*—Z—$(Ar)_m$—Z—*     (E)

*—Z—$(Ar)_m$-Lc-$(Ar)_m$—Z—*     (F)

*—$(Ar)_m$—Z—$(Ar)_m$—*     (G)

*—(A)$_m$-Z—* (H)

*-Ld-* (I)

*—(Ar)$_m$-Ld-(Ar)$_m$—* (J)

*—Z-Ld-Z—* (K)

*—Z—(Ar)$_m$-Ld-(Ar)$_m$—Z—* (L)

in Formulae (A), (B), (D), and (F), Lc represents a conjugated fused ring group including two or more rings, which may have a substituent, in Formulae (B), (C), (E), (F), (G), (H), (J), and (L), Ar represents a monocyclic aromatic ring group which may have a substituent, and m represents an integer of 1 to 4, in Formulae (I), (J), (K), and (L), Ld represents Formulae (L1) to (L3),

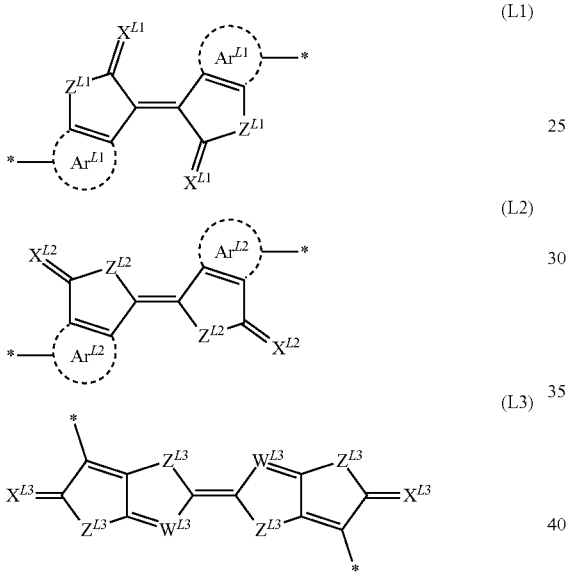

(L1)

(L2)

(L3)

in Formula (L1), $X^{L1}$'s each independently represent an oxygen atom or a sulfur atom, $Z^{L1}$'s each independently represent a sulfur atom, an oxygen atom, —$NR^{L1}$—, or a selenium atom, $R^{L1}$ represents a hydrogen atom or a substituent, $Ar^{L1}$'s each independently represent an aromatic ring which may be fused, and

* represents a bonding position, in Formula (L2), $X^{L2}$'s each independently represent an oxygen atom or a sulfur atom, $Z^{L2}$'s each independently represent a sulfur atom, an oxygen atom, —$NR^{L2}$—, or a selenium atom, $R^{L2}$ represents a hydrogen atom or a substituent, $Ar^{L2}$'s each independently represent an aromatic ring which may be fused, and

* represents a bonding position, in Formula (L3), $X^{L2}$'s each independently represent an oxygen atom or a sulfur atom, $Z^{L3}$'s each independently represent a sulfur atom, an oxygen atom, —$NR^{L2}$—, or a selenium atom, $W^{L3}$'s each independently represent —$CR^{L32}$= or a nitrogen atom, $R^{L31}$ and $R^{L32}$ each independently represent a hydrogen atom or a substituent, and

* represents a bonding position, in Formulae (D) to (H), (K), and (L), Z represents a conjugated fused ring group including two or more rings, which may have a substituent, a monocyclic aromatic ring group which may have a substituent, and a divalent conjugated linking group other than Formulae (L1) to (L3), in Formulae (B), (F), (G), (J), and (L), a plurality of Ar's and a plurality of m's may be the same or different from each other, respectively, in Formulae (C), (E), and (H), in a case where m is an integer of 2 or more, a plurality of Ar's may be the same or different from each other, and in Formulae (D), (E), (F), (K), and (L), a plurality of Z's may be the same or different from each other.

12. The polymer according to claim 11, wherein, in Formulae (A), (B), (D), and (F), Lc is a divalent conjugated linking group represented b Formula (A1),

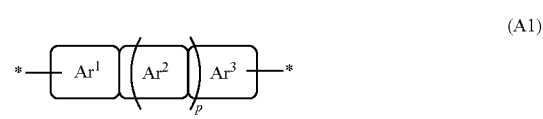

(A1)

in Formula (A1), $Ar^1$, $Ar^2$, and $Ar^3$ each independently represent a conjugated ring, p represents an integer of 0 to 8, and

* represents a bonding site.

13. The polymer according to claim 11, wherein the conjugated fused ring group represented by Lc in Formulae (A) and (D) includes at least one of >C=$W^1$, —N=, or —$CR^{Lc}$=, the conjugated fused ring group represented by Lc and the monocyclic aromatic ring group represented by Ar in Formulae (B) and (F) satisfy any of the following requirements 1 to 3, the monocyclic aromatic ring group represented by Ar in Formulae (C), (E), (G), and (H) satisfies the following requirement 2, and $W^1$ represents an oxygen atom or a sulfur atom and $R^{Lc}$ represents an electron withdrawing group, requirement 1: the conjugated fused ring group represented by Lc includes at least one of >C=$W^1$, —N=, or —$CR^{Lc}$=, requirement 2: the monocyclic aromatic ring group represented by Ar includes at least one of —N= or —$CR^{Lc}$=, requirement 3: one or more selected from the group consisting of the conjugated fused ring groups represented by Lc includes at least one of >C=$W^1$, —N=, or —$CR^{Lc}$=, and one or more selected from the group consisting of the monocyclic aromatic ring groups represented by Ar includes at least one of —N= or —$CR^{Lc}$=, where, in the requirements 1 to 3, $W^1$ represents an oxygen atom or a sulfur atom and $R^{Lc}$ represents an electron withdrawing group.

14. The polymer according to claim 11, wherein, in Formula (2), A represents any of divalent conjugated linking groups selected from the group consisting of Formulae (A), (B), (C), (I), and (J).

15. A polymer having a partial structure represented by Formula (1),

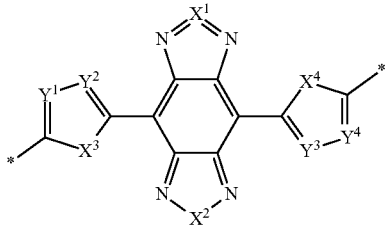

(1)

in Formula (1), $X^1$ represents a sulfur atom or a selenium atom,
$X^2$ to $X^4$ each independently represent a sulfur atom, an oxygen atom, or a selenium atom,
$Y^1$ to $Y^4$ each independently represent a group represented by $-CR^1=$ or a nitrogen atom, where at least one of $Y^1$ to $Y^4$ represents a nitrogen atom,
$R^1$ represents a hydrogen atom or a substituent, and
* represents a bonding position,
wherein the ploymer having a partial structure represented by Formula (1) is a polymer including a repeating unit represented by Formula (3),

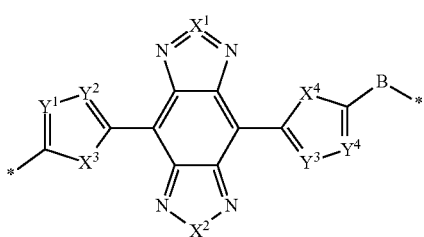

(3)

in Formula (3), $X^1$ represents a sulfur atom or a selenium atom,
$X^2$ to $X^4$ each independently represent a sulfur atom, an oxygen atom, or a selenium atom,
$Y^1$ to $Y^4$ each independently represent a group represented by $-CR^1=$ or a nitrogen atom, where at least one of $Y^1$ to $Y^4$ represents a nitrogen atom,
$R^1$ represents a hydrogen atom or a substituent, and
B represents a divalent linking group represented by Formula (LE),

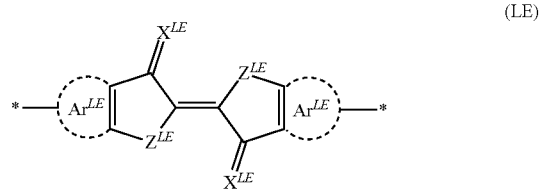

(LE)

in Formula (LE), $X^{LE}$'s each independently represent an oxygen atom or a sulfur atom,
$Z^{LE}$'s each independently represent a sulfur atom, an oxygen atom, $-NR^{LE}-$, or a selenium atom,
$R^{LE}$ represents a hydrogen atom or a substituent,
$Ar^{LE}$'s each independently represent an aromatic ring which may be fused, and
* represents a bonding position.

16. The polymer according to claim 11, wherein at least one of $Y^1$ or $Y^2$ represents a nitrogen atom and at least one of $Y^3$ or $Y^4$ represents a nitrogen atom.

17. The polymer according to claim 11, wherein $Y^1$ and $Y^4$ represent a nitrogen atom and $Y^2$ and $Y^3$ represent $-CH=$.

18. The polymer according to claim 11, wherein $Y^1$ and $Y^4$ represent $-CH=$ and $Y^2$ and $Y^3$ represent a nitrogen atom.

19. The polymer according to claim 11, wherein $X^3$ and $X^4$ represent a sulfur atom.

20. The polymer according to claim 11, wherein $X^1$ to $X^4$ represent a sulfur atom.

21. A composition comprising:
the polymer according to claim 11; and
a solvent.

22. An organic semiconductor film comprising:
the polymer according to claim 11.

* * * * *